(12) United States Patent
Yoshioka

(10) Patent No.: US 10,411,095 B2
(45) Date of Patent: Sep. 10, 2019

(54) SEMICONDUCTOR INTEGRATED CIRCUIT WITH GUARD RING

(71) Applicant: Renesas Electronics Corporation, Koutou-ku, Tokyo (JP)

(72) Inventor: Akihiko Yoshioka, Itami (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/921,643

(22) Filed: Mar. 14, 2018

(65) Prior Publication Data

US 2018/0277633 A1    Sep. 27, 2018

Related U.S. Application Data

(63) Continuation of application No. 13/557,923, filed on Jul. 25, 2012, now Pat. No. 9,941,358.

(30) Foreign Application Priority Data

Jul. 25, 2011    (JP) .................................. 2011-161732
Apr. 20, 2012    (JP) .................................. 2012-096465

(51) Int. Cl.
*H01L 29/10*    (2006.01)
*H01L 29/06*    (2006.01)
(Continued)

(52) U.S. Cl.
CPC ...... *H01L 29/1087* (2013.01); *H01L 27/0251* (2013.01); *H01L 29/0615* (2013.01);
(Continued)

(58) Field of Classification Search
CPC ............. H01L 29/1087; H01L 29/0619; H01L 29/0615
(Continued)

(56) References Cited

U.S. PATENT DOCUMENTS 6,566,715 B1    5/2003    Ker et al.
6,815,775 B2    11/2004    Ker et al.
(Continued)

FOREIGN PATENT DOCUMENTS

CN    101159262 A    4/2008
JP    2007-220831 A    8/2007
(Continued)

OTHER PUBLICATIONS

Office Action dated Mar. 24, 2016, in Japanese Patent Application No. 2012-096465.
(Continued)

*Primary Examiner* — Robert T Huber
(74) *Attorney, Agent, or Firm* — Shapiro, Gabor and Rosenberger, PLLC

(57) ABSTRACT

A semiconductor integrated circuit includes a first conduction-type semiconductor region, a second conduction-type first impurity region, and a guard ring formed using a first conduction-type second impurity region so as to form a protection device of an electrostatic protection circuit. The first impurity region is formed inside the semiconductor region to have a rectangular planar structure with long and short sides. The guard ring is formed inside the semiconductor region to surround the periphery of the first impurity region. A weak spot is formed on the short side of the rectangular planar structure of the first impurity region. A plurality of electrical contacts are formed in a first portion of the guard ring which faces the long side of the rectangle. A plurality of electrical contracts are not formed in a second portion of the guard ring which faces the weak spot formed on the short side of the rectangle.

26 Claims, 37 Drawing Sheets

(51) Int. Cl.
*H01L 27/02* (2006.01)
*H01L 29/861* (2006.01)

(52) U.S. Cl.
CPC ........ *H01L 29/0619* (2013.01); *H01L 29/861* (2013.01); *H01L 29/0692* (2013.01)

(58) Field of Classification Search
USPC .......................................... 257/409, E29.012
See application file for complete search history.

(56) References Cited

U.S. PATENT DOCUMENTS

| | | |
|---|---|---|
| 2002/0149059 A1 | 10/2002 | Ker et al. |
| 2005/0045952 A1 | 3/2005 | Chatty et al. |
| 2007/0018250 A1 | 1/2007 | Cai et al. |
| 2007/0187782 A1 | 8/2007 | Kato et al. |
| 2008/0080110 A1 | 4/2008 | Arai et al. |
| 2008/0169509 A1 | 7/2008 | Tanaka |
| 2010/0246079 A1 | 9/2010 | Suzuki |

FOREIGN PATENT DOCUMENTS

| | | |
|---|---|---|
| JP | 2008-177246 A | 7/2008 |
| JP | 2008-193019 A | 8/2008 |

OTHER PUBLICATIONS

Office Action dated May 5, 2016, in Chinese Patent Application No. 201210258980.6.
Office Action dated May 2, 2018, in Korean Patent Application No. 10-2012-0080824.
Office Action dated Nov. 7, 2018, in Korean Patent Application No. 10-2012-0080824.

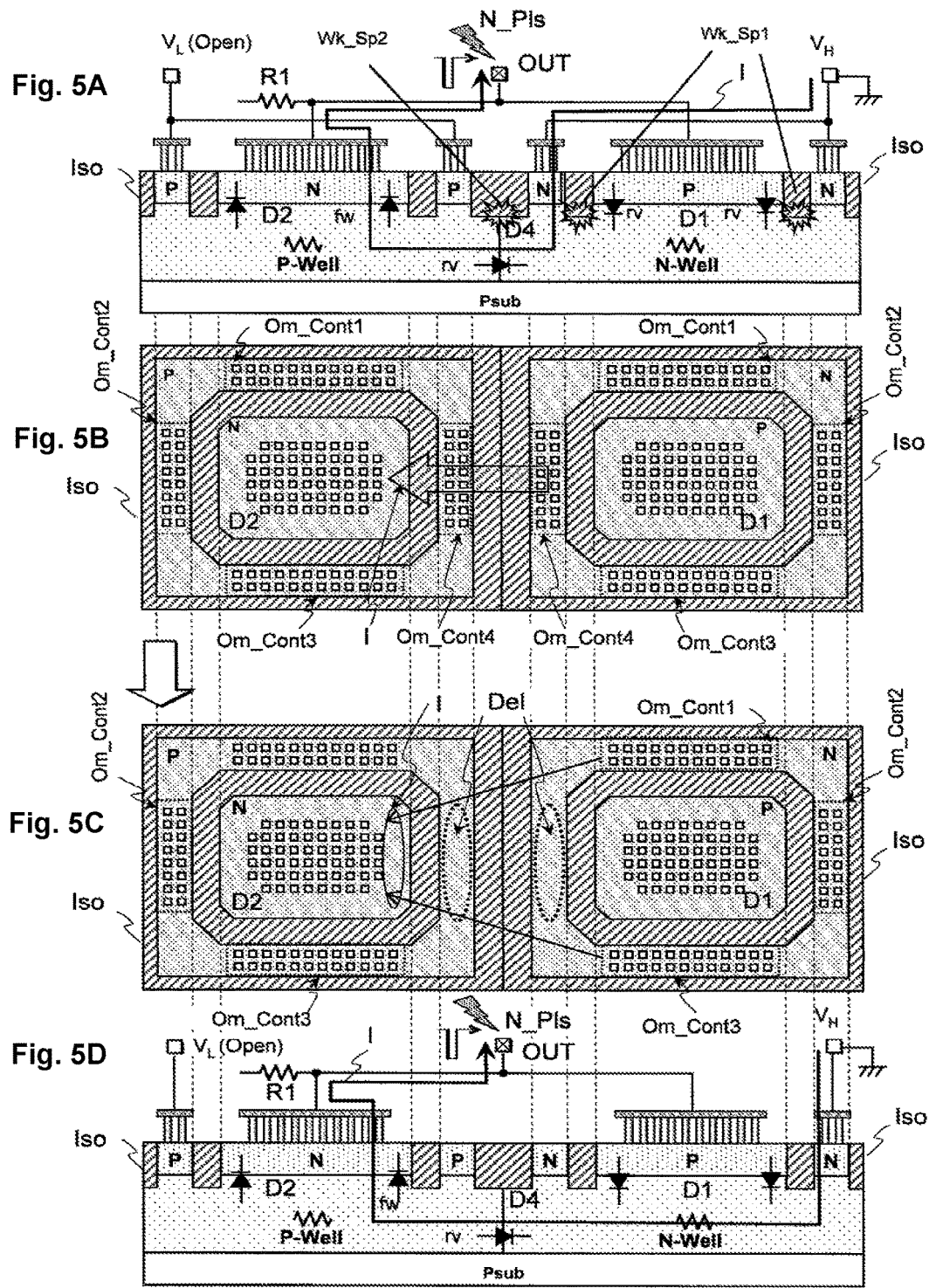

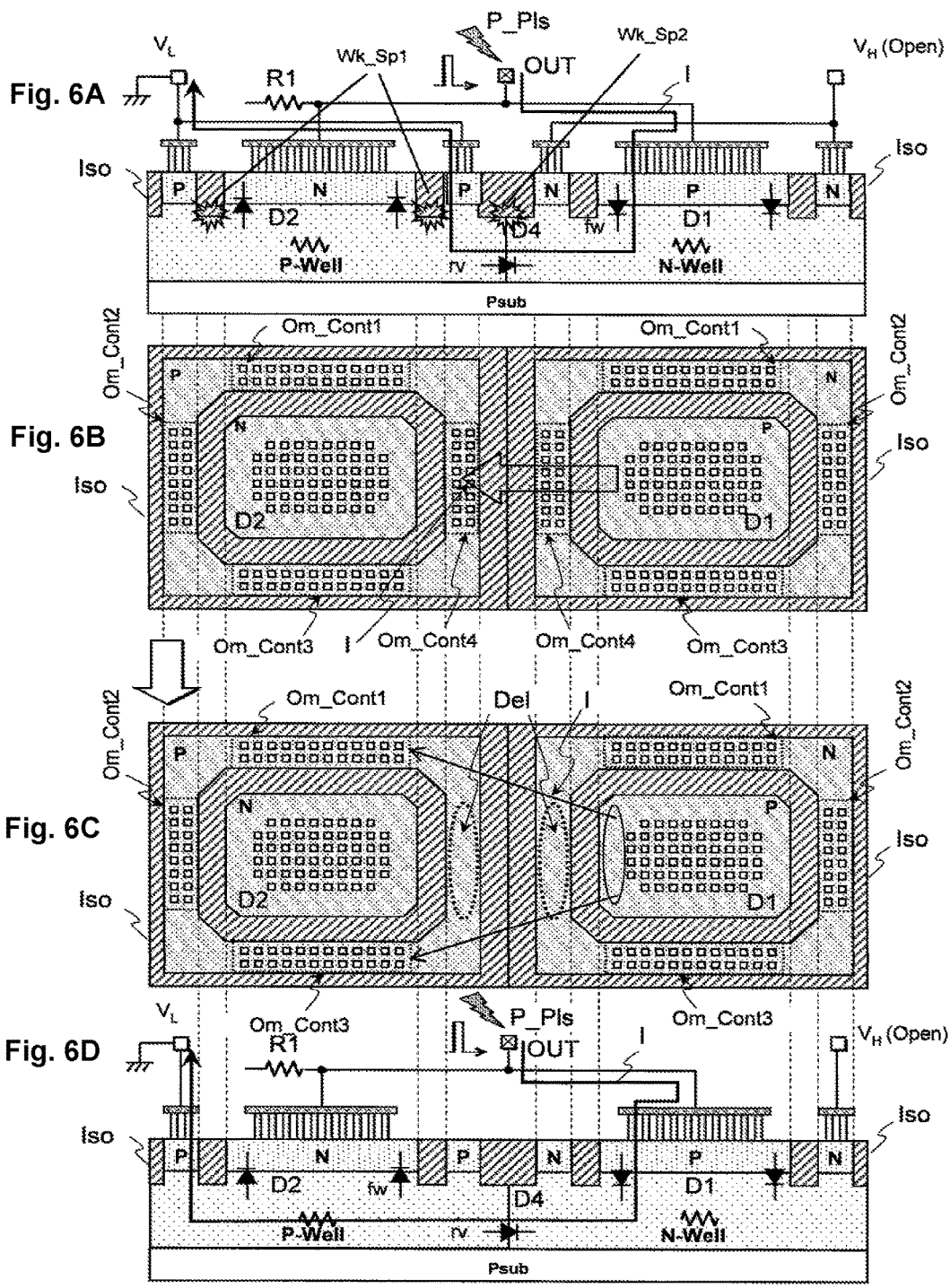

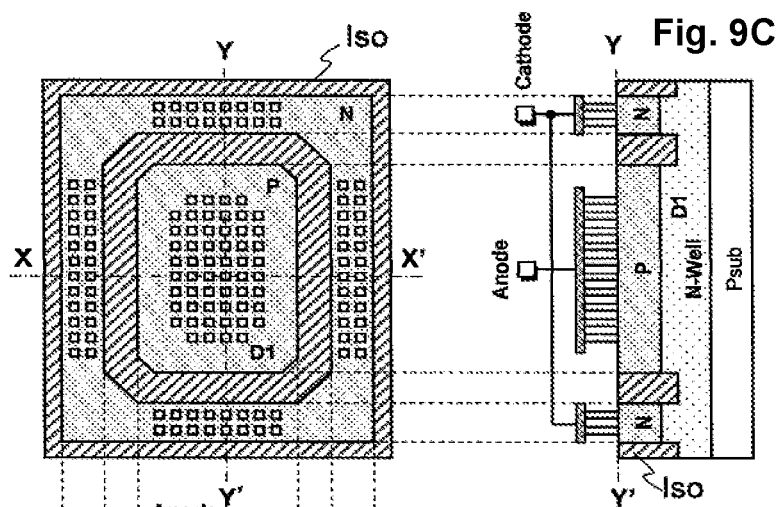
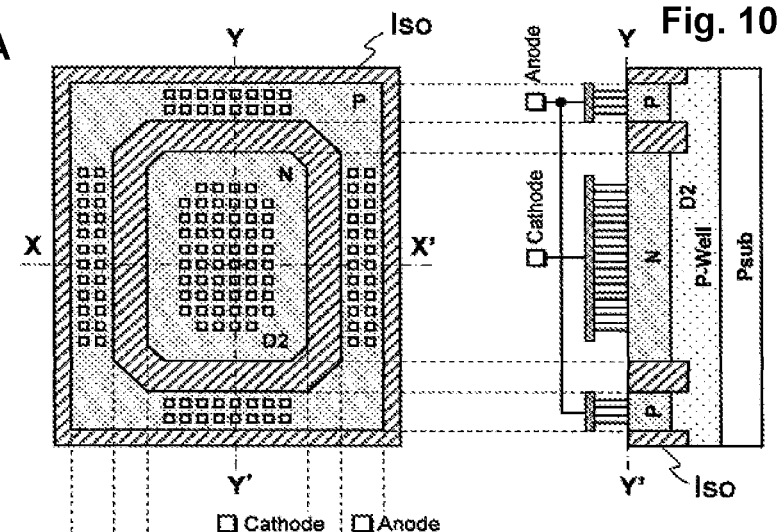

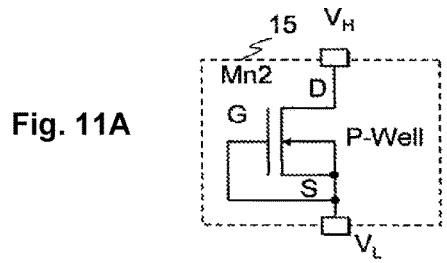
Fig. 11A
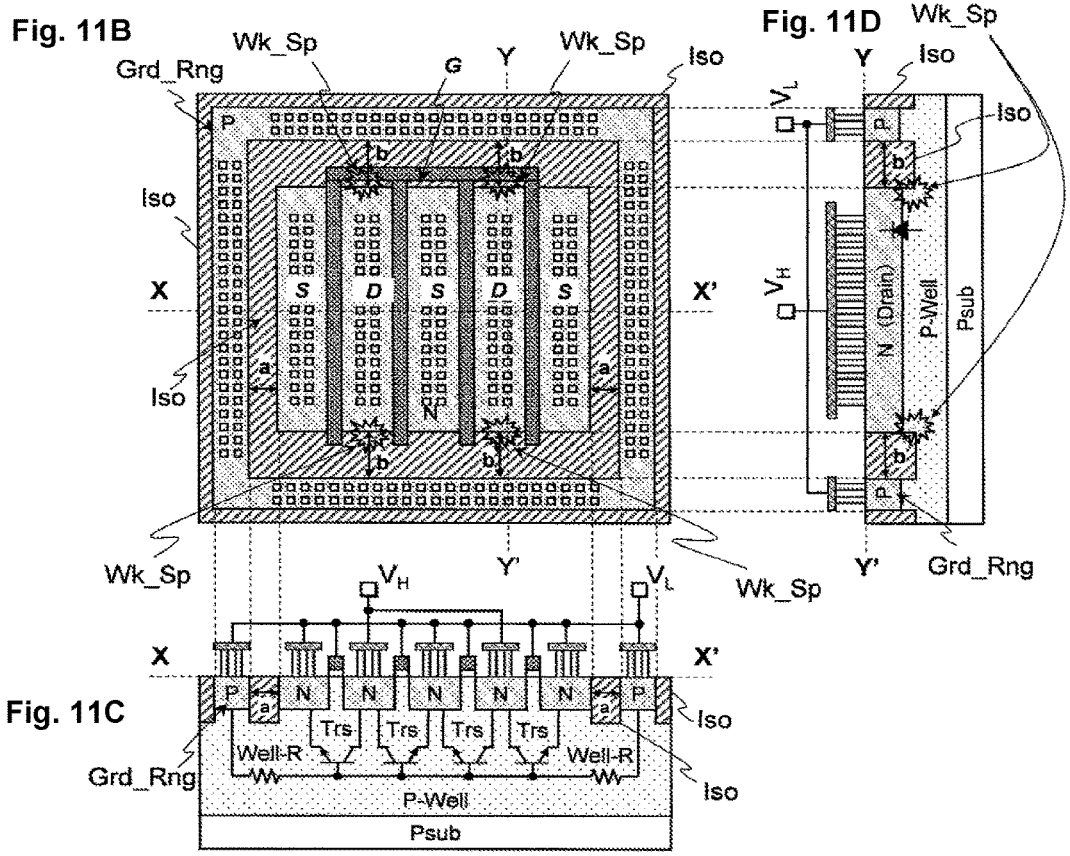
Fig. 11B
Fig. 11D
Fig. 11C

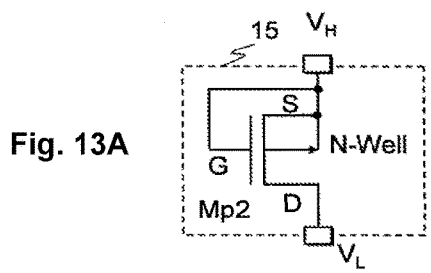
Fig. 13A
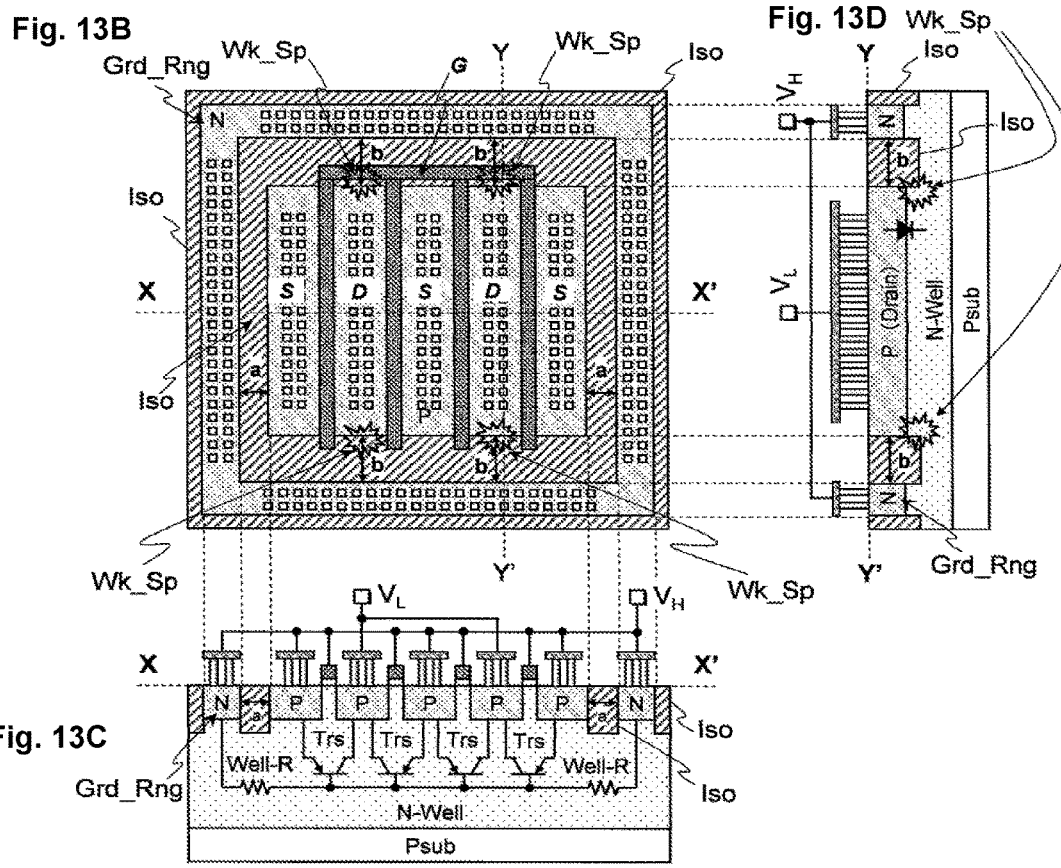
Fig. 13B
Fig. 13C
Fig. 13D

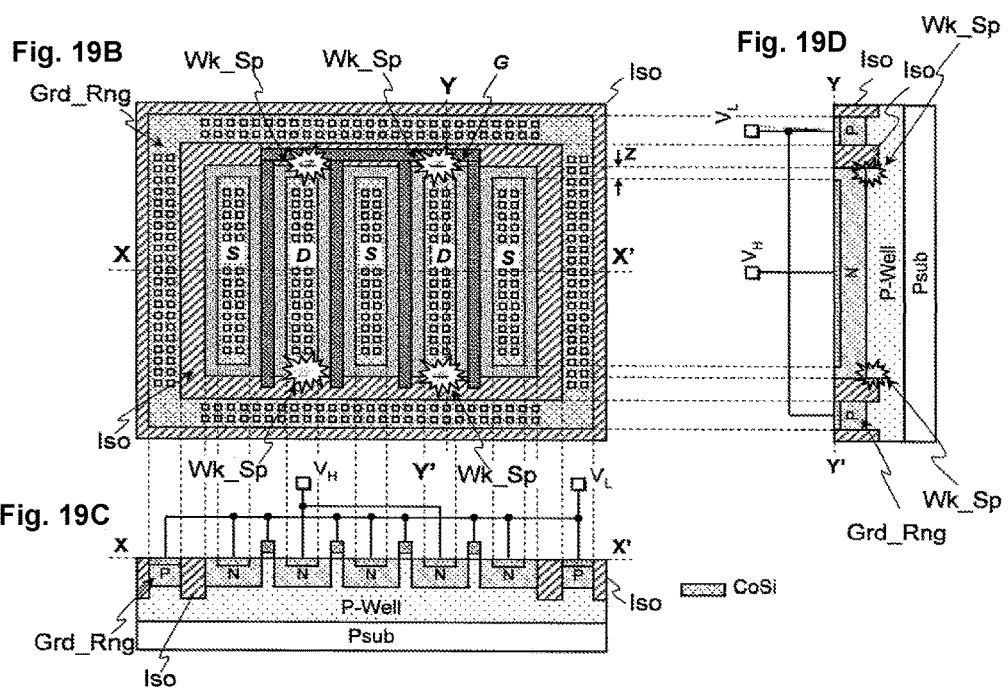

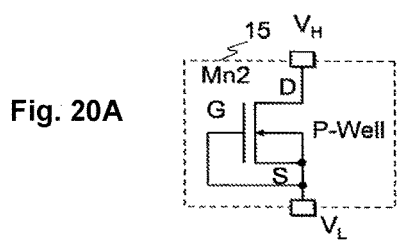
Fig. 20A
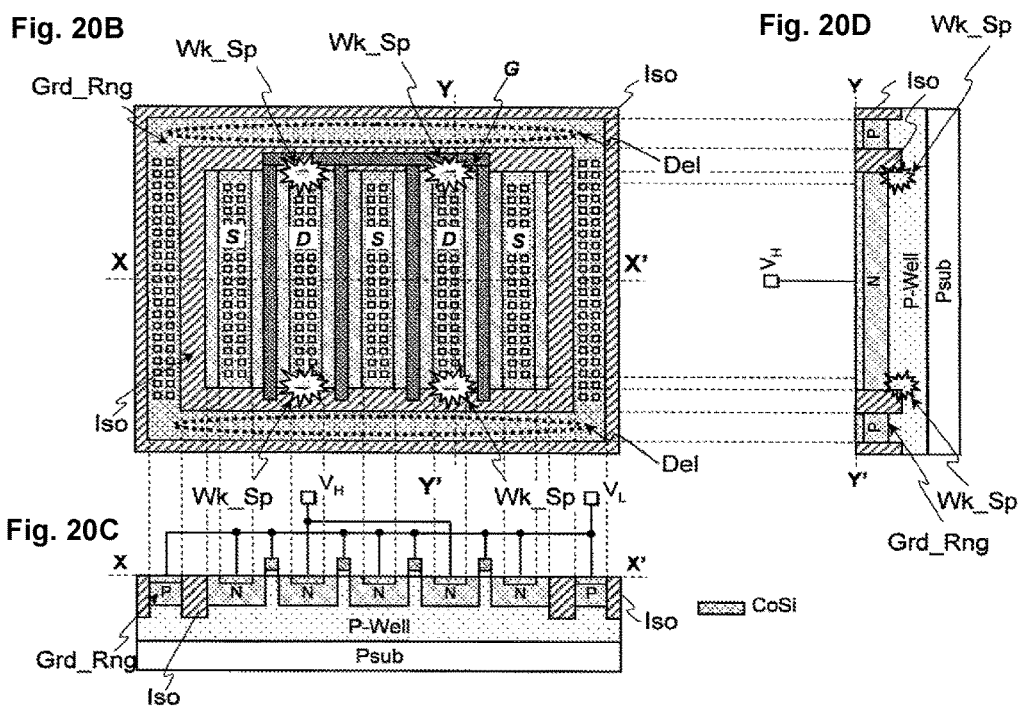
Fig. 20B
Fig. 20C
Fig. 20D

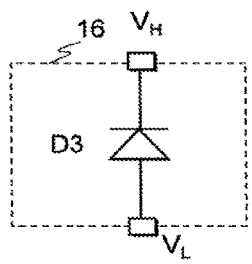
Fig. 21A
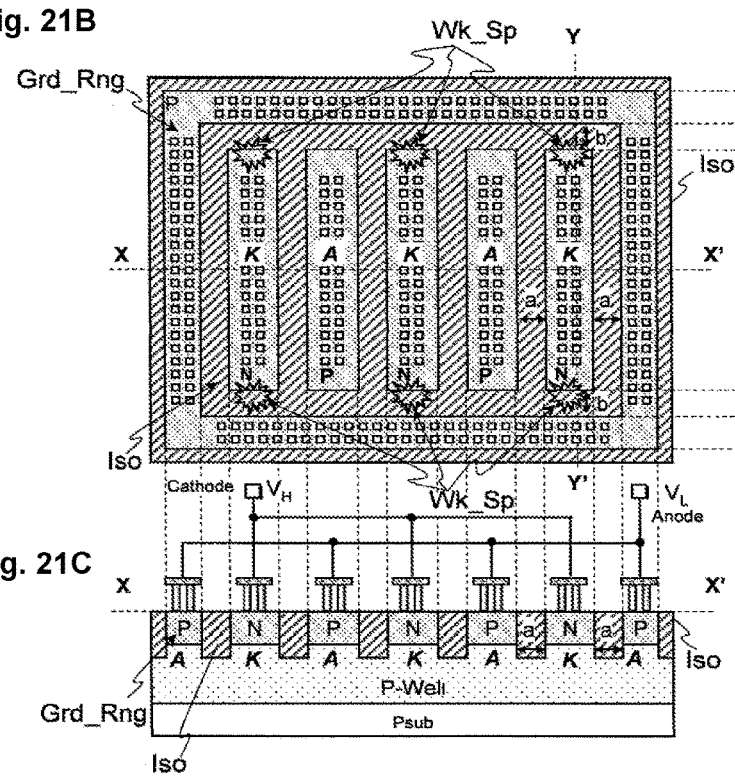
Fig. 21B
Fig. 21C
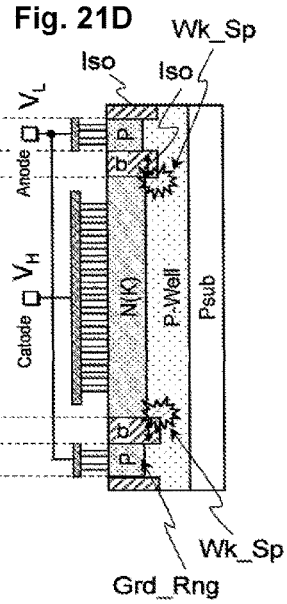
Fig. 21D

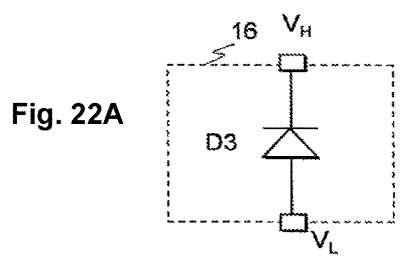
Fig. 22A
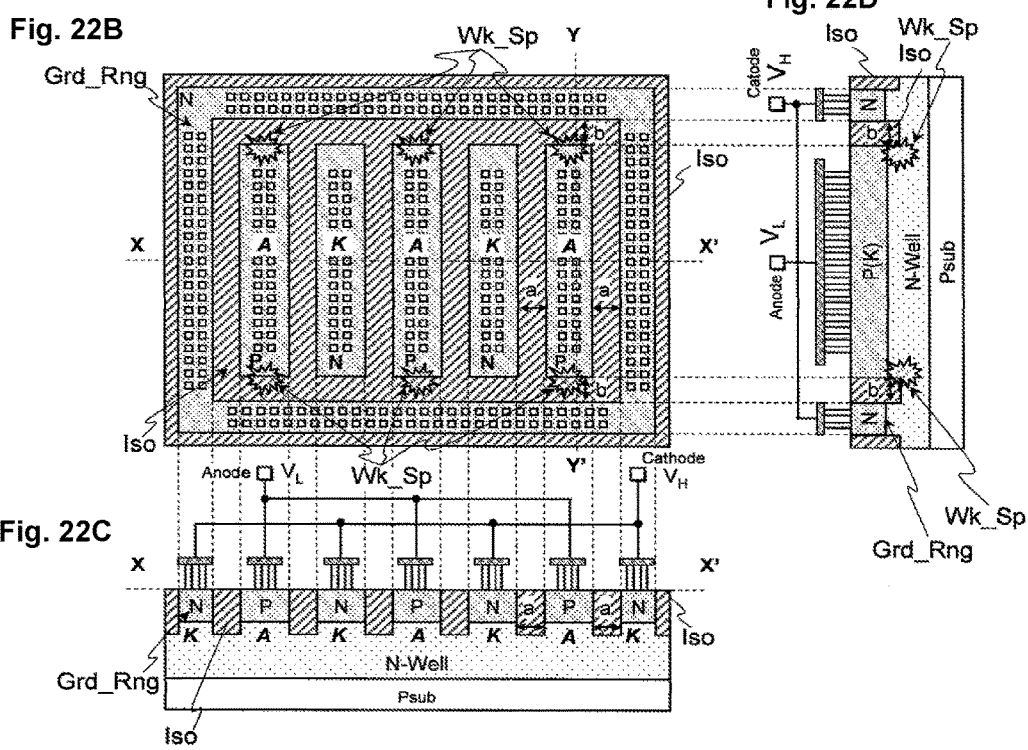
Fig. 22B
Fig. 22D
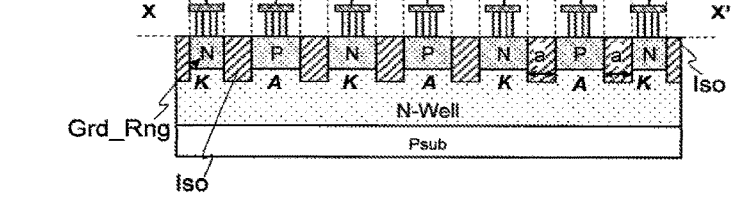
Fig. 22C

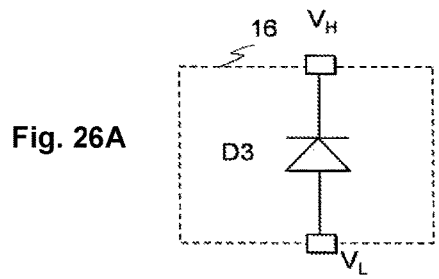
Fig. 26A
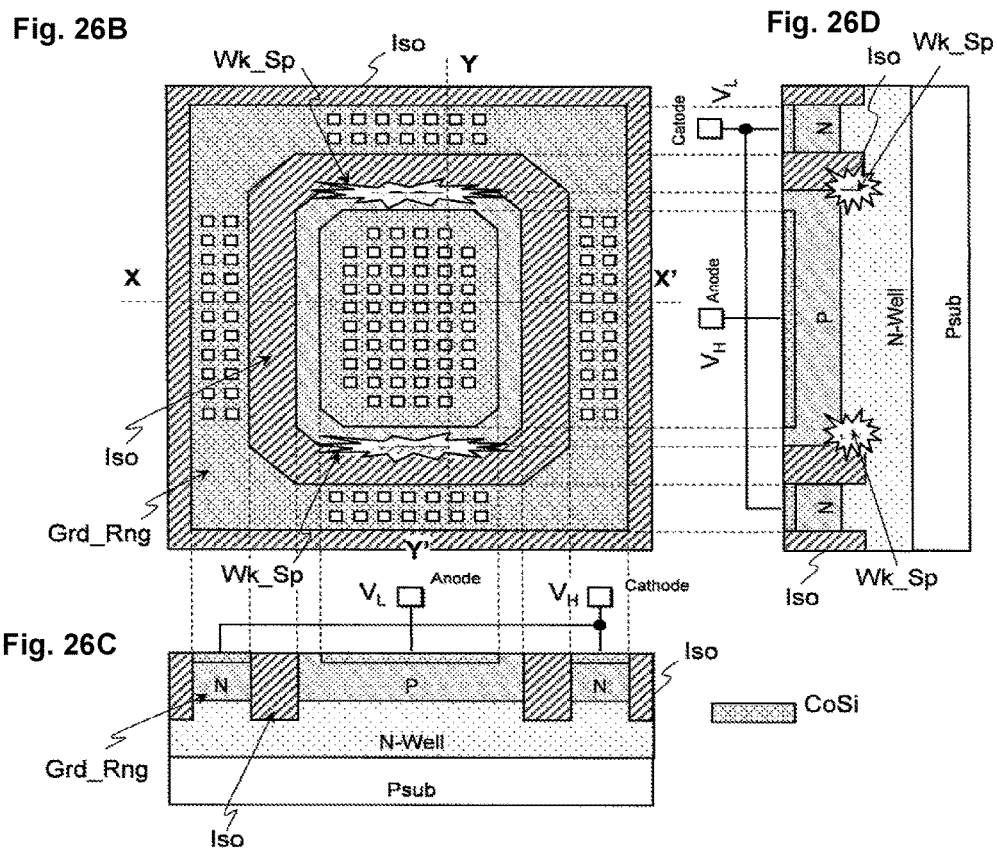
Fig. 26B
Fig. 26C
Fig. 26D

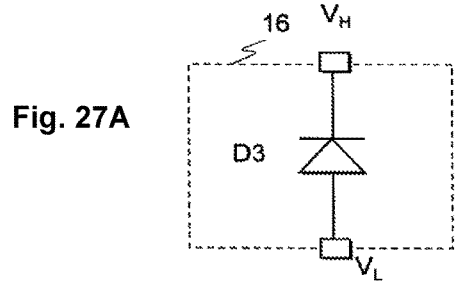
Fig. 27A
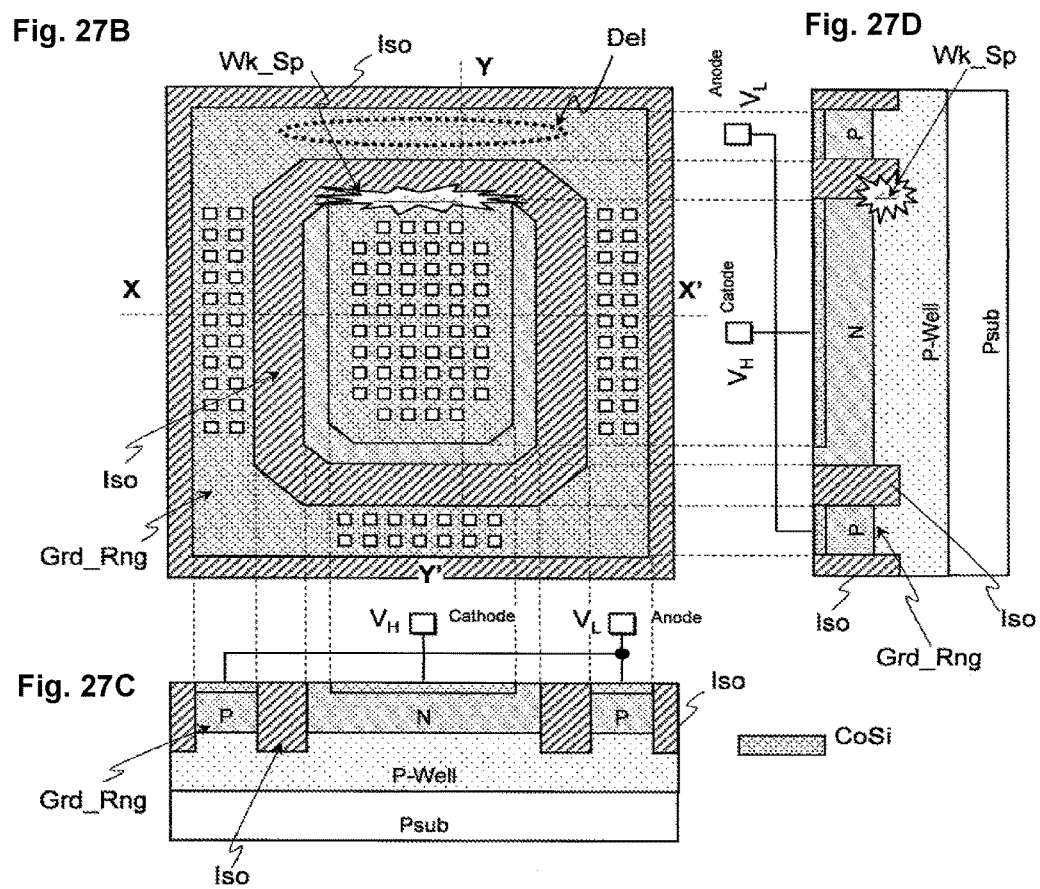
Fig. 27B
Fig. 27D
Fig. 27C

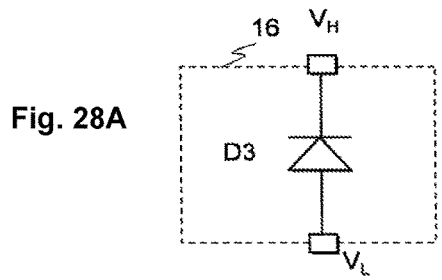
Fig. 28A
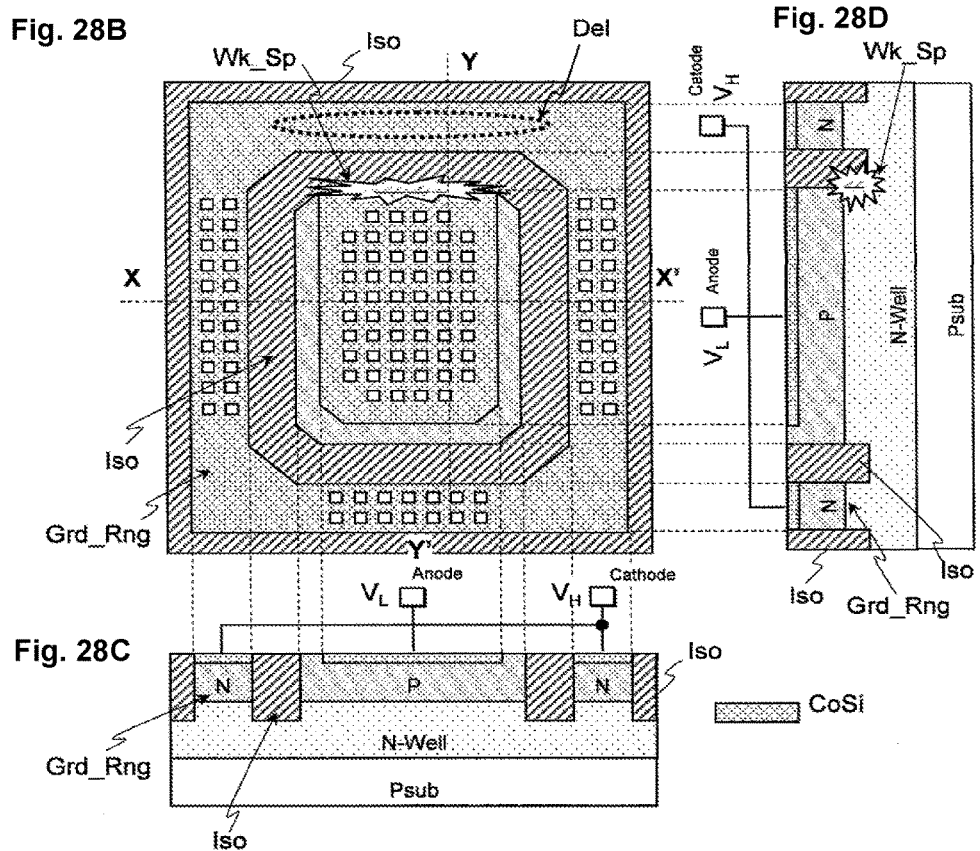
Fig. 28B
Fig. 28D
Fig. 28C

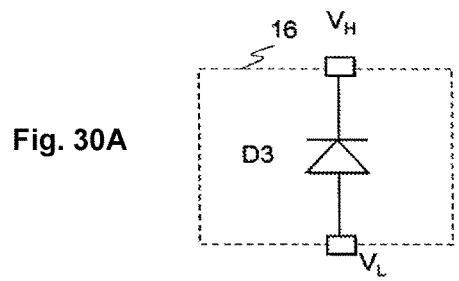
Fig. 30A
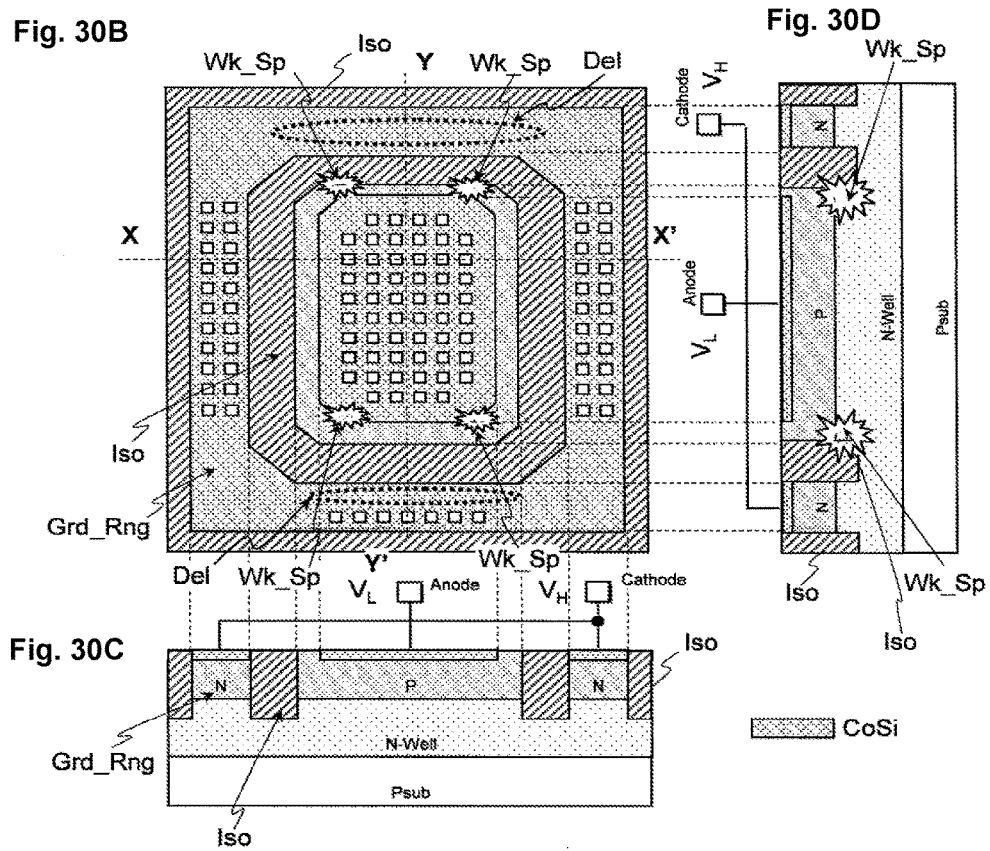
Fig. 30B
Fig. 30C
Fig. 30D

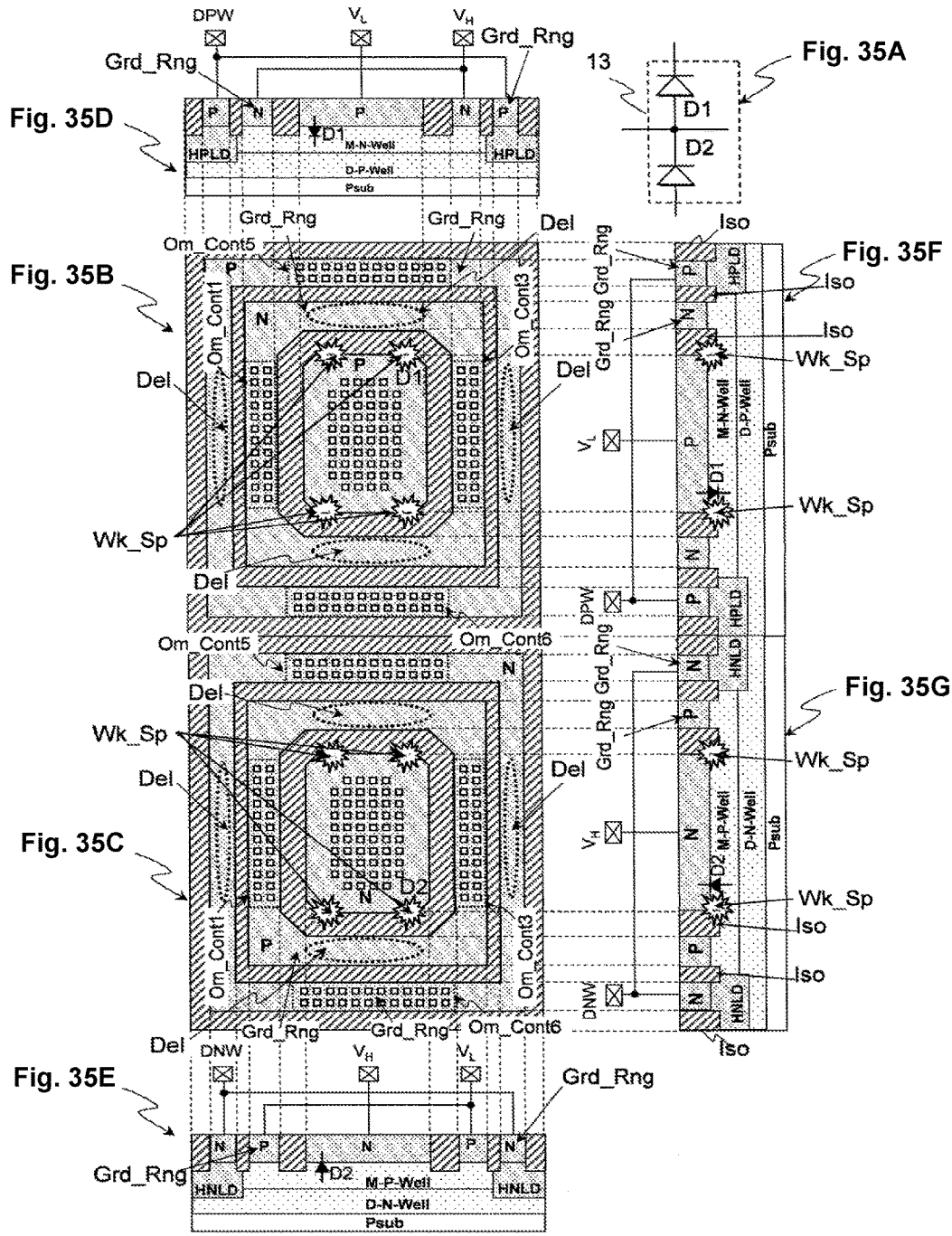

SEMICONDUCTOR INTEGRATED CIRCUIT WITH GUARD RING

CLAIM OF PRIORITY

The Present application claims priority from Japanese application JP 2011-161732 filed on Jul. 25, 2011, and JP 2012-096465 filed on Apr. 20, 2012, the content of which is hereby incorporated by reference into this application.

BACKGROUND

The present invention relates to a semiconductor integrated circuit equipped with an electrostatic protection circuit, and in particular, to a technique which is effective for reducing the risk of destruction of a weak spot in a PN junction between a protection device in the electrostatic protection circuit and a guard ring region formed in the periphery of the protection device.

Background Art

Heretofore, a semiconductor integrated circuit includes an electrostatic protection circuit (ESD protection circuit) so as to protect the semiconductor integrated circuit from destruction due to electrostatic discharge (ESD).

In a semiconductor integrated circuit, while a lower power supply voltage of an internal circuit is achieved with the miniaturization of transistors for higher speed, a comparatively high power supply voltage is supplied to the outside of the semiconductor integrated circuit and an input/output circuit (I/O circuit) which is provided to input and output an input/output signal at a comparatively high voltage level. While a comparatively low power supply voltage is supplied to an internal circuit of a digital logic circuit having miniaturized transistors, a comparatively high power supply voltage is supplied to an analog circuit, such as an analog/digital converter or a digital/analog converter.

U.S. Publication No. 2005/0045952A1 describes a technique in which a diode-based protection circuit and a MOS-based protection circuit are used as an ESD protection circuit.

The diode-based protection circuit includes a resistor, a first diode, and a second diode. The resistor is connected between an input pad and an input terminal of a CMOS input stage. The anode and cathode of the first diode are respectively connected to a ground potential Vss and the input terminal of the CMOS input stage. The anode and cathode of the second diode are respectively connected to the input terminal of the CMOS input stage and a power supply voltage Vdd. The gate of a P-channel MOS transistor and the gate of an N-channel MOS transistor of the CMOS input stage are connected commonly to the input terminal of the CMOS input stage.

The MOS-based protection circuit includes an N-channel MOS transistor, a P-channel MOS transistor, and a resistor. The source and gate of the N-channel MOS transistor are connected to the ground potential Vss. The drain of the N-channel MOS transistor and the drain of the P-channel MOS transistor are connected to the input pad. The source and gate of the P-channel MOS transistor are connected to the power supply voltage Vdd. The gate of the P-channel MOS transistor and the gate of the N-channel MOS transistor of the CMOS input stage are connected commonly to the input terminal of the CMOS input stage through the resistor.

U.S. Publication No. 2005/0045952A1 describes a technique in which a silicide block is used to increase parasitic resistance, thereby improving current spread over the width of the device. U.S. Publication No. 2005/0045952A1 describes that, as a model for simulating an ESD phenomenon to test the validity of the ESD protection circuit, there are three kinds of models of a human body model (HBM), a machine model (MM), and a charged device model (CDM).

Japanese Unexamined Patent Publication No. 2008-177246 describes a technique in which a plurality of contacts as a collector contact are formed in a region above an N-type guard ring out of a region facing a plurality of contacts as an emitter contact with a P-type guard ring interposed therebetween, thereby suppressing the operation of a parasitic bipolar device formed using the guard ring. As a result, the base region of the parasitic bipolar device is widened and the gain of the parasitic bipolar device decreases, such that the parasitic bipolar device is hard to be operated.

SUMMARY

The inventors have been engaged in improvement in ESD endurance of an ESD protection circuit in a semiconductor integrated circuit manufactured by a miniaturization semiconductor process prior to the invention.

FIG. 1 is a diagram showing the configuration of a semiconductor integrated circuit equipped with an electrostatic protection circuit (ESD protection circuit) which has been studied by the inventors prior to the invention.

<<Configuration of Semiconductor Integrated Circuit>>

A semiconductor integrated circuit 1 shown in FIG. 1 includes an output terminal 10, an electrostatic protection circuit 13, an output buffer 14, an inter-power source clamp circuit 15, a power protection circuit 16, a power supply terminal 11, and a ground terminal 12. Resistors r1, r2, r3, and r4 are interconnect resistance.

<<Output Buffer>>

The output buffer 14 includes a P-channel MOS transistor Mp1 and an N-channel MOS transistor Mn1 which are connected in series between the power supply terminal 11 and the ground terminal 12. The driving output signals of the drain of the P-channel MOS transistor Mp1 and the drain of the N-channel MOS transistor Mn1 are supplied to the output terminal 10 through the electrostatic protection circuit 13.

<<Electrostatic Protection Circuit>>

The electrostatic protection circuit 13 prevents the P-channel MOS transistor Mp1 and the N-channel MOS transistor Mn1 of the output buffer 14 from being destroyed in case that a surge voltage responsible for electrostatic destruction is applied to the output terminal 10. The electrostatic protection circuit 13 includes a first diode D1, a second diode D2, and a resistor R1. The anode of the first diode D1 and the cathode of the second diode D2 are connected to the output terminal 10, the cathode of the first diode D1 is connected to the power supply terminal 11, and the anode of the second diode D2 is connected to the ground terminal 12. The anode of the first diode D1 and the cathode of the second diode D2 are connected to the drain of the P-channel MOS transistor Mp1 and the drain of the N-channel MOS transistor Mn1 of the output buffer 14 through the resistor R1.

<<Inter-Power Source Clamp Circuit>>

The inter-power source clamp circuit 15 includes an N-channel MOS transistor Mn2, a resistor R2, and a diode D4. The drain and source of the N-channel MOS transistor Mn2 are respectively connected to the power supply terminal 11 and the ground terminal 12. The resistor R2 and the diode D4 are connected in parallel between the gate and source of the N-channel MOS transistor Mn2.

<<Power Protection Circuit>>

The power protection circuit 16 includes a third diode D3. The cathode and anode of the third diode D3 are respectively connected to the power supply terminal 11 and the ground terminal 12. If a negative surge pulse voltage is applied to the power supply terminal 11 in a state where the ground potential Vss is supplied to the ground terminal 12 of the semiconductor integrated circuit 1 shown in FIG. 1, the third diode D3 is in a forward direction and a surge discharge current flows, such that energy of the negative surge pulse voltage is consumed, making it possible to prevent the P-channel MOS transistor Mp1 and the N-channel MOS transistor Mn1 of the output buffer 14 from being destroyed.

<<Negative Surge Voltage>>

As shown in FIG. 1, in an ESD test (the power supply terminal 11 is in an open state) in which a negative surge pulse voltage N_Pls is applied to the output terminal 10 with the ground terminal 12 as a reference terminal (a state where a ground voltage GND=0 V is supplied), the surge discharge current flows in a first pass pass1 in which the second diode D2 of the electrostatic protection circuit 13 is in a forward direction. No surge discharge current flows in a second pass pass2 in which the first diode D1 of the electrostatic protection circuit 13 is in a backward direction. The surge discharge current flows in the first pass pass1, such that energy of the negative surge pulse voltage N_Pls is consumed, making it possible to prevent the P-channel MOS transistor Mp1 and the N-channel MOS transistor Mn1 of the output buffer 14 from being destroyed.

<<Positive Surge Voltage>>

FIG. 2 is a diagram illustrating a discharge operation in an ESD test (the power supply terminal 11 is in the open state) in which a positive surge pulse voltage P_Pls is applied to the output terminal 10 with the ground terminal 12 of the semiconductor integrated circuit 1 as a reference terminal (a state where the ground voltage GND=0 V is supplied) as in FIG. 1.

As shown in FIG. 2, if the positive surge pulse voltage P_Pls is applied to the output terminal 10 in a state where the ground potential Vss is supplied to the ground terminal 12, the first diode D1 of the electrostatic protection circuit is in the forward direction. At this time, when the inter-power source clamp circuit 15 is not connected between the power supply terminal 11 and the ground terminal 12, a large current of a parasitic bipolar transistor flows in the P-channel MOS transistor Mp1 and the N-channel MOS transistor Mn1 of the output buffer 14, and there is the risk of destruction of the output buffer 14.

Accordingly, in order to prevent the output buffer 14 from being destroyed, the inter-power source clamp circuit 15 is connected between the power supply terminal 11 and the ground terminal 12. The device size of the N-channel MOS transistor Mn2 of the inter-power source clamp circuit 15 is set to a value significantly greater than the device size of the P-channel MOS transistor Mp1 and the N-channel MOS transistor Mn1 of the output buffer 14. As a result, the N-channel MOS transistor Mn2 of the inter-power source clamp circuit 15 has very low impedance, and the large current of the parasitic bipolar transistor flows, such that a third pass pass3 is formed. As a result, energy of the positive surge pulse voltage P_Pls is consumed, making it possible to prevent the P-channel MOS transistor Mp1 and the N-channel MOS transistor Mn1 of the output buffer 14 from being destroyed.

<<Problem>>

As described above, the inter-power source clamp circuit 15 has an important function as a bypass device between power sources at the time of ESD surge discharge. The inter-power source clamp circuit 15 has a problem in that there is the limiting characteristic of arrangement dependency, and the device size increases. That is, since the ESD surge discharge occurs in a route with low impedance, the inter-power source clamp circuit 15 itself is designed as a low-impedance device. Meanwhile, when the arrangement location of the inter-power source clamp circuit 15 is not appropriate, with the addition of the parasitic factors, such as power interconnect resistance, overall impedance of the inter-power source clamp circuit 15 when viewed from an external terminal may increase, and another device may be unintentionally turned on antecedently and may discharge a surge. In the case of an internal circuit in which the device is miniaturized, device destruction occurs. Accordingly, in order that the inter-power source clamp circuit 15 exhibits a function of a protection clamp device, it is necessary that the circuit 15 is arranged at an appropriate location. In some case, in order to avoid an increase in impedance due to parasitic factors, it is necessary to dispose a plurality of inter-power source clamp circuits 15. As a result, with the arrangement of the inter-power source clamp circuits 15, the influence on a semiconductor chip area is unavoidable.

In this way, while the inter-power source clamp circuit 15 is very effective as an ESD protection circuit, it is necessary to take into consideration the influence on the chip area. With the layout restriction to the arrangement of other circuit blocks or the arrangement of power interconnects, there is a case where it is difficult to arrange the inter-power source clamp circuit 15.

FIG. 3 is a diagram showing a case where the inter-power source clamp circuit 15 is not arranged in the semiconductor integrated circuit 1 shown in FIG. 1.

As shown in FIG. 3, in the ESD test (the ground terminal 12 is in the open state) in which the negative surge pulse voltage N_Pls is applied to the output terminal 10 with the power supply terminal 11 as a reference terminal (a state where the ground voltage GND=0 V is supplied), the output buffer 14 becomes a bypass device between power sources, such that a fourth pass pass4 is formed.

FIG. 4 is a diagram showing a situation (overall impedance of the circuit 15 when viewed from the external terminal is large) in which parasitic interconnect resistance r3 and r4 increase since the arrangement location of the inter-power source clamp circuit 15 is at a long distance from the output terminal 10 in the semiconductor integrated circuit 1 shown in FIG. 2.

As shown in FIG. 4, in the ESD test (the power supply terminal 11 is in the open state) in which the positive surge pulse voltage P_Pls is applied to the output terminal 10 with the ground terminal 12 as a reference terminal (a state where the ground voltage GND=0 V is supplied), the output buffer 14 becomes a bypass between power sources, such that a fifth pass pass5 is formed.

In FIGS. 3 and 4, instead of the inter-power source clamp circuit 15, the output buffer 14 becomes a bypass device, discharge is carried out, and the PNP parasitic bipolar transistor of the P-channel device Mp1 and the NPN parasitic bipolar transistor of the N-channel device Mn1 of the output buffer 14 are turned on in two steps. For this reason, the operation start time until the bypass device between the power sources operates becomes later than the operation start time in the inter-power source clamp circuit 15 (the turn-on time of one stage of the NPN parasitic bipolar transistor of the N-channel device Mn2).

FIGS. 5A to 5D are diagrams showing a sectional structure and a discharge path example of the electrostatic protection circuit 13 in the semiconductor integrated circuit 1 shown in FIG. 3.

As shown in FIGS. 5A to 5D, the first diode D1 and the second diode D2 of the electrostatic protection circuit 13 are arranged to contiguously face each other. As described above, if the operation start time until the bypass device between the power sources through the output buffer 14 operates is delayed, the PN junction between the P-type impurity layer and the N-type well region N-Well of the first diode D1 to which a reverse bias is applied becomes a weak spot (Wk_Sp1), causing an increased risk of junction destruction. Similarly, the PN junction (parasitic diode D4) between the N-type well region N-Well of the first diode D1 and the P-type well region P-Well of the second diode D2 to which a reverse bias is applied becomes a weak spot (Wk_Sp2), causing an increased risk of junction destruction. For example, when the parasitic diode D4 breaks down antecedently, as shown in FIG. 5A, a discharge route in which a surge discharge current I flows between the first diode D1 and the second diode D2 is formed. In this case, the PN junction in the periphery of the parasitic diode D4 causes device destruction. In the PN junction, in order that destruction withstand is not lowered even when a load due to a reverse bias increases, there is a general method in which the width of a hatched insulating isolation layer Iso formed in the PN junction between the P-type well region P-Well and the N-type well region N-Well of the parasitic diode D4 increases. According to this method, however, the device size of the parasitic diode D4 simply increases and inevitably affects the chip area, causing a problem in the reduction in device size.

In regard to the power source clamp circuit 15, as described above, since the arrangement itself of the power source clamp circuit 15 considerably affects the chip size, there is also a problem in the reduction in device size.

<<Study on Reduction in Element Size of Electrostatic Protection Circuit 13>>

FIGS. 9A to 9C are diagrams illustrating the structure of a semiconductor device of the first diode D1 in the electrostatic protection circuit 13 of the semiconductor integrated circuit 1 shown in FIGS. 5A to 5D.

FIG. 9A shows the planar structure of the first diode D1, FIG. 9B shows the sectional structure taken along the line X-X' of the planar structure of FIG. 9A, and FIG. 9C shows the sectional structure taken along the line Y-Y' of the planar structure of FIG. 9A. As shown in the sectional structures of FIGS. 9B and 9C, a P-type impurity region which becomes the anode of the first diode D1 is formed in the N-type well region N-Well formed on a P-type substrate Psub. A hatched insulating isolation layer Iso is formed to have a ring-like planar shape in the periphery of the P-type impurity region which becomes the anode of the first diode D1. An N-type impurity region which becomes the cathode of the first diode D1 is formed to have a ring-like planar shape in the periphery of the ring-like planar shape. A hatched insulating isolation layer Iso is formed to have a ring-like planar shape in the periphery of the ring-like planar N-type impurity region which becomes the cathode of the first diode D1.

As shown in FIGS. 5A and 5B, the central P-type impurity region which becomes the anode of the first diode D1 is connected to an electrode OUT of the output terminal 10 through a plurality of contacts. The ring-like planar N-type impurity region which becomes the cathode of the first diode D1 is connected to a high-voltage terminal V$_H$ of the power supply terminal 11 through an upper first contact Om_Cont1, a right second contact Om_Cont2, a lower third contact Om_Cont1, and a left fourth contact Om_Cont4. Each of the first contact Om_Cont1, the second contact Om_Cont2, the third contact Om_Cont1, and the fourth contact Om_Cont4 has a plurality of contacts.

The central N-type impurity region which becomes the cathode of the second diode D2 is connected to the electrode OUT of the output terminal 10 through a plurality of contacts. The ring-like planar P-type impurity region which becomes the anode of the second diode D2 is connected to a low-voltage terminal V$_L$ of the ground terminal 12 through an upper first contact Om_Cont1, a left second contact Om_Cont2, a lower third contact Om_Cont1, and a right fourth contact Om_Cont4. Each of the first contact Om_Cont1, the second contact Om_Cont2, the third contact Om_Cont3, and the fourth contact Om_Cont4 has a plurality of contacts.

FIGS. 10A to 10C are diagrams illustrating the structure of a semiconductor device of the second diode D2 in the electrostatic protection circuit 13 of the semiconductor integrated circuit 1 shown in FIGS. 5A to 5D.

FIG. 10A shows the planar structure of the second diode D2, FIG. 10B shows the sectional structure taken along the line X-X' of the planar structure of FIG. 10A, and FIG. 10C shows the sectional structure taken along the line Y-Y' of the planar structure of FIG. 10A. As shown in the sectional structures of FIGS. 10B and 10C, an N-type impurity region which becomes the cathode of the second diode D2 is formed in the P-type well region P-Well formed on the P-type substrate Psub. A hatched insulating isolation layer Iso is formed to have a ring-like planar shape in the periphery of the N-type impurity region which becomes the cathode of the second diode D2. A P-type impurity region which becomes the anode of the second diode D2 is formed to have a ring-like planar shape in the periphery of the ring-like planar shape. A hatched insulating isolation layer Iso is formed to have a ring-like planar shape in the periphery of the ring-like planar P-type impurity region which becomes the anode of the second diode D2.

FIG. 5A shows the sectional structure of the vicinity of the first diode D1 and the second diode D2 of the electrostatic protection circuit 13, and FIG. 5B shows the planar structure of the vicinity of the first diode D1 and the second diode D2 of the electrostatic protection circuit 13.

The P-type impurity region which becomes the anode of the first diode D1 and the N-type impurity region which becomes the cathode of the second diode D2 are connected to the electrode OUT of the output terminal 10, the ring-like planar N-type impurity region which becomes the cathode of the first diode D1 is connected to the high-voltage terminal V$_H$ of the power supply terminal 11, and the ring-like planar P-type impurity region which becomes the anode of the second diode D2 is connected to the low-voltage terminal V$_L$ of the ground terminal 12.

A surge discharge current I shown in FIG. 5A is the flow when the parasitic diode D4 breaks down antecedently in the ESD test in which the negative surge pulse voltage N_Pls is applied to the electrode OUT of the output terminal 10 in a state where the ground terminal 12 and the low-voltage terminal V$_L$ are electrically in the open state. The surge discharge current I bypasses high resistance of the N-type well region N-Well and high resistance of the P-type well region P-Well, and flows from the high-voltage terminal V$_H$ to the electrode OUT of the output terminal 10 through the parasitic diode D4 between the N-type well region N-Well and the P-type well region P-Well.

As shown in FIG. 5B, the surge discharge current I shown in FIG. 5A flows from the left fourth contact Om_Cont4 of the first diode D1 to a plurality of contacts formed in the central N-type impurity region, which becomes the cathode of the second diode D2, through the parasitic diode D4.

FIGS. 7A and 7B are diagrams illustrating the equivalent circuit of the structure of the semiconductor device of the first diode D1 and the second diode D2 in the electrostatic protection circuit 13 of the semiconductor integrated circuit 1 shown in FIGS. 5A to 5D.

FIG. 7A is a diagram showing a state where the discharge route of the surge discharge current I described above overlaps the equivalent circuit of the sectional structure of the vicinity of the first diode D1 and the second diode D2 of the electrostatic protection circuit 13 shown in FIG. 5A and the planar structure of the vicinity of the first diode D1 and the second diode D2 of the electrostatic protection circuit 13 shown in FIG. 5B.

In FIG. 7A, a resistor R11 represents high resistance of the N-type well region N-Well of the first diode D1, and a resistor R21 represents high resistance of the P-type well region P-Well of the second diode D2. A diode D11 represents a partial diode of the first diode D1 near the parasitic diode D4, and a diode D12 represents a partial diode of the first diode D1 apart from the parasitic diode D4. A diode D21 represents a partial diode of the second diode D2 near the parasitic diode D4, and a diode D22 represents a partial diode of the second diode D2 apart from the parasitic diode D4.

As will be understood from FIG. 7A, the surge discharge current I flows into the shortest route of low impedance through the parasitic diode D4 without passing through R11 and R21 of high resistance.

FIG. 5C shows the planar structure of the vicinity of the first diode D1 and the second diode D2 of the electrostatic protection circuit 13 for improving this problem, and FIG. 5D shows the sectional structure of the vicinity of the first diode D1 and the second diode D2 of the electrostatic protection circuit 13 for improving this problem. The sectional structure of FIG. 5C and the planar structure of FIG. 5D have been studied by the inventors prior to the invention.

In the improved planar structure of FIG. 5C, as indicated by a broken line Del, the left fourth contact Om_Cont4 of the first diode D1 and the right fourth contact Om_Cont4 of the second diode D2 are omitted. When the negative surge pulse voltage N_Pls is applied to the electrode OUT of the output terminal 10 in a state where the ground terminal 12 and the low-voltage terminal $V_L$ are electrically in the open state, the surge discharge current I flows while bypassing the omitted portion Del.

Accordingly, as shown in the improved sectional structure of FIG. 5D, the surge discharge current I shown in FIG. 5C flows to a plurality of contacts formed in the central N-type impurity region, which becomes the cathode of the second diode D2, through high resistance of the N-type well region N-Well of the first diode D1.

FIG. 7B is a diagram illustrating the equivalent circuit of the improved sectional structure of the vicinity of the first diode D1 and the second diode D2 of the electrostatic protection circuit 13 shown in FIG. 5C and the improved planar structure of the vicinity of the first diode D1 and the second diode D2 of the electrostatic protection circuit 13 shown in FIG. 5D.

As will be understood from FIG. 7B, the surge discharge current I flows to the parasitic diode D4 (backward) and the partial diode D21 (forward) through the resistor R11 which is high resistance of the N-type well region N-Well of the first diode D1. As a result, impedance in case that the surge discharge current I flows increases, and thus, the risk of destruction of the vicinity of the parasitic diode D4 (backward) and the partial diode D21 (forward) is reduced.

FIGS. 6A to 6D are diagrams showing a sectional structure and a discharge path example of the electrostatic protection circuit 13 in the semiconductor integrated circuit 1 shown in FIG. 4.

FIG. 6A shows the sectional structure of the vicinity of the first diode D1 and the second diode D2 of the electrostatic protection circuit 13, and FIG. 6B shows the planar structure of the vicinity of the first diode D1 and the second diode D2 of the electrostatic protection circuit 13.

A surge discharge current I shown in FIG. 6A is the flow when the parasitic diode D4 breaks down antecedently in the ESD test in which the positive surge pulse voltage P_Pls is applied to the electrode OUT of the output terminal 10 in a state where the power supply terminal 11 and the high-voltage terminal $V_H$ are electrically in the open state. The surge discharge current I bypasses high resistance of the N-type well region N-Well and high resistance of the P-type well region P-Well, and flows from the electrode OUT of the output terminal 10 to the low-voltage terminal $V_L$ through the parasitic diode D4 between the N-type well region N-Well and the P-type well region P-Well.

As shown in FIG. 6B, the surge discharge current I shown in FIG. 6A flows from a plurality of contacts formed in the central P-type impurity region, which becomes the anode of the first diode D1, to the right fourth contact Om_Cont4 as the anode of the second diode D2 through the parasitic diode D4.

FIGS. 8A and 8B are diagrams illustrating the equivalent circuit of the structure of the semiconductor device of the first diode D1 and the second diode D2 in the electrostatic protection circuit 13 of the semiconductor integrated circuit 1 shown in FIGS. 6A to 6D.

FIG. 8A is a diagram showing a state where the discharge route of the surge discharge current I described above overlaps the equivalent circuit of the sectional structure of the vicinity of the first diode D1 and the second diode D2 of the electrostatic protection circuit 13 shown in FIG. 6A and the planar structure of the vicinity of the first diode D1 and the second diode D2 of the electrostatic protection circuit 13 shown in FIG. 6B.

In FIG. 8A, a resistor R11 represents high resistance of the N-type well region N-Well of the first diode D1, and a resistor R21 represents high resistance of the P-type well region P-Well of the second diode D2. A diode D11 represents a partial diode of the first diode D1 near the parasitic diode D4, and a diode D12 represents a partial diode of the first diode D1 apart from the parasitic diode D4. A diode D21 represents a partial diode of the second diode D2 near the parasitic diode D4, and a diode D22 represents a partial diode of the second diode D2 apart from the parasitic diode D4.

As will be understood from FIG. 8A, the surge discharge current I flows into the shortest route of low impedance through the parasitic diode D4 without passing through R11 and R21 of high resistance.

FIG. 6C shows the planar structure of the vicinity of the first diode D1 and the second diode D2 of the electrostatic protection circuit 13 for improving this problem, and FIG. 6D shows the sectional structure of the vicinity of the first diode D1 and the second diode D2 of the electrostatic protection circuit 13 for improving this problem. The sectional structure of FIG. 6C and the planar structure of FIG. 6D have been studied by the inventors prior to the invention.

In the improved planar structure of FIG. 6C, as indicated by a broken line Del, the left fourth contact Om_Cont4 of the first diode D1 and the right fourth contact Om_Cont4 of the second diode D2 are omitted. When the positive surge pulse voltage P_Pls is applied to the electrode OUT of the output terminal 10 in a state where the power supply terminal 11 and the high-voltage terminal $V_H$ are electrically in the open state, the surge discharge current I flows while bypassing the omitted portion Del.

Accordingly, as shown in the improved sectional structure of FIG. 6D, the surge discharge current I shown in FIG. 6C flows from a plurality of contacts formed in the central P-type impurity region, which becomes the anode of the first diode D1, through high resistance of P-type well region P-Well of the second diode D2.

FIG. 8B is a diagram illustrating the equivalent circuit of the improved sectional structure of the vicinity of the first diode D1 and the second diode D2 of the electrostatic protection circuit 13 shown in FIG. 6C and the improved planar structure of the vicinity of the first diode D1 and the second diode D2 of the electrostatic protection circuit 13 shown in FIG. 6D.

As will be understood from FIG. 8B, the surge discharge current I flows to the partial diode D11 (forward) and the parasitic diode D4 (backward) through the resistor R21 which is high resistance of the P-type well region P-Well of the second diode D2. As a result, impedance in case that the surge discharge current I flows increases, and thus, the risk of destruction of the vicinity of the partial diode D11 (forward) and the parasitic diode D4 (backward) is reduced.

The inventors have studied a weak spot in a MOS transistor device constituting the output buffer 14 and the inter-power source clamp circuit 15, or the finger-shaped third diode D3 constituting the power protection circuit 16.

FIGS. 11A to 11D are diagrams illustrating the semiconductor device of the N-channel MOS transistor Mn2 constituting the inter-power source clamp circuit 15 as an example of a MOS transistor which has been studied by the inventors prior to the invention.

As shown in the equivalent circuit of FIG. 11A, the drain D and the source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12. The gate G of the N-channel MOS transistor Mn2 and the P-type well region P-Well are connected to the low-voltage terminal $V_L$ of the ground terminal 12.

As shown in the planar structure of FIG. 11B, the gate G of the N-channel MOS transistor Mn2 constituting the inter-power source clamp circuit 15 is formed of a plurality of finger electrodes, and the N-type impurity region forming the drain D and the N-type impurity region forming the source S are respectively formed on the left and right sides of each gate finger electrode. A hatched insulating isolation layer Iso is formed to have a ring-like planar shape in the periphery of a plurality of finger electrodes G, a plurality of drain N-type impurity regions D, and a plurality of source N-type impurity regions S. A P-type impurity region which functions as a guard ring Grd_Rng is formed to have a ring-like planar shape in the periphery of the ring-like planar shape of the insulating isolation layer Iso. The insulating isolation layer Iso is formed to have a ring-like planar shape in the periphery of the P-type impurity region which functions as the guard ring Grd_Rng. The P-type impurity region of the guard ring Grd_Rng is formed for the purposes of power feed to the P-type well region P-Well, reduction in the amount of transmission of noise from the N-channel MOS transistor Mn2 formed inside the guard ring Grd_Rng to the internal circuit of the semiconductor integrated circuit 1 shown in FIG. 1, and reduction in the risk of latchup destruction of the N-channel MOS transistor Mn2 formed inside the guard ring Grd_Rng due to noise from the internal circuit of the semiconductor integrated circuit 1 shown in FIG. 1.

As shown in FIG. 11C which shows a sectional structure taken along the line X-X' of the planar structure of FIG. 11B, the high-voltage terminal $V_H$ of the power supply terminal 11 is connected to a plurality of drain N-type impurity regions, and the low-voltage terminal $V_L$ of the ground terminal 12 is connected to the P-type impurity region of the guard ring Grd_Rng, a plurality of source N-type impurity regions, a plurality of gate finger electrodes, and the P-type well region P-Well.

As shown in FIG. 11D which shows a sectional structure taken along the line Y-Y' of the planar structure of FIG. 11B, the drain N-type impurity region is connected to the electrode of the high-voltage terminal $V_H$ of the power supply terminal 11 through a plurality of contacts, and the P-type impurity region of the guard ring Grd_Rng is connected to the electrode of the low-voltage terminal $V_L$ of the ground terminal 12 through a plurality of contacts.

As shown in the planar structure of FIG. 11B, a plurality of contacts arranged in the longitudinal direction are formed in the drain N-type impurity region D and the source N-type impurity region S formed in a longitudinal rectangular shape along the line Y-Y'. A plurality of contacts arranged in the longitudinal direction are formed in the P-type impurity region of the right-side guard ring Grd_Rng and the P-type impurity region of the left-side guard ring Grd_Rng of the planar structure of FIG. 11B. A plurality of contacts arranged in the lateral direction along the line X-X' are formed in the P-type impurity region of the upper-side guard ring Grd_Rng and the P-type impurity region of the lower-side guard ring Grd_Rng of the planar structure of FIG. 11B.

It is assumed that the positive surge pulse voltage P_Pls is applied to the high-voltage terminal $V_H$ of the power supply terminal 11 in a state where the ground potential Vss is supplied to the low-voltage terminal $V_L$ of the ground terminal 12 of the N-channel MOS transistor Mn2 of the inter-power source clamp circuit 15 shown in FIGS. 11A to 11D. First, as will be understood from the sectional structure of FIG. 11D, since the parasitic diode between the drain N-type impurity region and the P-type well region P-Well breaks down, an initial surge discharge current flows from the drain N-type impurity region to the P-type well region P-Well. Accordingly, the initial surge discharge current flows to high resistance of the P-type well region P-Well, causing a rise in voltage of the P-type well region P-Well. As a result, as will be understood from the sectional structure of FIG. 11C, a parasitic bipolar transistor Trs is put in the on state, and a large surge discharge current resulting from the parasitic bipolar transistor Trs flows with low impedance between the high-voltage terminal $V_H$ of the power supply terminal 11 and the low-voltage terminal $V_L$ of the ground terminal 12. Note that, in the parasitic bipolar transistor Trs, the drain N-type impurity region, the P-type well region P-Well, and the source N-type impurity region are respectively formed as a collector, a base, and an emitter.

With the studies of the inventors prior to the invention, it has been obvious that, in case that the parasitic diode between the drain N-type impurity region and the P-type well region P-Well initially breaks down, in a portion Wk_Sp of the planar structure of FIG. 11B and the sectional structure of FIG. 11D, the current density of the initial surge discharge current of the PN junction becomes higher than the PN junctions of other portions, and there is a high risk that this portion becomes a weak spot.

In the planar structure of FIG. 11B, in the portion of the weak spot Wk_Sp on the short side of the drain N-type impurity region D formed in the longitudinal rectangular shape along the line Y-Y', the distance b between the drain N-type impurity region and the P-type impurity region of the guard ring Grd_Rng is small. Meanwhile, as will be understood from FIG. 11C which shows the sectional structure taken along the line X-X' of the planar structure of FIG. 11B, the distance between the long side portion of the drain N-type impurity region D formed in the longitudinal rectangular shape and the P-type impurity region of the guard ring Grd_Rng has a large value corresponding to the sum of the width of the finger electrode of the gate G, the width of the source N-type impurity region, and the width a of the inner insulating isolation layer Iso. As a result, in the portion of the weak spot Wk_Sp of the short side portion of the longitudinal rectangular shape having the small distance b, series resistance becomes smaller than other portions, and the current density of the initial surge discharge current becomes higher, such that the portion of the weak spot Wk_Sp is destroyed.

FIGS. 21A to 21D are diagrams illustrating a semiconductor device (an example of a finger-shaped N-type diode) of the third diode D3 constituting the power protection circuit 16 which has been studied by the inventors prior to the invention.

As shown in an equivalent circuit of FIG. 21A, the cathode and anode of the third diode D3 constituting the power protection circuit 16 are respectively connected to the high-voltage terminal $V_H$ of the power supply terminal 11 and the low-voltage terminal $V_L$ of the ground terminal 12.

As shown in a planar structure of FIG. 21B, in order to form the third diode D3 constituting the power protection circuit 16, a plurality of N-type impurity regions for forming a cathode K and a plurality of P-type impurity regions for forming an anode A are formed. A hatched insulating isolation layer Iso is formed to have a ring-like planar shape in the periphery of a plurality of N-type impurity regions for forming the cathode K and a plurality of P-type impurity regions forming the anode A. A P-type impurity region which functions as a guard ring Grd_Rng is formed to have a ring-like planar shape in the periphery of the ring-like plane shape of the insulating isolation layer Iso. An insulating isolation layer Iso is formed to have a ring-like planar shape in the periphery of the P-type impurity region which functions as the guard ring Grd_Rng. The P-type impurity region of the guard ring Grd_Rng is formed for the purposes of power feed to the P-type well region P-Well, reduction in the amount of transmission of noise from the third diode D3 formed inside the guard ring Grd_Rng to the internal circuit of the semiconductor integrated circuit 1 shown in FIG. 1, and reduction in the risk of latchup destruction of the third diode D3 formed inside the guard ring Grd_Rng due to noise from the internal circuit of the semiconductor integrated circuit 1 shown in FIG. 1.

As shown in FIG. 21C which shows a sectional structure taken along the line X-X' of the planar structure of FIG. 21B, the high-voltage terminal $V_H$ of the power supply terminal 11 is connected to a plurality of N-type impurity regions for forming the cathode K, and the low-voltage terminal $V_L$ of the ground terminal 12 is connected to the P-type impurity region of the guard ring Grd_Rng, a plurality of P-type impurity regions for forming the anode A, and the P-type well region P-Well.

As shown in FIG. 21D which shows a sectional structure taken along the line Y-Y' of the planar structure of FIG. 21B, the N-type impurity region for forming the cathode K is connected to the electrode of the high-voltage terminal $V_H$ of the power supply terminal 11 through a plurality of contacts, and the P-type impurity region of the guard ring Grd_Rng is connected to the electrode of the low-voltage terminal $V_L$ of the ground terminal 12 through a plurality of contacts.

As shown in the planar structure of FIG. 21B, a plurality of contacts arranged in the longitudinal direction are formed in a plurality of N-type impurity regions for forming the cathode K and a plurality of P-type impurity regions for forming the anode A which are formed in the longitudinal rectangular shape along the line Y-Y'. A plurality of contacts arranged in the longitudinal direction are formed in the P-type impurity region of the right-side guard ring Grd_Rng and the P-type impurity region of the left-side guard ring Grd_Rng of the planar structure of FIG. 21B. A plurality of contacts arranged in the lateral direction along the X-X' are formed in the P-type impurity region of the upper-side guard ring Grd_Rng and the P-type impurity region of the lower-side guard ring Grd_Rng of the planar structure of FIG. 21B.

It is assumed that the positive surge pulse voltage P_Pls is applied to the high-voltage terminal $V_H$ of the cathode K in a state where the ground potential Vss of the low-voltage terminal $V_L$ is supplied to the anode A of the third diode D3 of the power protection circuit 16 shown in FIGS. 21A to 21D. As will be understood from the sectional structure of FIG. 21D, since the parasitic diode between the N-type impurity region for forming the cathode K and the P-type well region P-Well breaks down, a surge discharge current flows from the N-type impurity region for forming the cathode K to the P-type well region P-Well.

Meanwhile, with the studies of the inventors prior to the invention, it has been obvious that, in case that a plurality of parasitic diodes between a plurality of N-type impurity regions for forming the cathode K and the P-type well region P-Well break down, in a portion Wk_Sp shown in the planar structure of FIG. 21B and the sectional structure of FIG. 21D, the current density of the surge discharge current of the PN junction becomes higher than the PN junctions of other portions, and there is an increase of the risk that this portion becomes a weak spot.

In the planar structure of FIG. 21B, in the portion of the weak spot Wk_Sp of the short side portion of the N-type impurity region of the cathode K formed in the longitudinal rectangular shape along the line Y-Y', the distance b between the N-type impurity region for forming the cathode K and the P-type impurity region of the guard ring Grd_Rng is small. As will be understood from FIG. 21C which shows the sectional structure taken along the line X-X' of the planar structure of FIG. 21B, the distance a between the long side portion of the N-type impurity region of the cathode K formed in the longitudinal rectangular shape and the P-type impurity region of the guard ring Grd_Rng or the P-type impurity region for forming the anode A is set to be equal to the distance b.

In the short side portion of the N-type impurity region of the cathode K formed in the longitudinal rectangular shape with the distance a and the long side portion of the N-type impurity region of the cathode K formed in the longitudinal rectangular shape with the distance b, a backward current between the N-type impurity region of the cathode K and the guard ring Grd_Rng or the P-type impurity region for forming the anode A is determined by the width in which the N-type impurity region and the P-type impurity region face each other in parallel. Meanwhile, since a strong electric field is generated in four corner portions of the N-type impurity region of the cathode K formed in the longitudinal rectangular shape, a backward current which is larger than the backward current of the parallel opposing portion flows in the four corner portions. If it is assumed that half of the large backward current flowing in the corner portions and the other half of the large backward current respectively flow in the short side portion and the long side portion, an increase in the current of the short side portion becomes larger than an increase in the current of the long side portion. As a result, the short side portion of the N-type impurity region of the cathode K formed in the longitudinal rectangular shape becomes the weak spot Wk_Sp, and the current density of the surge discharge current becomes higher, causing destruction.

The invention has been accomplished as the result of the studies of the inventors and the like prior to the invention.

An object of the invention is to reduce the risk of destruction of a weak spot in a PN junction between a protection device constituting an electrostatic protection circuit and a guard ring region formed in the periphery of the protection device.

The above and other objects and novel features of the invention will become clear from the description of the specification and the accompanying drawings.

A representative one of the inventions disclosed herein will be simply described as follows.

That is, a representative embodiment of the invention provides a semiconductor integrated circuit (1) equipped with an electrostatic protection circuit (13, 15, or 16) (see FIG. 1).

The semiconductor integrated circuit includes a first conduction-type semiconductor region (P-Well), a second conduction-type first impurity region (N) of a conduction type opposite to the first conduction type, and a guard ring (Grd_Rng) formed using a first conduction-type second impurity region (P) so as to form a protection device (Mn2) of the electrostatic protection circuit (see FIGS. 11A to 11D).

The first impurity region (N) is formed inside the semiconductor region as a rectangular planar structure having at least long and short sides.

The guard ring formed using the second impurity region is formed to have a ring-like planar shape inside the semiconductor region so as to surround the periphery of the first impurity region.

A weak spot (Wk_SP) where the risk of destruction is higher than other portions is formed on the short side of the rectangular planar structure of the first impurity region.

A plurality of electrical contacts arranged along the long side are formed in a first portion of the guard ring which faces the long side of the rectangular planar structure.

A plurality of electrical contacts are not formed in a second portion of the guard ring which faces the weak spot formed on the short side of the rectangular planar structure (see FIGS. 12A to 12C).

The representative one of the inventions disclosed herein has the following effect as follows.

That is, according to the invention, it is possible to reduce the risk of destruction of a weak spot in a PN junction between a protection device constituting an electrostatic protection circuit and a guard ring region formed in the periphery of the protection device.

BRIEF DESCRIPTION OF THE DRAWINGS

FIGS. 5A to 5D are diagrams showing a sectional structure and a discharge path example of an electrostatic protection circuit 13 in a semiconductor integrated circuit 1 shown in FIG. 3.

FIGS. 6A to 6D are diagrams showing a sectional structure and a discharge path example of an electrostatic protection circuit 13 in a semiconductor integrated circuit 1 shown in FIG. 4.

FIGS. 9A to 9C are diagrams illustrating the structure of a semiconductor device of a first diode D1 in an electrostatic protection circuit 13 of a semiconductor integrated circuit 1 shown in FIGS. 5A to 5D.

FIGS. 10A to 10C are diagrams illustrating the structure of a semiconductor device of a second diode D2 in an electrostatic protection circuit 13 of a semiconductor integrated circuit 1 shown in FIGS. 5A to 5D.

FIGS. 11A to 11D are diagrams illustrating a semiconductor device of an N-channel MOS transistor Mn2 constituting an inter-power source clamp circuit 15 as an example of a MOS transistor which has been studied by the inventors prior to the invention.

FIGS. 13A to 13D are diagrams illustrating a semiconductor device of a P-channel MOS transistor Mp2 constituting an inter-power source clamp circuit 15 which has been studied by the inventors prior to the invention as a comparative reference example of the invention.

FIGS. 19A to 19D are diagrams illustrating a semiconductor device of an N-channel MOS transistor Mn2 constituting an inter-power source clamp circuit 15 which has been studied by the inventors prior to the invention as a comparative reference example of the invention.

FIGS. 20A to 20D are diagrams illustrating a semiconductor device of an N-channel MOS transistor Mn2 constituting an inter-power source clamp circuit 15 according to Embodiment 1 of the invention.

FIGS. 21A to 21D are diagrams illustrating a semiconductor device (an example of a finger-shaped N-type diode) of a third diode D3 constituting a power protection circuit 16 which has been studied by the inventors prior to the invention.

FIGS. 22A to 22D are diagrams illustrating a semiconductor device having a different structure of a third diode D3 constituting a power protection circuit 16 which has been studied by the inventors prior to the invention.

FIGS. 26A to 26D are diagrams illustrating a semiconductor device having a different structure of a third diode D3 constituting a power protection circuit 16 which has been studied by the inventors prior to the invention as a comparative reference example of the invention.

FIGS. 27A to 27D are diagrams illustrating a semiconductor device of a third diode D3 constituting a power protection circuit 16 according to Embodiment 2 of the invention.

FIGS. 28A to 28D are diagrams illustrating a semiconductor device having a different structure of a third diode D3 constituting a power protection circuit 16 according to Embodiment 2 of the invention.

FIGS. 30A to 30D are diagrams illustrating a semiconductor device having a different structure of a third diode D3 constituting a power protection circuit 16 according to Embodiment 2 of the invention.

FIGS. 33A to 33D are diagrams illustrating a semiconductor device of an N-channel MOS transistor Mn3 constituting a switch circuit 17 which has been studied by the inventors prior to the invention as a comparative reference example of the invention.

FIGS. 35A to 35G are diagrams illustrating semiconductor devices of a first diode D1 and a second diode D2 of an electrostatic protection circuit 13 according to Embodiment 4 of the invention.

DETAILED DESCRIPTION

1. Summary of the Embodiments

Figure 1:
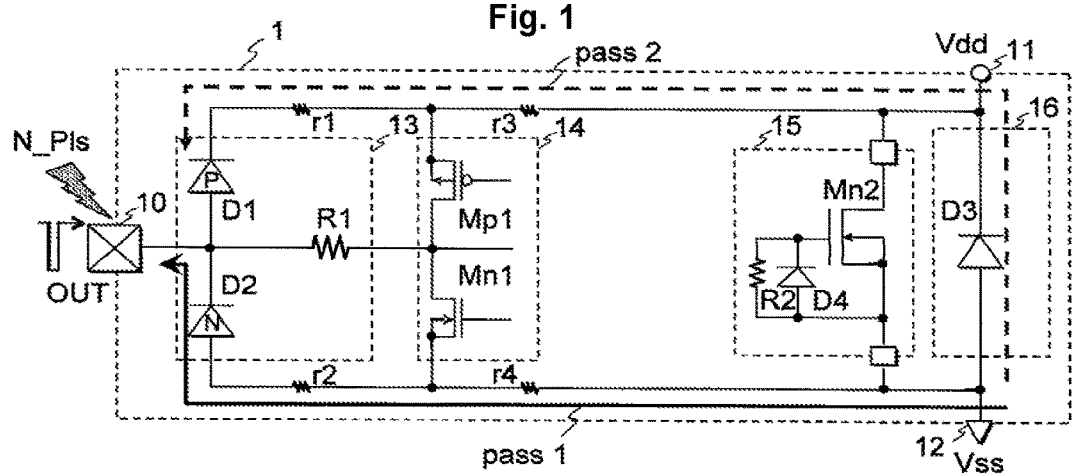
FIG. 1 is a diagram showing the configuration of a semiconductor integrated circuit equipped with an electrostatic protection circuit (ESD protection circuit) according to Embodiment 1 of the invention.

First, the summary of a representative embodiment of the invention disclosed herein will be described. In the description of the summary of the representative embodiment, reference numerals in parentheses merely illustrate devices included in the concepts of components marked with the reference numerals.

[1] A representative embodiment of the invention provides a semiconductor integrated circuit (1) equipped with an electrostatic protection circuit (13, 15, or 16) (see FIG. 1).

The semiconductor integrated circuit includes a first conduction-type semiconductor region (P-Well), a second conduction-type first impurity region (N) of a conduction type opposite to the first conduction type, and a guard ring (Grd_Rng) formed using a first conduction-type second impurity region (P) so as to form a protection device (Mn2) of the electrostatic protection circuit (see FIGS. 11A to 11D).

The first impurity region (N) is formed inside the semiconductor region as a rectangular planar structure having at least long and short sides.

The guard ring formed using the second impurity region is formed to have a ring-like planar shape inside the semiconductor region so as to surround the periphery of the first impurity region.

A weak spot (Wk_SP) where the risk of destruction is higher than other portions is formed on the short side of the rectangular planar structure of the first impurity region.

A plurality of electrical contacts arranged along the long side are formed in a first portion of the guard ring which faces the long side of the rectangular planar structure.

Figure 12A:
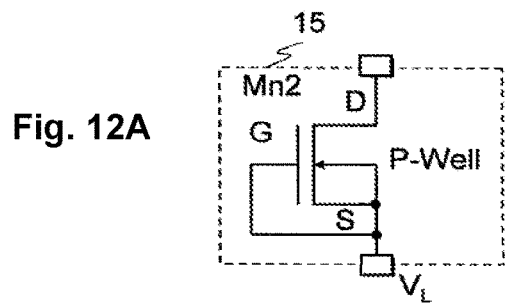
FIGS. 12A to 12C are diagrams illustrating a semiconductor device of an N-channel MOS transistor Mn2 constituting an inter-power source clamp circuit 15 according to Embodiment 1 of the invention.
Figure 12B:
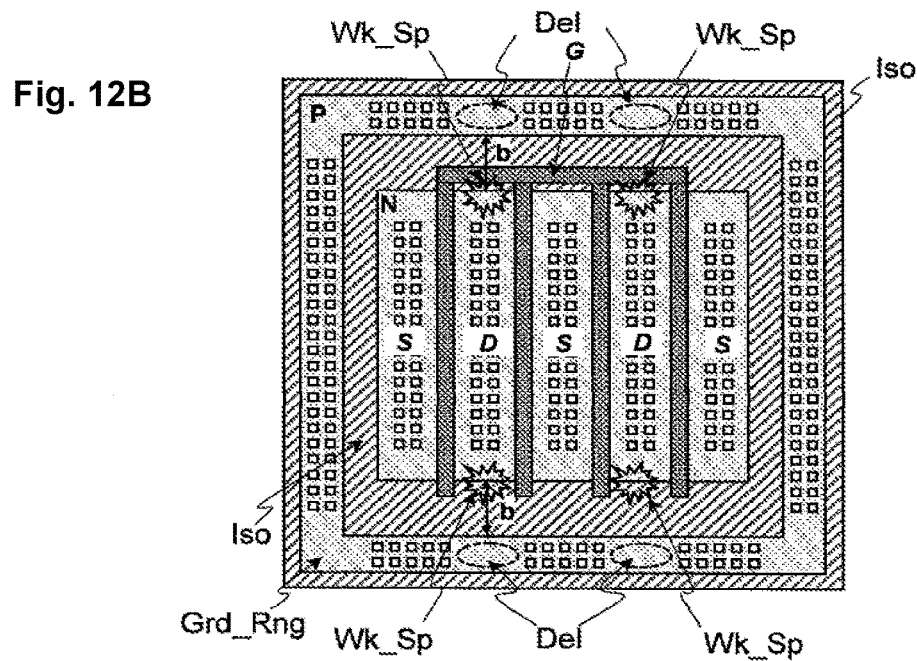
Figure 12C:
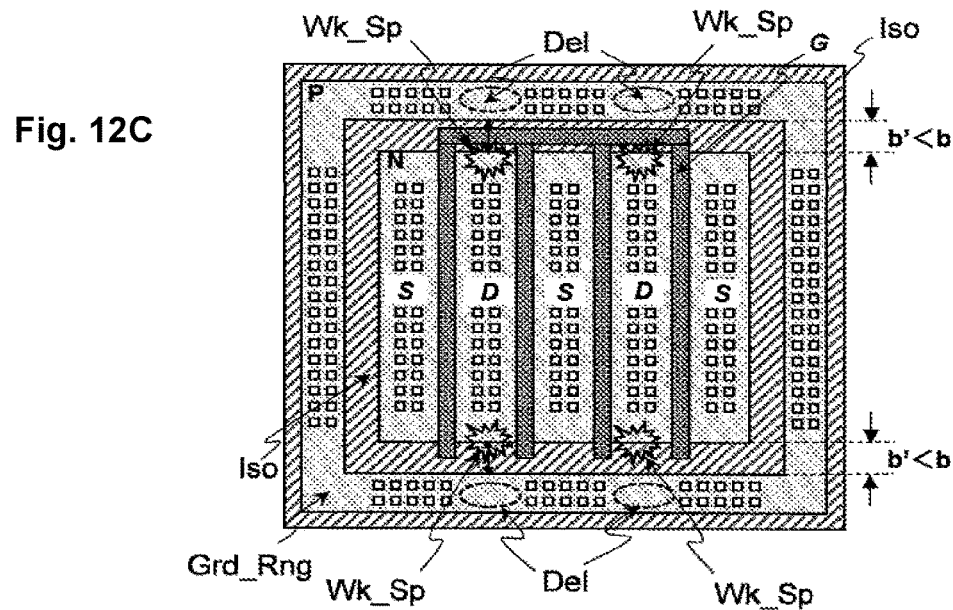

A plurality of electrical contacts are not formed in a second portion of the guard ring which faces the weak spot formed on the short side of the rectangular planar structure (see FIGS. 12A to 12C).

According to the above-described embodiment, it is possible to reduce the risk of destruction of a weak spot between a protection device constituting the electrostatic protection circuit and a guard ring region formed in the periphery of the protection device.

In a preferred embodiment, the second conduction-type first impurity region includes a plurality of first impurity regions repetitively formed along the short side.

A gate electrode (G) of a MOS transistor is formed between a plurality of first impurity regions along the long side.

One and the other of the plurality of first impurity regions respectively function as the source (S) and drain (D) of the MOS transistor.

The first conduction-type semiconductor region which functions as the substrate of the MOS transistor is electrically connected to one of the plurality of first impurity regions, which functions as the source of the MOS transistor, through the guard ring.

The weak spot is formed on the short side of the rectangular planar structure of the other of the plurality of first impurity regions which functions as the drain of the MOS transistor.

One of the plurality of first impurity regions which functions as the source of the MOS transistor, the gate electrode of the MOS transistor, and the other of the plurality of first impurity regions which functions as the drain of the MOS transistor are formed inside the guard ring.

The plurality of electrical contacts arranged along the long side are formed in the first portion of the guard ring which faces the long side of the rectangular planar structure of one of the plurality of first impurity regions functioning as the source of the MOS transistor.

A plurality of electrical contacts are not formed in the second portion of the guard ring which faces the weak spot formed on the short side of the rectangular planar structure of the other of the plurality of first impurity regions functioning as the drain of the MOS transistor (see FIGS. 12A to 12C).

In another preferred embodiment, one of the plurality of first impurity regions which functions as the source of the MOS transistor includes a plurality of source impurity regions, the other of the plurality of first impurity regions which functions as the drain of the MOS transistor includes a plurality of drain impurity regions, and the gate electrode of the MOS transistor includes a plurality of gate electrodes.

The plurality of source impurity regions, the plurality of gate electrodes, and the plurality of drain impurity regions are formed inside the guard ring (see FIGS. 12A to 12C).

In still another preferred embodiment, a plurality of weak spots are formed on a plurality of short sides of a plurality of rectangular planar structures of the plurality of first impurity regions as a plurality of drain impurity regions of the MOS transistor.

A plurality of electrical contacts are not formed in a plurality of second portions of the guard ring which face the plurality of weak spots formed on the plurality of short sides of the plurality of rectangular planar structures (see FIGS. 12A to 12C).

In a more preferred embodiment, a plurality of electrical contacts are not formed in a third portion of the guard ring which faces the short side of the rectangular planar structure of one of the plurality of first impurity regions which functions as the source of the MOS transistor (see FIGS. 16A to 16C and 17A to 17D).

In another more preferred embodiment, another guard ring (Grd_Rng) formed using the second conduction-type third impurity region (N) is formed in the periphery of the guard ring formed using the second impurity region.

Another second conduction-type semiconductor region (N-Well) is formed directly below another guard ring in the periphery of the first conduction-type semiconductor region (P-Well).

A predetermined voltage is able to be supplied to another second conduction-type semiconductor region through another guard ring (see FIGS. 17A to 17D).

In still another more preferred embodiment, silicide which is an alloy of high-melting-point metal and silicon is formed on the rectangular planar structure of one of the plurality of first impurity regions which functions as the source of the MOS transistor and the surface of the rectangular planar structure of the other of the plurality of first impurity regions which functions as the drain of the MOS transistor.

In the weak spot formed on the short side of the rectangular planar structure of the other of the plurality of first impurity regions which functions as the drain of the MOS transistor, a silicide block of the silicide is not substantially formed or the width of the silicide block of the silicide is set to be smaller than other portions (see FIGS. 20A to 20D).

In still another more preferred embodiment, while the second conduction-type first impurity region (N) functions as one of the cathode and anode of a diode (D3) as the protection device, the first conduction-type semiconductor region (P-Well) and the guard ring (Grd_Rng) formed using the first conduction-type second impurity region (P) function as the other of the cathode and anode of the diode as the protection device.

The weak spot (Wk_SP) is formed on the short side of the rectangular planar structure of the second conduction-type first impurity region (N) which functions as one of the cathode and anode of the diode as the protection device.

A plurality of electrical contacts are not formed in a second portion of the guard ring which faces the weak spot formed on the short side of the rectangular planar structure of the second conduction-type first impurity region functioning as one of the cathode and anode of the diode as the protection device (see FIGS. 23A to 23C, 27A to 27D, 29A to 29D, and 31A to 31D).

In still another more preferred embodiment, the second conduction-type first impurity region which functions as one of the cathode and anode of the diode as the protection device includes a plurality of first impurity regions (K . . . K)

The weak spot is formed on the short side of the rectangular planar structure of the plurality of first impurity regions which function as one of the cathode and anode of the diode as the protection device.

The plurality of first impurity regions which function as one of the cathode and anode of the diode as the protection device are formed inside the guard ring.

Figure 23A:
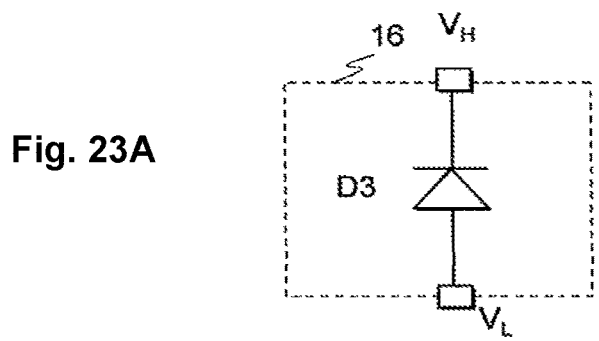
FIGS. 23A to 23C are diagrams illustrating a semiconductor device of a third diode D3 constituting a power protection circuit 16 according to Embodiment 2 of the invention.
Figure 23B:
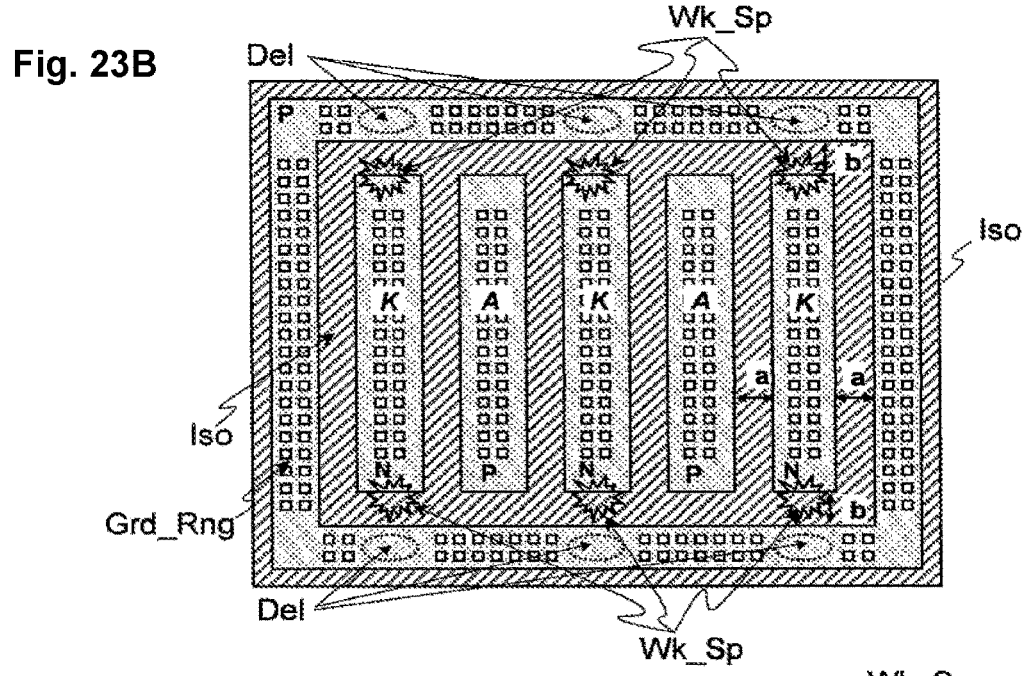
Figure 23C:
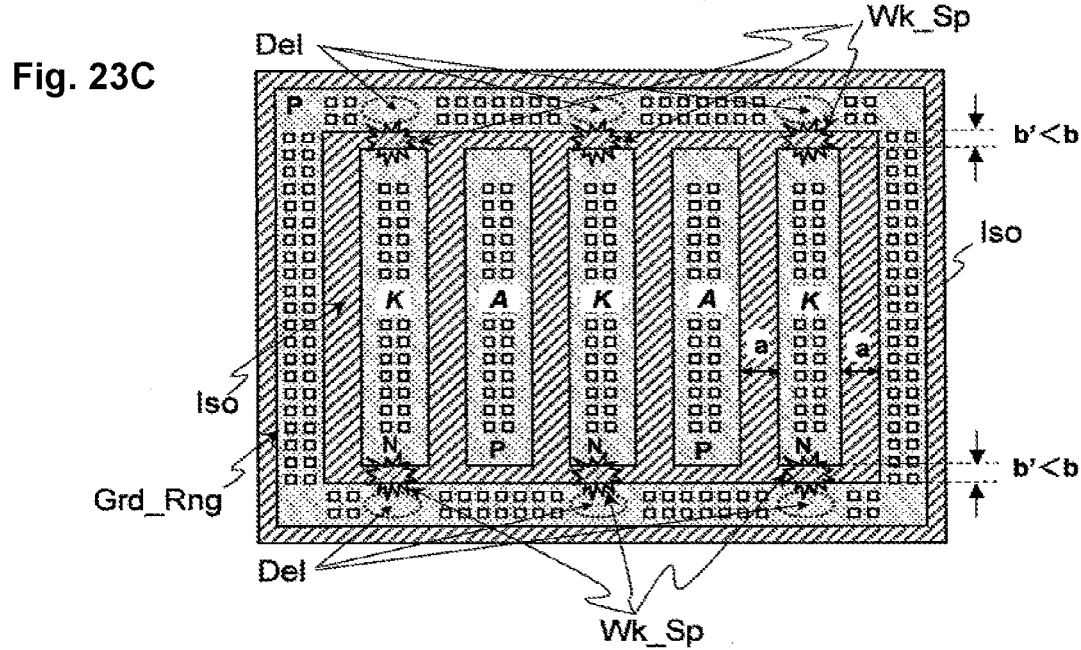
Figure 24A:
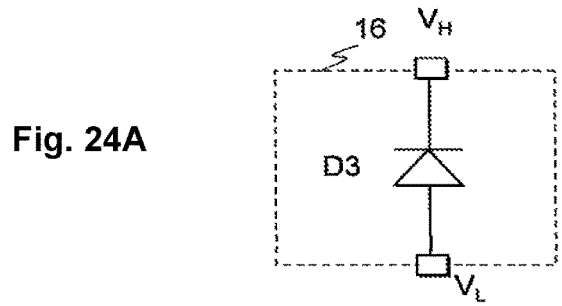
FIGS. 24A to 24C are diagrams illustrating a semiconductor device having a different structure of a third diode D3 constituting a power protection circuit 16 according to Embodiment 2 of the invention.
Figure 24B:
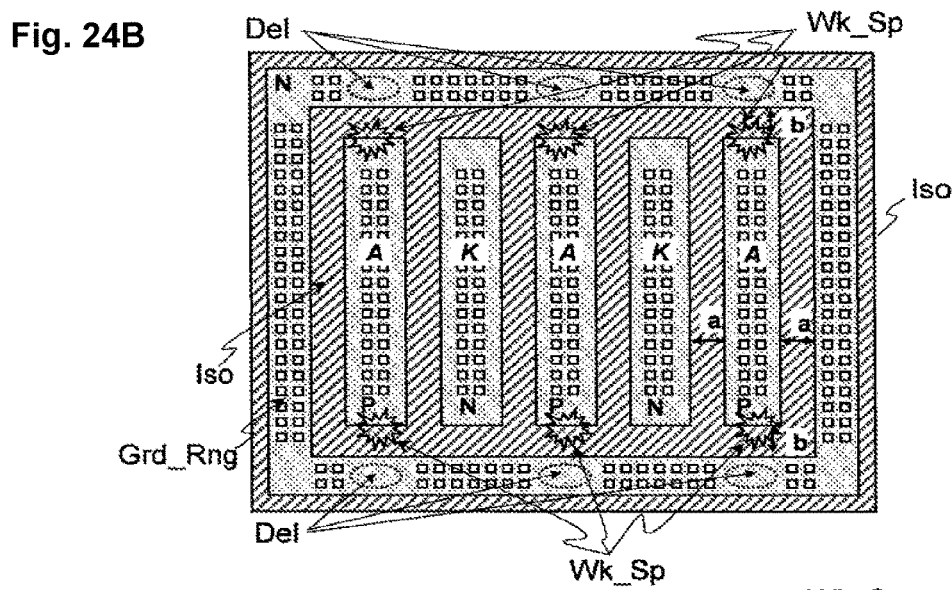
Figure 24C:
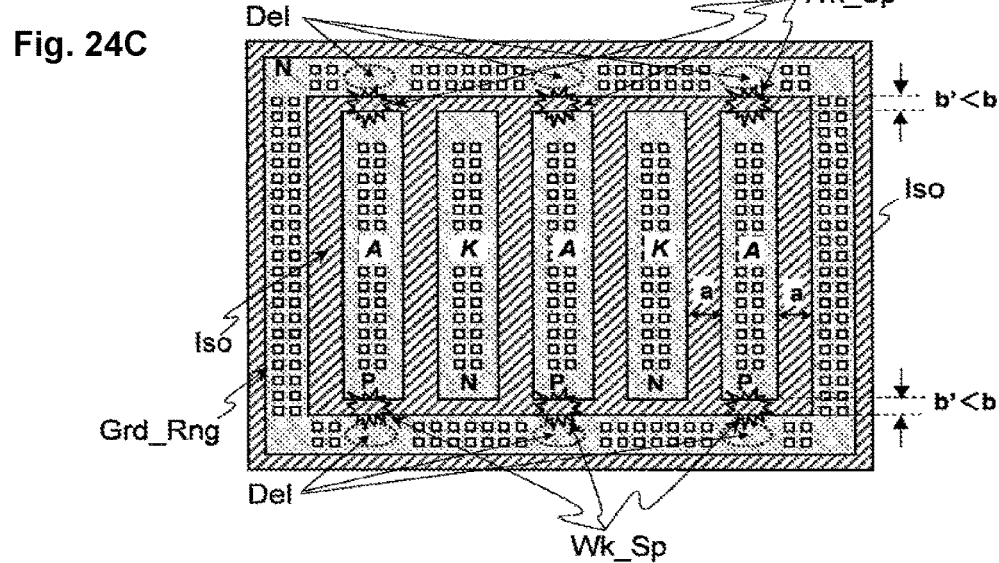

A plurality of electrical contacts are not formed in the second portion of the guard ring which faces the weak spot formed on the short side of the rectangular planar structure of the plurality of first impurity regions functioning as one of the cathode and anode of the diode (see FIGS. 23A to 23C).

In a specific embodiment, silicide which is an alloy of high-melting-point metal and silicon is formed on the surface of the second conduction-type first impurity region which functions as one of the cathode and anode of the diode.

In the weak spot formed on the short side of the rectangular planar structure of the first impurity region which functions as one of the cathode and anode of the diode, the silicide block of the silicide is not substantially formed or the width of the silicide block of the silicide is set to be smaller than other portions (see FIGS. 27A to 27D, 29A to 29D, and 31A to 31D).

In another specific embodiment, the second conduction-type first impurity region includes a plurality of first impurity regions repetitively formed along the short side.

A gate electrode (G) of a MOS transistor is formed between the plurality of first impurity regions along the long side.

One and the other of the plurality of first impurity regions respectively function as the source (S) and drain (D) of the MOS transistor.

The guard ring which is formed using the second impurity region and the first conduction-type semiconductor region which functions as the substrate of the MOS transistor, one of the plurality of first impurity regions which functions as the source of the MOS transistor, and the other of the plurality of first impurity regions which functions as the drain of the MOS transistor are able to be driven with different driving voltages ($V_{P\text{-}Well}$, $V_S$, and $V_D$).

The weak spot is formed on the short side of the rectangular planar structure of one of the plurality of first impurity regions which functions as the source of the MOS transistor and the short side of the rectangular planar structure of the other of the plurality of first impurity regions which functions as the drain of the MOS transistor.

One of the plurality of first impurity regions which functions as the source of the MOS transistor, the gate electrode of the MOS transistor, and the other of the plurality of first impurity regions which functions as the drain of the MOS transistor are formed inside the guard ring.

The plurality of electrical contacts arranged along the long side are formed in the first portion of the guard ring which faces the long side of the rectangular planar structure of one of the plurality of first impurity regions functioning as the source of the MOS transistor.

A plurality of electrical contacts are not formed in the second portion of the guard ring which faces the weak spot formed on the short side of the rectangular planar structure of one of the plurality of first impurity regions functioning as the source of the MOS transistor.

Figure 34A:
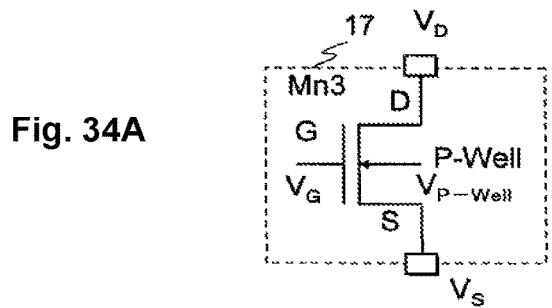
FIGS. 34A to 34C are diagrams illustrating a semiconductor device of an N-channel MOS transistor Mn3 of a switch circuit 17 according to Embodiment 3 of the invention.
Figure 34B:
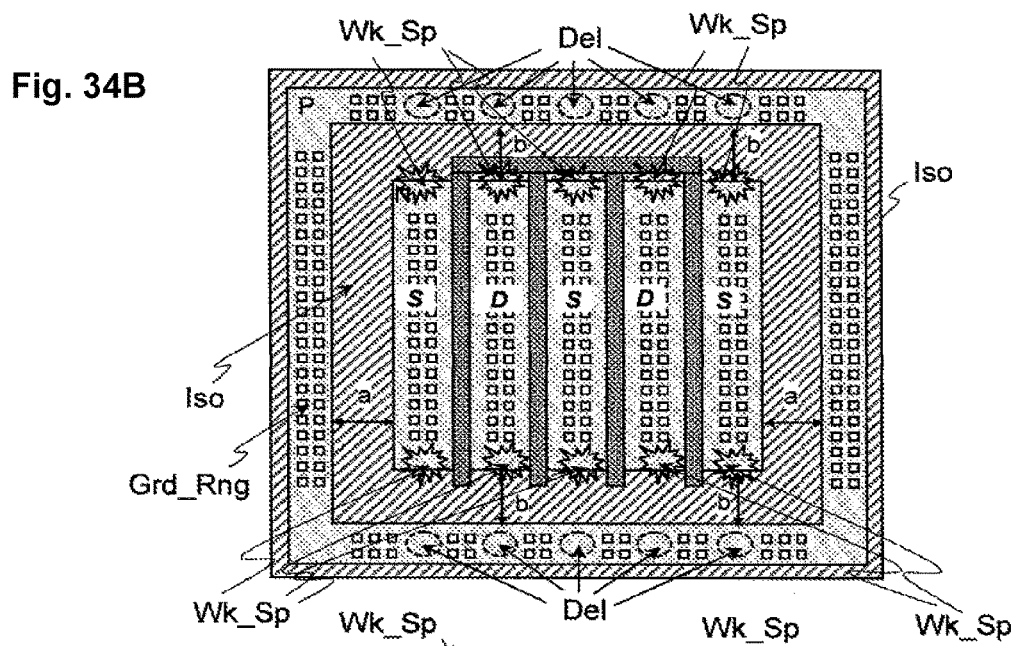
Figure 34C:
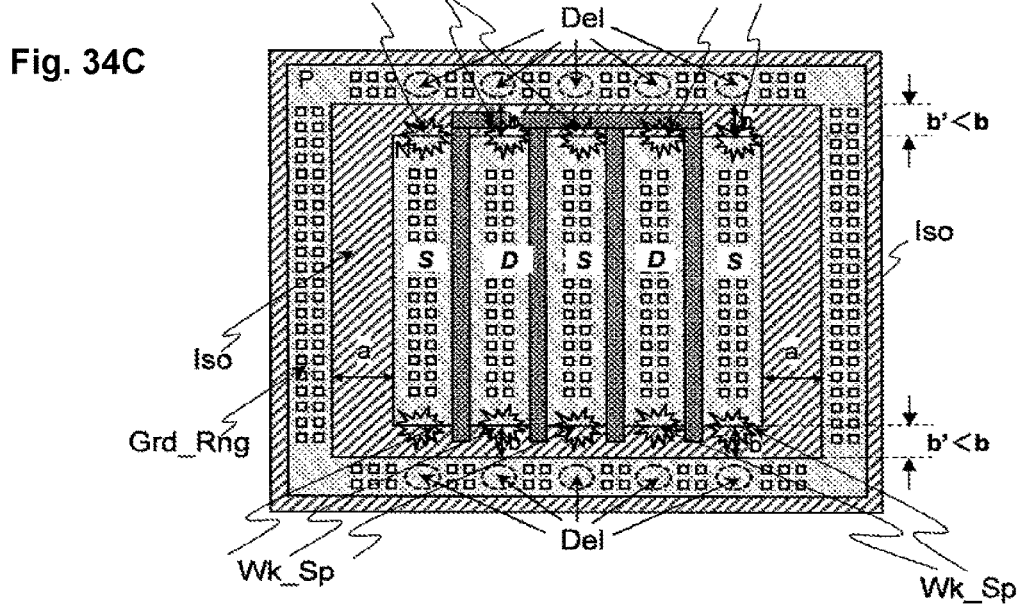

A plurality of electrical contacts are not formed in the second portion of the guard ring which faces the weak spot formed on the short side of the rectangular planar structure of the other of the plurality of first impurity regions functioning as the drain of the MOS transistor (see FIGS. 34A to 34C).

In a more specific embodiment, the MOS transistor in which the guard ring, the substrate, the source, and the drain are able to be driven with different driving voltages is a switch which is used in a switch circuit using an external capacitor arranged outside the semiconductor integrated circuit (1) (see FIGS. 34A to 34C).

In another more specific embodiment, the semiconductor integrated circuit (1) further includes an external output terminal (10), and an output buffer (14) which drives the external output terminal.

The electrostatic protection circuit (13, 15, or 16) prevents the output buffer from being destroyed due to a surge voltage which is supplied from the outside of the semiconductor integrated circuit (1) (see FIG. 1).

In the most specific embodiment, the semiconductor integrated circuit (1) further includes an external input terminal (10), and an input buffer (18) which is connected to the external input terminal.

Figure 36:
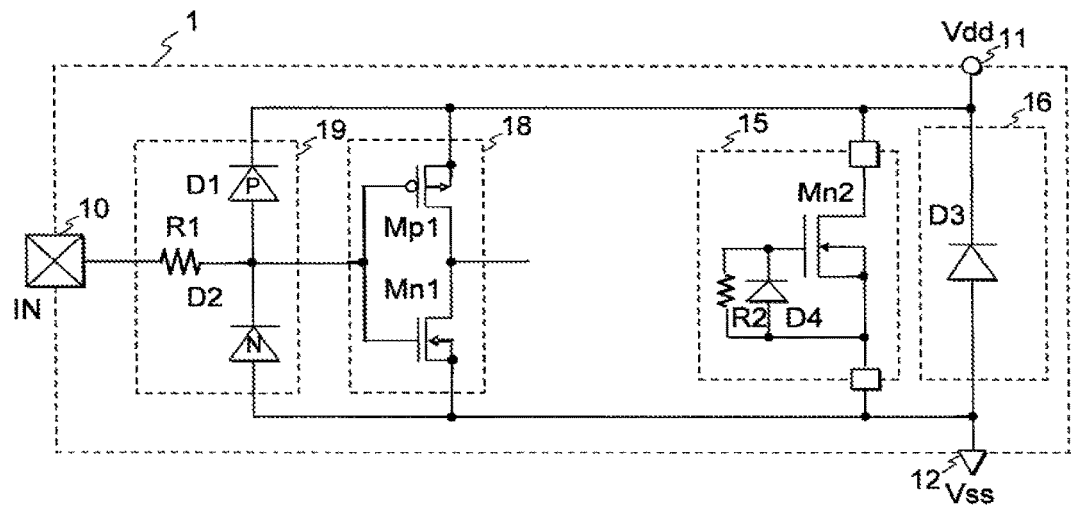
FIG. 36 is a diagram showing the configuration of a semiconductor integrated circuit equipped with an electrostatic protection circuit (ESD protection circuit) according to Embodiment 5 of the invention.

The electrostatic protection circuit (13, 15, or 16) prevents the input buffer from being destroyed due to a surge voltage which is supplied from the outside of the semiconductor integrated circuit (1) (see FIG. 36).

[2] A representative embodiment of another aspect of the invention provides a semiconductor integrated circuit (1) equipped with an electrostatic protection circuit (13, 15, or 16) (see FIG. 1).

The semiconductor integrated circuit includes a first conduction-type semiconductor region (P-Well), a second conduction-type first impurity region (N) of a conduction type opposite to the first conduction type, and a guard ring (Grd_Rng) formed using a first conduction-type second impurity region (P) so as to form a protection device (Mn2) of the electrostatic protection circuit (see FIGS. 11A to 11D).

The first impurity region (N) is formed inside the semiconductor region as a rectangular planar structure having at least long and short sides.

The guard ring formed using the second impurity region is formed to have a ring-like planar shape inside the semiconductor region so as to surround the periphery of the first impurity region.

A plurality of electrical contacts arranged along the long side are formed in a first portion of the guard ring which faces the long side of the rectangular planar structure.

A plurality of electrical contacts are not formed in a second portion of the guard ring which faces the short side of the rectangular planar structure (see FIGS. 12A to 12C).

According to the above-described embodiment, it is possible to reduce the risk of destruction of a weak spot between a protection device constituting the electrostatic protection circuit and a guard ring region formed in the periphery of the protection device.

In a preferred embodiment, the second conduction-type first impurity region includes a plurality of first impurity regions repetitively formed along the short side.

A gate electrode (G) of a MOS transistor is formed between a plurality of first impurity regions along the long side.

One and the other of the plurality of first impurity regions respectively function as the source (S) and drain (D) of the MOS transistor.

The first conduction-type semiconductor region which functions as the substrate of the MOS transistor is electrically connected to one of the plurality of first impurity regions, which functions as the source of the MOS transistor, through the guard ring.

One of the plurality of first impurity regions which functions as the source of the MOS transistor, the gate electrode of the MOS transistor, and the other of the plurality of first impurity regions which functions as the drain of the MOS transistor are formed inside the guard ring.

The plurality of electrical contacts arranged along the long side are formed in the first portion of the guard ring which faces the long side of the rectangular planar structure of one of the plurality of first impurity regions functioning as the source of the MOS transistor.

A plurality of electrical contacts are not formed in the second portion of the guard ring which faces the short side of the rectangular planar structure of the other of the plurality of first impurity regions functioning as the drain of the MOS transistor (see FIGS. 12A to 12C).

In another preferred embodiment, one of the plurality of first impurity regions which functions as the source of the MOS transistor includes a plurality of source impurity regions, the other of the plurality of first impurity regions which functions as the drain of the MOS transistor includes a plurality of drain impurity regions, and the gate electrode of the MOS transistor includes a plurality of gate electrodes.

The plurality of source impurity regions, the plurality of gate electrodes, and the plurality of drain impurity regions are formed inside the guard ring (see FIGS. 12A to 12C).

In still another preferred embodiment, a plurality of electrical contacts are not formed in a plurality of second portions of the guard ring which face a plurality of short sides of a plurality of rectangular planar structures of the plurality of first impurity regions as the plurality of drain impurity regions of the MOS transistor (see FIGS. 12A to 12C).

In a more preferred embodiment, a plurality of electrical contacts are not formed in a third portion of the guard ring which faces the short side of the rectangular planar structure of one of the plurality of first impurity regions functioning as the source of the MOS transistor (see FIGS. 16A to 16C and 17A to 17D).

In another more preferred embodiment, another guard ring (Grd_Rng) formed using the second conduction-type third impurity region (N) is formed in the periphery of the guard ring formed using the second impurity region.

Another second conduction-type semiconductor region (N-Well) is formed directly below another guard ring in the periphery of the first conduction-type semiconductor region (P-Well).

A predetermined voltage is able to be supplied to another second conduction-type semiconductor region through another guard ring (see FIGS. 17A to 17D).

[3] A semiconductor integrated circuit (1) according to a representative embodiment of another aspect of the invention further includes an external power supply terminal (11) and an external ground terminal (12) to which a power supply voltage (Vdd) and a ground potential (Vss) are respectively supplied from the outside of the semiconductor integrated circuit.

The electrostatic protection circuit includes an inter-power source clamp circuit (15) connected between the external power supply terminal and the external ground terminal.

A current path between the drain and source of the MOS transistor as the protection device of the inter-power source clamp circuit is connected between the external power supply terminal and the external ground terminal (see FIGS. 12A to 12C).

A semiconductor integrated circuit (1) according to a preferred embodiment further includes a decoupling capacitor (Cd) which has a destructive breakdown voltage higher than a turn-on voltage at which the MOS transistor as the protection device of the inter-power source clamp circuit starts an inter-power source clamp operation.

The decoupling capacitor is connected between the external power supply terminal and the external ground terminal (see FIGS. 38A to 38E).

In another preferred embodiment, the decoupling capacitor is a MOS capacitor which is formed simultaneously with the MOS transistor as the protection device of the inter-power source clamp circuit through a semiconductor manufacturing process of the semiconductor integrated circuit (see FIGS. 38A to 38E).

A semiconductor integrated circuit (1) according to a more preferred embodiment is formed using a rectangular semiconductor chip having first and second opposing long sides and first and second opposing short sides.

A main power interconnect (Main_Vdd) and a main ground interconnect (Main_Vss) are respectively formed to have a surrounding interconnect shape along the first and second long sides and the first and second short sides of the rectangular semiconductor chip.

A plurality of signal terminals (10) to which display information data is supplied from the outside of the semiconductor integrated circuit, the external power supply terminal (11) to which the power supply voltage is supplied, and the external ground terminal (12) to which the ground potential is supplied are formed on the first long side of the semiconductor chip.

A plurality of output terminals (OUT1, OUT2, . . . , and OUTn) which generate a plurality of output signals for driving a display device outside the semiconductor integrated circuit are formed on the second long side of the semiconductor chip.

An arrangement prohibition region (Cd_Proh) which is apart from the second long side and near the first long side to be substantially parallel to the first long side is set inside the rectangular semiconductor chip.

Inside or near the arrangement prohibition region, the main power interconnect and the external power supply terminal are connected together, and the main ground interconnect and the external ground terminal are connected together.

Figure 39:
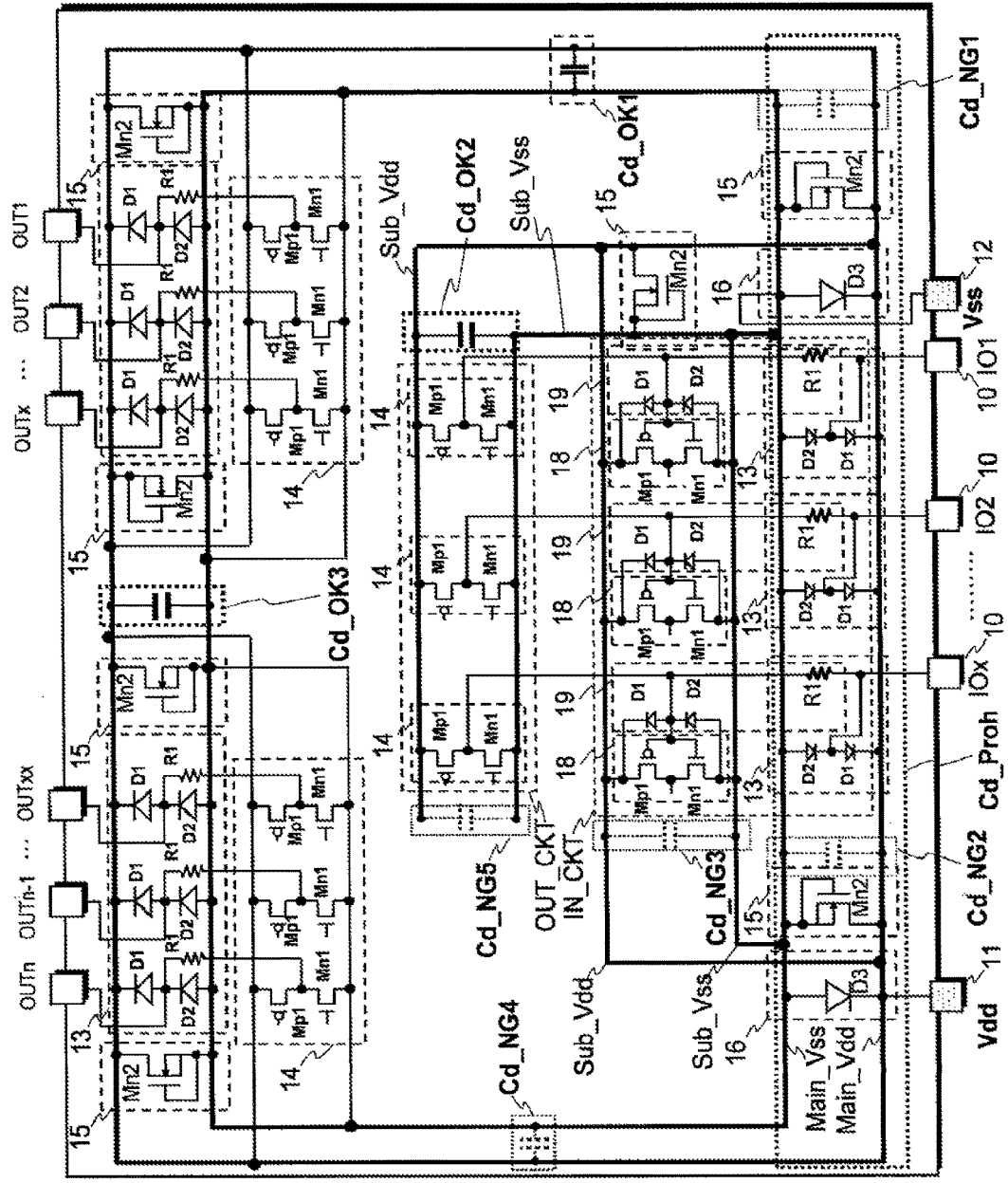
FIG. 39 is a diagram showing the layout configuration of a decoupling capacitor Cd inside a semiconductor chip of semiconductor integrated circuit shown in FIGS. 38A to 38E according to Embodiment 7 of the invention.

The arrangement of the decoupling capacitor (Cd) is prohibited inside the arrangement inhibition region (see FIG. 39).

In a specific embodiment, a region other than the arrangement prohibition region is set as an arrangement permission region inside the rectangular semiconductor chip.

The decoupling capacitor (Cd) is arranged inside the arrangement permission region.

The decoupling capacitor arranged inside the arrangement permission region is connected to the external power supply terminal and the external ground terminal through the inter-power source clamp circuit (see FIG. 39).

A semiconductor integrated circuit according to a more specific embodiment further includes a sub power interconnect (Sub_Vdd) and a sub ground interconnect (Sub_Vss).

The sub power interconnect and the sub ground interconnect supply an operating voltage to an internal circuit (14 or 18) arranged inside the arrangement permission region.

One end of the sub power interconnect and one end of the sub ground interconnect are respectively connected to the main power interconnect and the main ground interconnect, and the other end of the sub power interconnect and the other end of the sub ground interconnect are not respectively connected to the main power interconnect and the main ground interconnect.

At least the inter-power source clamp circuit is connected between the other end of the sub power interconnect and the other end of the sub ground interconnect (see FIG. 39).

In another more specific embodiment, the decoupling capacitor is connected between the other end of the sub power interconnect and the other end of the sub ground interconnect to be in parallel to the inter-power source clamp circuit (see FIG. 39).

In still another more specific embodiment, the inter-power source clamp circuit includes a time-constant circuit (TCC) which has a time constant forming resistor (Rs) and a time constant forming capacitor (Cs) connected in series between the external power supply terminal and the external ground terminal.

Figure 37A:
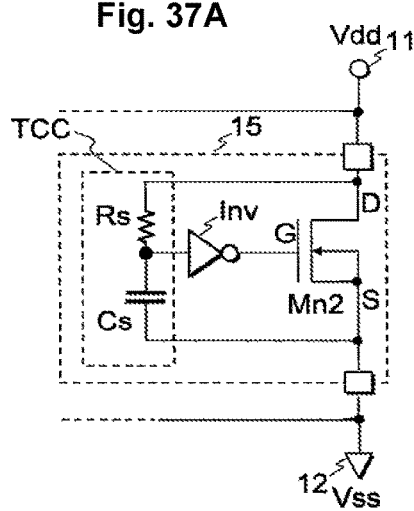
FIGS. 37A and 37B are diagrams showing another configuration of an inter-power source clamp circuit 15 in a semiconductor integrated circuit according to Embodiment 6 of the invention.
Figure 37B:
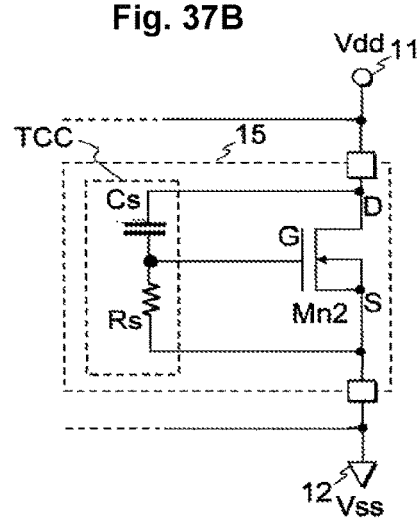

An output signal of the time-constant circuit drives the gate electrode of the MOS transistor as the protection device of the inter-power source clamp circuit (see FIGS. 37A and 37B).

In the most specific embodiment, the inter-power source clamp circuit further includes a CMOS inverter (Inv) whose input terminal and output terminal are respectively connected to the output terminal of the time-constant circuit and the gate electrode of the MOS transistor as the protection device (see FIGS. 37A and 37B).

2. Further Detailed Description of the Embodiments

Next, embodiments will be described in more detail. Note that, in all the drawings which describe the best mode for carrying out the invention, description of parts having the same functions as those in the drawings described above will not be repeated.

Embodiment 1

<<Configuration of Semiconductor Integrated Circuit>>

FIG. 1 is a diagram showing the configuration of a semiconductor integrated circuit equipped with an electrostatic protection circuit (ESD protection circuit) according to Embodiment 1 of the invention.

The semiconductor integrated circuit 1 shown in FIG. 1 includes an output terminal 10, an electrostatic protection circuit 13, an output buffer 14, an inter-power source clamp circuit 15, a power protection circuit 16, a power supply terminal 11, and a ground terminal 12. Resistors r1, r2, r3, and r4 are interconnect resistance.

<<Output Buffer>>

The output buffer 14 includes a P-channel MOS transistor Mp1 and an N-channel MOS transistor Mn1 connected in series between the power supply terminal 11 and the ground terminal 12. The driving output signals of the drain of the P-channel MOS transistor Mp1 and the drain of the N-channel MOS transistor Mn1 are supplied to the output terminal 10 through the electrostatic protection circuit 13.

<<Electrostatic Protection Circuit>>

The electrostatic protection circuit 13 prevents the P-channel MOS transistor Mp1 and the N-channel MOS transistor Mn1 of the output buffer 14 from being destroyed in case that a surge voltage responsible for electrostatic destruction is applied to the output terminal 10. The electrostatic protection circuit 13 includes a first diode D1, a second diode D2, and a resistor R1. The anode of the first diode D1 and the cathode of the second diode D2 are connected to the output terminal 10, the cathode of the first diode D1 is connected to the power supply terminal 11, and the anode of the second diode D2 is connected to the ground terminal 12. The anode of the first diode D1 and the cathode of the second diode D2 are connected to the drain of the P-channel MOS transistor Mp1 and the drain of the N-channel MOS transistor Mn1 of the output buffer 14 through the resistor R1.

<<Inter-Power Source Clamp Circuit>>

The inter-power source clamp circuit 15 includes an N-channel MOS transistor Mn2, a resistor R2, and a diode D4. The drain and source of the N-channel MOS transistor Mn2 are respectively connected to the power supply terminal 11 and the ground terminal 12, and the resistor R2 and the diode D4 are connected in parallel between the gate and source of the N-channel MOS transistor Mn2.

<<Power Protection Circuit>>

The power protection circuit 16 includes a third diode D3. The cathode and anode of the third diode D3 are respectively connected to the power supply terminal 11 and the ground terminal 12. If a negative surge pulse voltage is applied to the power supply terminal 11 in a state where the ground potential Vss is supplied to the ground terminal 12 of the semiconductor integrated circuit 1 shown in FIG. 1, the third diode D3 is in a forward direction and a surge discharge current flows, such that energy of the negative surge pulse voltage is consumed, making it possible to prevent the P-channel MOS transistor Mp1 and the N-channel MOS transistor Mn1 of the output buffer 14 from being destroyed.

<<Semiconductor Device of Inter-Power Source Clamp Circuit>>

FIGS. 12A to 12C are diagrams illustrating a semiconductor device of the N-channel MOS transistor Mn2 constituting the inter-power source clamp circuit 15 according to Embodiment 1 of the invention.

Like the equivalent circuit of FIG. 11A, as shown in an equivalent circuit of FIG. 12A, the drain D and the source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12, and the gate G of the N-channel MOS transistor Mn2 and the P-type well region P-Well are connected to the low-voltage terminal $V_L$ of the ground terminal 12.

Like the planar structure of FIG. 11B, as shown in a planar structure of FIG. 12B, the gate G of the N-channel MOS transistor Mn2 constituting the inter-power source clamp circuit 15 is formed using a plurality of finger electrodes, and an N-type impurity region for forming the drain D and an N-type impurity region for forming the source S are formed on the left and right sides of each gate finger electrode. A hatched insulating isolation layer Iso is formed to have a ring-like planar shape in the periphery of a plurality of finger electrodes G, a plurality of drain N-type impurity regions D, and a plurality of source N-type impurity regions S. A P-type impurity region which functions as a guard ring Grd_Rng is formed to have a ring-like planar shape in the periphery of the ring-like planar shape of the insulating isolation layer Iso. An insulating isolation layer Iso is formed to have a ring-like planar shape in the periphery of the P-type impurity region which functions as the guard ring Grd_Rng. The P-type impurity region of the guard ring Grd_Rng is formed for the purposes of power feed to the P-type well region P-Well, reduction in the amount of transmission of noise from the N-channel MOS transistor Mn2 formed inside the guard ring Grd_Rng to the internal circuit of the semiconductor integrated circuit 1 shown in FIG. 1, and reduction in the risk of latchup destruction of the N-channel MOS transistor Mn2 formed inside the guard ring Grd_Rng due to noise from the internal circuit of the semiconductor integrated circuit 1 shown in FIG. 1.

Like the planar structure of FIG. 11B, as shown in a planar structure of FIG. 12B, a plurality of contacts arranged in the longitudinal direction are formed in the drain N-type impurity regions D and the source N-type impurity regions S formed in the longitudinal rectangular shape. A plurality of contacts arranged in the longitudinal direction are formed in the P-type impurity region of the right-side guard ring Grd_Rng and the P-type impurity region of the left-side guard ring Grd_Rng of the planar structure of FIG. 12B. A plurality of contacts arranged in the lateral direction are formed in the P-type impurity region of the upper-side guard ring Grd_Rng and the P-type impurity region of the lower-side guard ring Grd_Rng of the planar structure of FIG. 12B.

Unlike the planar structure of FIG. 11B, in the P-type impurity region of the upper-side guard ring Grd_Rng and the P-type impurity region of the lower-side guard ring Grd_Rng of the planar structure of FIG. 12B, a plurality of contacts in a portion facing the weak spot Wk_Sp on the short side of the N-type impurity region D formed in the longitudinal rectangular shape are omitted as indicated by a broken line Del. With the omission of a plurality of contacts indicated by the broken line Del, since series resistance in the portion of the weak spot Wk_Sp on the short side of the N-type impurity region D formed in the longitudinal rectangular shape increases, it becomes possible to reduce the risk of destruction of the weak spot Wk_Sp.

A planar structure of FIG. 12C illustrates the planar structure of a semiconductor device of the N-channel MOS transistor Mn2 constituting the inter-power source clamp circuit 15 according to Embodiment 1 of the invention as well.

The planar structure of FIG. 12C is different from the planar structure shown in FIG. 12B in that the distance b' between the drain N-type impurity region in the portion of the weak spot Wk_Sp on the short side of the drain N-type impurity region D formed in the longitudinal rectangular shape and the P-type impurity region of the guard ring Grd_Rng is set to be smaller than the distance b in FIG. 12B.

As a result, according to the planar structure of FIG. 12C, it becomes possible to maintain the same ESD endurance as the planar structure of FIG. 11B, and to reduce the device area of the N-channel MOS transistor Mn2 of the inter-power source clamp circuit 15 compared to the planar structure of FIG. 11B.

FIGS. 13A to 13D are diagrams illustrating a semiconductor device of a P-channel MOS transistor Mp2 constituting the inter-power source clamp circuit 15 which has been studied by the inventors prior to the invention as a comparative reference example of the invention.

As shown in an equivalent circuit of FIG. 13A, the drain D and source S of the P-channel MOS transistor Mp2 constituting the inter-power source clamp circuit 15 are respectively connected to the low-voltage terminal $V_L$ of the ground terminal 12 and the high-voltage terminal $V_H$ of the power supply terminal 11, and the gate G of the P-channel MOS transistor Mp2 and the N-type well region N-Well are connected to the high-voltage terminal $V_H$ of the power supply terminal 11.

As shown in a planar structure of FIG. 13B, the gate G of the P-channel MOS transistor Mpg constituting the inter-power source clamp circuit 15 is formed using a plurality of finger electrodes, and a P-type impurity region for forming the drain D and a P-type impurity region for forming the source S are formed on the left and right sides of each gate finger electrode. A hatched insulating isolation layer Iso is formed to have a ring-like planar shape in the periphery of a plurality of finger electrodes G, a plurality of drain P-type impurity regions D, and a plurality of source P-type impurity regions S. An N-type impurity region which functions as the guard ring Grd_Rng is formed to have a ring-like planar shape in the periphery of the ring-like planar shape of the insulating isolation layer Iso. An insulating isolation layer Iso is formed to have a ring-like planar shape in the periphery of the N-type impurity region which functions as the guard ring Grd_Rng.

As shown in FIG. 13C which shows a sectional structure taken along the line X-X' of the planar structure of FIG. 13B, the low-voltage terminal $V_L$ of the ground terminal 12 is connected to a plurality of drain P-type impurity regions, and the high-voltage terminal $V_H$ of the power supply terminal 11 is connected to the N-type impurity region of the guard ring Grd_Rng, a plurality of source P-type impurity regions, a plurality of gate finger electrodes, and the N-type well region N-Well.

As shown in FIG. 13D which shows a sectional structure taken along the line Y-Y' of the planar structure of FIG. 13B, the drain P-type impurity region is connected to the electrode of the low-voltage terminal $V_L$ of the power supply terminal 11 through a plurality of contacts, and the N-type impurity region of the guard ring Grd_Rng is connected to the electrode of the high-voltage terminal $V_H$ of the ground terminal 12 through a plurality of contacts.

As shown in the planar structure of FIG. 13B, a plurality of contacts arranged in the longitudinal direction are formed in the drain P-type impurity region D and the source P-type impurity region S formed in the longitudinal rectangular shape along the line Y-Y'. A plurality of contacts arranged in the longitudinal direction are formed in the N-type impurity region of the right-side guard ring Grd_Rng and the N-type impurity region of the left-side guard ring Grd_Rng of the planar structure of FIG. 13B. A plurality of contacts arranged in the lateral direction along the line X-X' are formed in the P-type impurity region of the upper-side guard ring Grd_Rng and the P-type impurity region of the lower-side guard ring Grd_Rng of the planar structure of FIG. 13B.

It is assumed that the positive surge pulse voltage P_Pls is applied to the high-voltage terminal $V_H$ of the power supply terminal 11 in a state where the ground potential Vss is supplied to the low-voltage terminal $V_L$ of the ground terminal 12 of the P-channel MOS transistor Mp2 of the inter-power source clamp circuit 15 shown in FIGS. 13A to 13D. First, as will be understood from the sectional structure of FIG. 13D, since a parasitic diode between the drain P-type impurity region and the N-type well region N-Well breaks down, an initial surge discharge current flows from the N-type well region N-Well to the drain P-type impurity region. Accordingly, the initial surge discharge current flows to high resistance of the N-type well region N-Well, such that the voltage of the N-type well region N-Well is reduced. As a result, as will be understood from the sectional structure of FIG. 13C, a parasitic bipolar transistor Trs is put in the on state, and a large surge discharge current resulting from the parasitic bipolar transistor Trs flows with low impedance between the high-voltage terminal $V_H$ of the power supply terminal 11 and the low-voltage terminal $V_L$ of the ground terminal 12. Note that, in the parasitic bipolar transistor Trs, the drain P-type impurity region, the N-type well region N-Well, and the source P-type impurity region are respectively formed as a collector, a base, and an emitter.

With the studies of the inventors prior to the invention, it has been obvious that, in case that the parasitic diode between the drain P-type impurity region and the N-type well region N-Well initially breaks down, the current density of the initial surge discharge current of the PN junction in the portion of the weak spot Wk_Sp shown in the planar structure of FIG. 13B and the sectional structure of FIG. 13D becomes higher than the PN junctions of other portions, and there is a high risk of destruction of the portion of the weak spot Wk_Sp.

In the planar structure of FIG. 13B, in the portion of the weak spot Wk_Sp on the short side of the drain P-type impurity region D formed in the longitudinal rectangular shape along the line Y-Y', the distance b between the drain P-type impurity region and the N-type impurity region of the guard ring Grd_Rng is small. Meanwhile, as will be understood from FIG. 13C which shows the sectional structure taken along the line X-X' of the planar structure of FIG. 13B, the distance between the long side portion of the drain P-type impurity region D formed in the longitudinal rectangular shape and the N-type impurity region of the guard ring Grd_Rng has a large value corresponding to the sum of the width of the finger electrode of the gate G, the width of the source N-type impurity region, and the width a of the inner insulating isolation layer Iso. As a result, in the portion of the weak spot Wk_Sp on the short side of the longitudinal rectangular shape having the small distance b, series resistance becomes smaller than other portions, and the current density of the initial surge discharge current becomes higher, such that the portion of the weak spot Wk_Sp is destroyed.

Figure 14A:
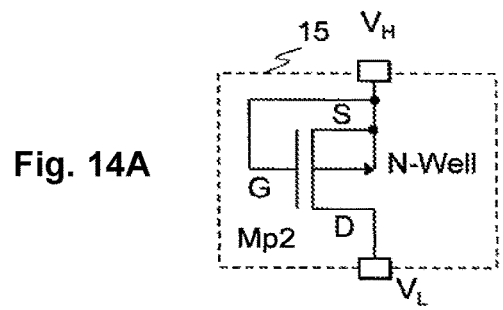
FIGS. 14A to 14C are diagrams illustrating a semiconductor device of a P-channel MOS transistor Mp2 constituting an inter-power source clamp circuit 15 according to Embodiment 1 of the invention.
Figure 14B:
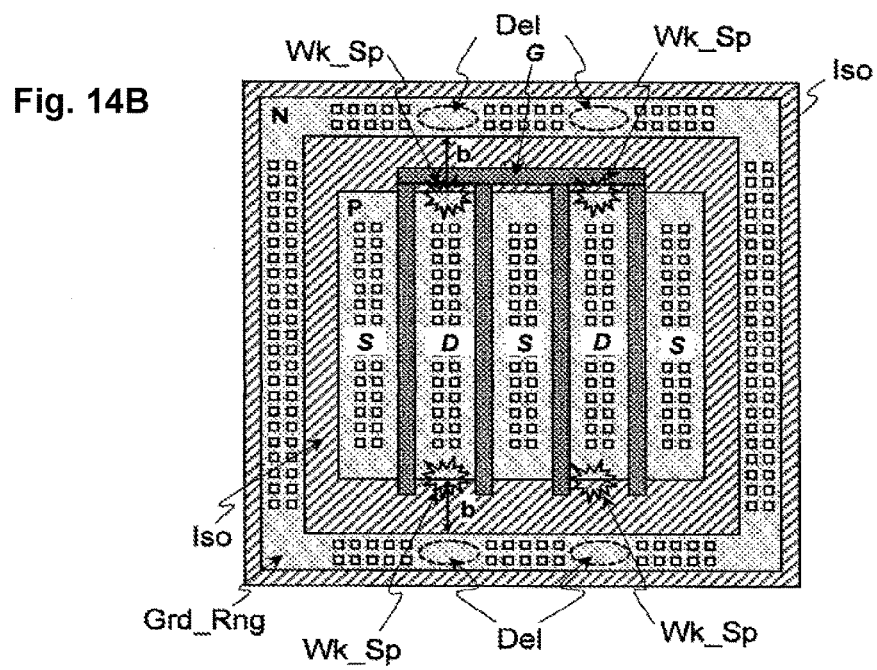
Figure 14C:
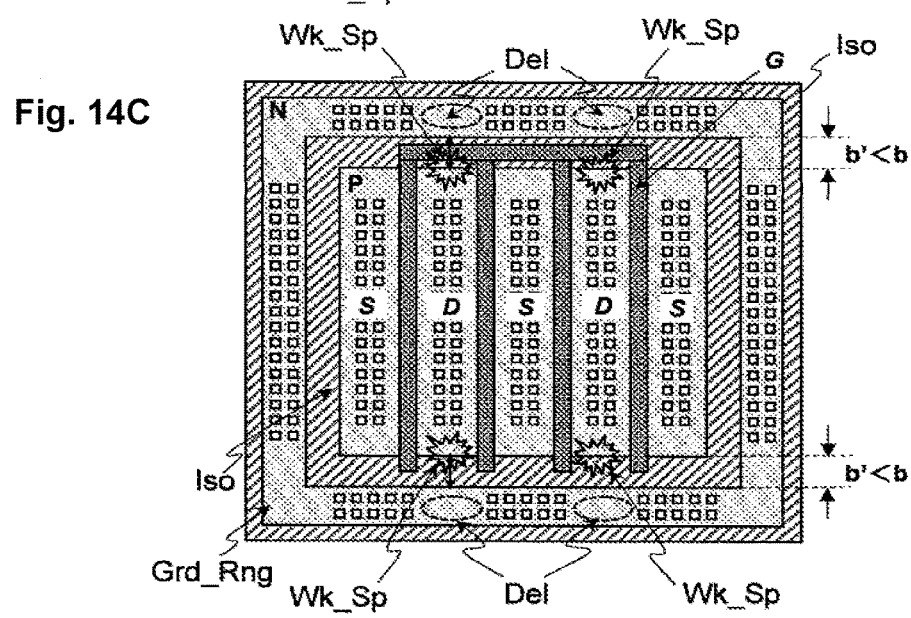

FIGS. 14A to 14C are diagrams illustrating a semiconductor device of the P-channel MOS transistor Mp2 constituting the inter-power source clamp circuit 15 according to Embodiment 1 of the invention.

As shown in an equivalent circuit of FIG. 14A, the source S and drain D of the P-channel MOS transistor Mp2 constituting the inter-power source clamp circuit 15 are respectively connected to the high-voltage terminal $V_H$ of the power supply terminal 11 and the low-voltage terminal $V_L$ of the ground terminal 12, and the gate G of the P-channel MOS transistor Mp2 and the N-type well region N-Well are connected to the high-voltage terminal $V_H$ of the power supply terminal 11.

Like the planar structure of FIG. 12B, as shown in a planar structure of FIG. 14B, the gate G of the P-channel MOS transistor Mp2 constituting the inter-power source clamp circuit 15 is formed using a plurality of finger electrodes, and a P-type impurity region for forming the drain D and a P-type impurity region for forming the source S are formed on the left and right sides of each gate finger electrode. A hatched insulating isolation layer Iso is formed to have a ring-like planar shape in the periphery of a plurality of finger electrodes G, a plurality of drain P-type impurity regions D, and a plurality of source P-type impurity regions S. An N-type impurity region which functions as the guard ring Grd_Rng is formed to have a ring-like planar shape in the periphery of the ring-like planar shape of the insulating isolation layer Iso. An insulating isolation layer Iso is formed to have a ring-like planar shape in the periphery of the N-type impurity region which functions as the guard ring Grd_Rng.

Like the planar structure of FIG. 12B, as shown in a planar structure of FIG. 14B, a plurality of contacts arranged in the longitudinal direction are formed in the drain P-type impurity region D and the source P-type impurity region S formed in the longitudinal rectangular shape. A plurality of contacts arranged in the longitudinal direction are formed in the N-type impurity region of the right-side guard ring Grd_Rng and the N-type impurity region of the left-side guard ring Grd_Rng of the planar structure of FIG. 14B. A plurality of contacts arranged in the lateral direction are formed in the N-type impurity region of the upper-side guard ring Grd_Rng and the N-type impurity region of the lower-side guard ring Grd_Rng of the planar structure of FIG. 14B.

Like the planar structure of FIG. 12B, in the N-type impurity region of the upper-side guard ring Grd_Rng and the N-type impurity region of the lower-side guard ring Grd_Rng of the planar structure of FIG. 14B, a plurality of contacts in a portion facing the weak spot Wk_Sp on the short side of the P-type impurity region D formed in the longitudinal rectangular shape are omitted as indicated by a broken line Del. Accordingly, with the omission of a plurality of contacts indicated by the broken line Del, since series resistance in the portion of the weak spot Wk_Sp on the short side of the P-type impurity region D formed in the longitudinal rectangular shape increases, it becomes possible to reduce the risk of destruction of the weak spot Wk_Sp.

A planar structure of FIG. 14C illustrates the planar structure of a semiconductor device of the P-channel MOS transistor Mp2 constituting the inter-power source clamp circuit 15 according to Embodiment 1 of the invention as well.

The planar structure of FIG. 14C is different from the planar structure shown in FIG. 14B in that the distance b' between the drain P-type impurity region in the portion of the weak spot Wk_Sp on the short side of the drain P-type impurity region D formed in the longitudinal rectangular shape and the N-type impurity region of the guard ring Grd_Rng is set to be smaller than the distance b in FIG. 14B.

As a result, according to the planar structure of FIG. 14C, it becomes possible to maintain the same ESD endurance as the planar structure of FIG. 11B, and to reduce the device area of the N-channel MOS transistor Mn2 of the inter-power source clamp circuit 15 compared to the planar structure of FIG. 11B.

Figure 15A:
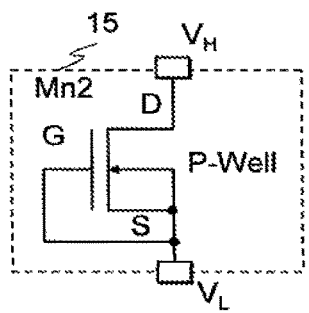
FIGS. 15A to 15C are diagrams illustrating a semiconductor device of an N-channel MOS transistor Mn2 constituting an inter-power source clamp circuit 15 which has been studied by the inventors prior to the invention as a comparative reference example of the invention and a semiconductor device of an N-channel MOS transistor Mn2 constituting an inter-power source clamp circuit 15 according to Embodiment 1 of the invention.
Figure 15B:
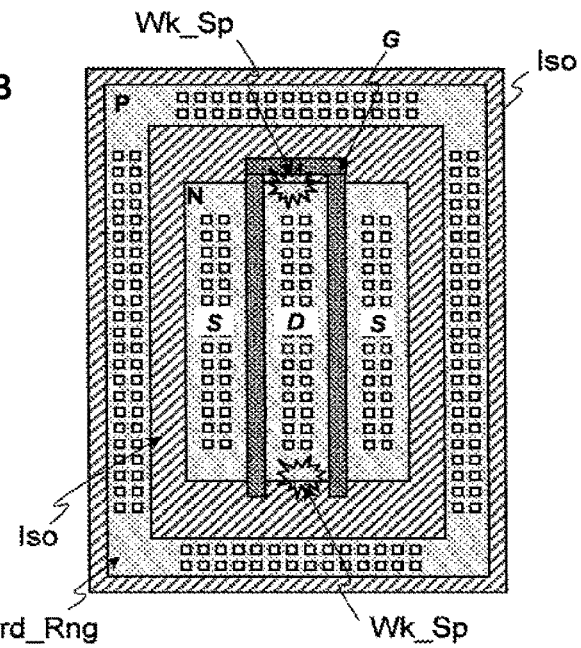
Figure 15C:
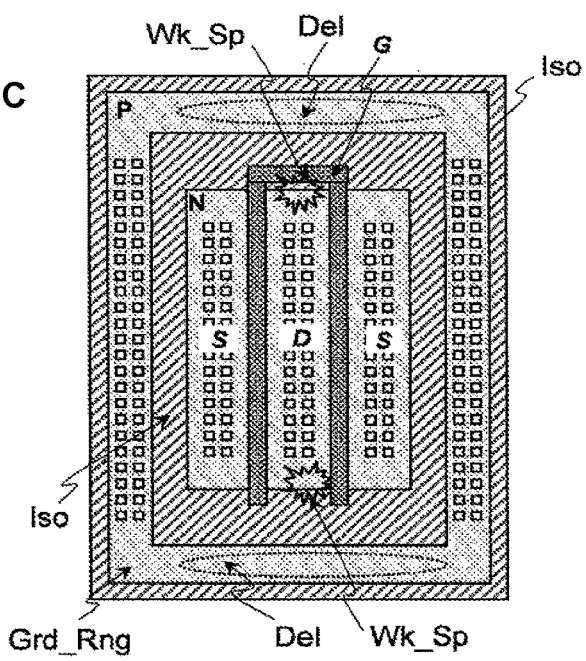

FIGS. 15A to 15C are diagrams illustrating a semiconductor device of an N-channel MOS transistor Mn2 constituting an inter-power source clamp circuit 15 which has been studied by the inventors prior to the invention as a comparative reference example of the invention and a semiconductor device of an N-channel MOS transistor Mn2 constituting an inter-power source clamp circuit 15 according to Embodiment 1 of the invention.

Like the equivalent circuit of FIG. 12A, as shown in an equivalent circuit of FIG. 15A, the drain D and source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12, and the gate G of the N-channel MOS transistor Mn2 and the P-type well region P-Well are connected to the low-voltage terminal $V_L$ of the ground terminal 12.

A planar structure of FIG. 15B illustrates a semiconductor device of the N-channel MOS transistor Mn2 constituting the inter-power source clamp circuit 15 which has been studied by the inventors prior to the invention as a comparative reference example of the invention.

When comparing with the planar structure of FIG. 11B, although in the planar structure of FIG. 15B, the number of finger electrodes which form the gate G of the N-channel MOS transistor Mn2 constituting the inter-power source clamp circuit 15 decreases from 4 to 2, the basic structure of the semiconductor device is the same.

In the planar structure of FIG. 15B, like the planar structure of FIG. 11B, in the portion of the weak spot Wk_Sp on the short side of the drain N-type impurity region D formed in the longitudinal rectangular shape, the distance between the drain N-type impurity region and the P-type impurity region of the guard ring Grd_Rng is small, series resistance becomes small, such that the current density of the initial surge discharge current becomes higher, causing destruction.

A planar structure of FIG. 15C illustrates a semiconductor device of the N-channel MOS transistor Mn2 constituting the inter-power source clamp circuit 15 according to Embodiment 1 of the invention.

In the P-type impurity region of the upper-side guard ring Grd_Rng and the P-type impurity region of the lower-side guard ring Grd_Rng of the planar structure of FIG. 15C, a plurality of contacts in a portion facing the weak spot Wk_Sp on the short side of the N-type impurity region D formed in the longitudinal rectangular shape are omitted as indicated by a broken line Del. Accordingly, with the omission of a plurality of contacts indicated by the broken line Del, since series resistance in the portion of the weak spot Wk_Sp on the short side of the N-type impurity region D formed in the longitudinal rectangular shape increases, it becomes possible to reduce the risk of destruction of the weak spot Wk_Sp. Therefore, it becomes possible to reduce the width of the guard ring Grd_Rng on the side on which contacts are omitted, or the space between the guard ring Grd_Rng and the opposing N-type impurity region formed in the longitudinal rectangular shape taking into consideration the ESD withstand characteristic balance.

In the P-type impurity region of the upper-side guard ring Grd_Rng and the P-type impurity region of the lower-side guard ring Grd_Rng of the planar structure of FIG. 15C, a plurality of contacts in a portion facing the N-type impurity region S which is formed in the longitudinal rectangular shape functioning as the source S are omitted as indicated by a broken line Del. This is done because a decrease in the number of finger electrodes from 4 to 2 causes a decrease in the cell width of the N-channel MOS transistor Mn2 and a decrease in ESD endurance, and consequently causes an increase in series resistance of the portion of the weak spot Wk_Sp.

Figure 16A:
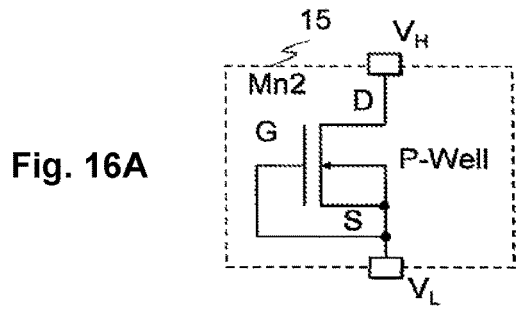
FIGS. 16A to 16C are diagrams illustrating a semiconductor device of an N-channel MOS transistor Mn2 constituting an inter-power source clamp circuit 15 which has been studied by the inventors prior to the invention as a comparative reference example of the invention and a semiconductor device of an N-channel MOS transistor Mn2 constituting an inter-power source clamp circuit 15 according to Embodiment 1 of the invention.
Figure 16B:
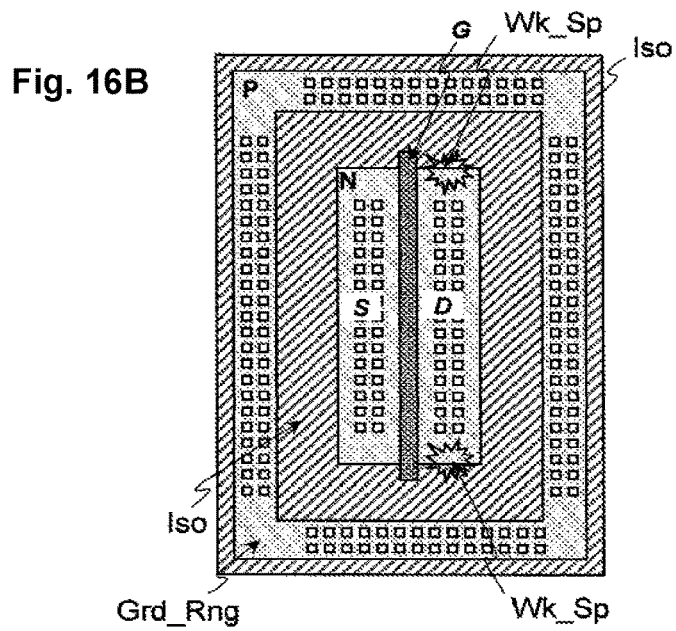
Figure 16C:
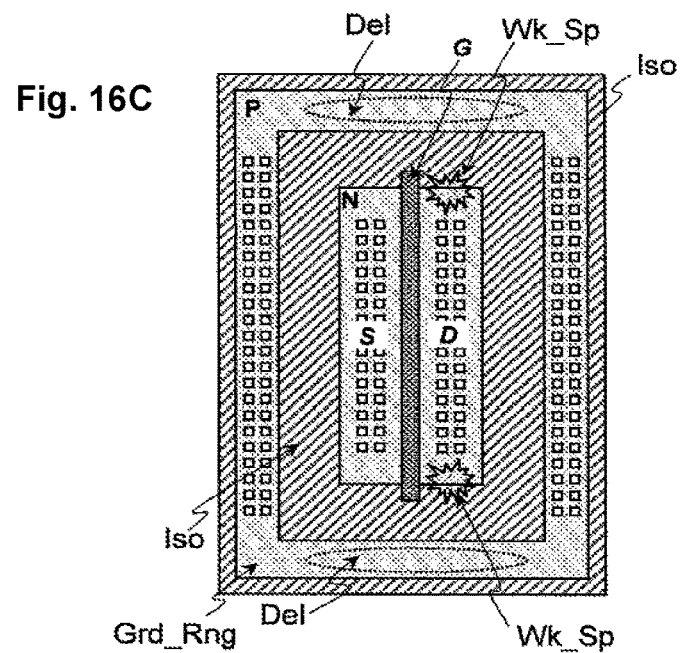

FIGS. 16A to 16C are diagrams illustrating a semiconductor device of an N-channel MOS transistor Mn2 constituting an inter-power source clamp circuit 15 which has been studied by the inventors prior to the invention as a comparative reference example of the invention and a semiconductor device of an N-channel MOS transistor Mn2 constituting an inter-power source clamp circuit 15 according to Embodiment 1 of the invention.

Like the equivalent circuit of FIG. 12A, as shown in an equivalent circuit of FIG. 16A, the drain D and source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12, and the gate G of the N-channel MOS transistor Mn2 and the P-type well region P-Well are connected to the low-voltage terminal $V_L$ of the ground terminal 12.

A planar structure of FIG. 16B illustrates a semiconductor device of the N-channel MOS transistor Mn2 constituting the inter-power source clamp circuit 15 which has been studied by the inventors prior to the invention as a comparative reference example of the invention.

When comparing the planar structure of FIG. 15B, although in the planar structure of FIG. 16B, the number of finger electrodes which form the gate G of the N-channel MOS transistor Mn2 constituting the inter-power source clamp circuit 15 decreases from 2 to 1, the basic structure of the semiconductor device is the same.

In the planar structure of FIG. 16B, like the planar structure of FIG. 15B, in the portion of the weak spot Wk_Sp on the short side of the drain N-type impurity region D formed in the longitudinal rectangular shape, the distance between the drain N-type impurity region and the P-type impurity region of the guard ring Grd_Rng is small, series resistance becomes small, such that the current density of the initial surge discharge current becomes higher, causing destruction.

A planar structure of FIG. 16C illustrates a semiconductor device of the N-channel MOS transistor Mn2 constituting the inter-power source clamp circuit 15 according to Embodiment 1 of the invention.

In the P-type impurity region of the upper-side guard ring Grd_Rng and the P-type impurity region of the lower-side guard ring Grd_Rng of the planar structure of FIG. 16C, a plurality of contacts in a portion facing the weak spot Wk_Sp on the short side of the N-type impurity region D formed in the longitudinal rectangular shape are omitted as indicated by a broken line Del. With the omission of a plurality of contacts indicated by the broken line Del, since series resistance in the portion of the weak spot Wk_Sp on the short side of the N-type impurity region D formed in the longitudinal rectangular shape increases, it becomes possible to reduce the risk of destruction of the weak spot Wk_Sp. Therefore, it becomes possible to reduce the width of the guard ring Grd_Rng on the side on which contacts are omitted, or the space between the guard ring Grd_Rng and the opposing N-type impurity region formed in the longitudinal rectangular shape taking into consideration the ESD withstand characteristic balance.

In the P-type impurity region of the upper-side guard ring Grd_Rng and the P-type impurity region of the lower-side guard ring Grd_Rng of the planar structure of FIG. 16C, a plurality of contacts in a portion which faces the N-type impurity region S functioning as the source S formed in the longitudinal rectangular shape are omitted as indicated by a broken line Del. This is done because a decrease in the number of finger electrodes from 2 to 1 causes a decrease in the cell width of the N-channel MOS transistor Mn2 and a decrease in ESD endurance, and consequently causes an increase in series resistance of the portion of the weak spot Wk_Sp.

FIGS. 17A to 17D are diagrams illustrating a semiconductor device of an N-channel MOS transistor Mn2 constituting an inter-power source clamp circuit 15 according to Embodiment 1 of the invention.

Figure 17A:
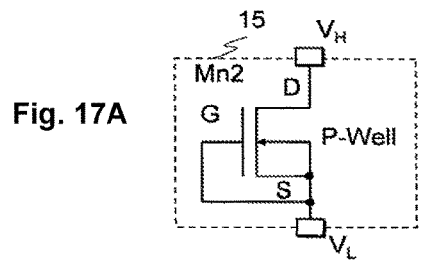
FIGS. 17A to 17D are diagrams illustrating a semiconductor device of an N-channel MOS transistor Mn2 constituting an inter-power source clamp circuit 15 according to Embodiment 1 of the invention.

Like the equivalent circuit of FIG. 16A, as shown in an equivalent circuit of FIG. 17A, the drain D and source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12, and the gate G of the N-channel MOS transistor Mn2 and the P-type well region P-Well are connected to the low-voltage terminal $V_L$ of the ground terminal 12.

Figure 17B:
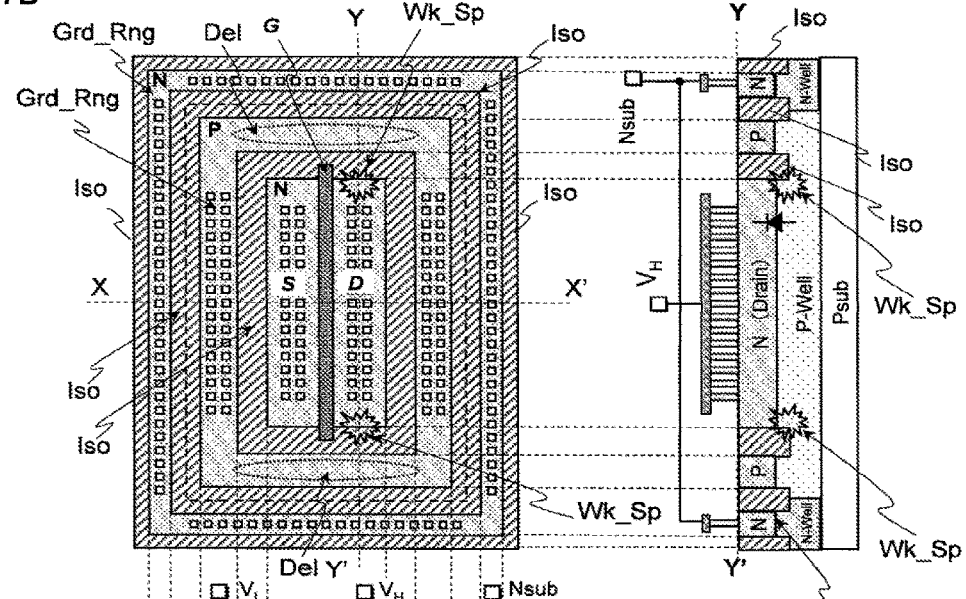
Figure 17D:
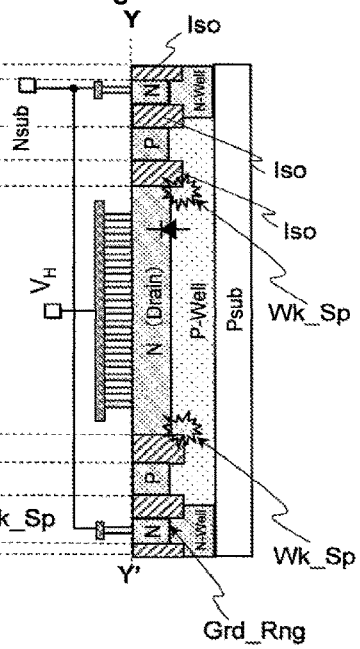
Figure 17C:
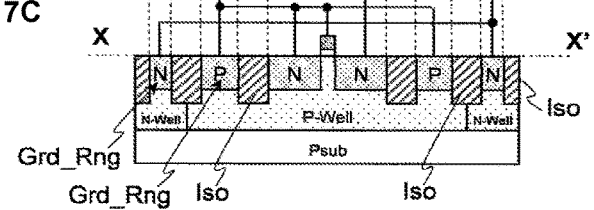
Figure 18A:
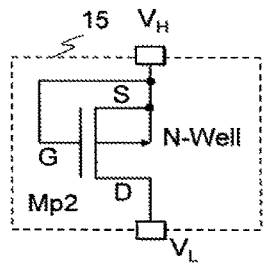
FIGS. 18A to 18D are diagrams illustrating a semiconductor device of a P-channel MOS transistor Mpg constituting an inter-power source clamp circuit 15 according to Embodiment 1 of the invention.
Figure 18B:
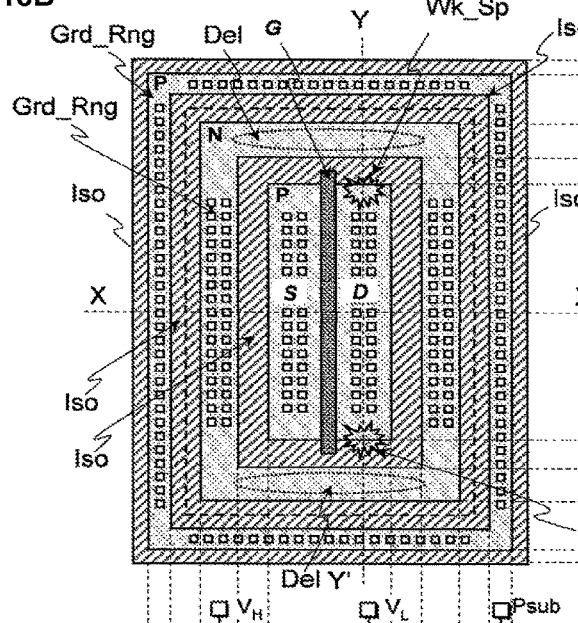
Figure 18C:
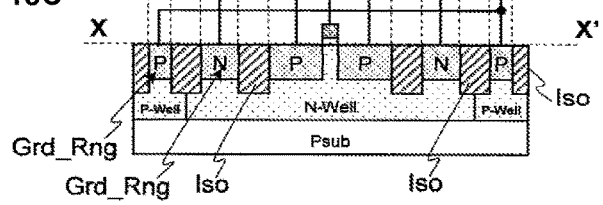
Figure 18D:
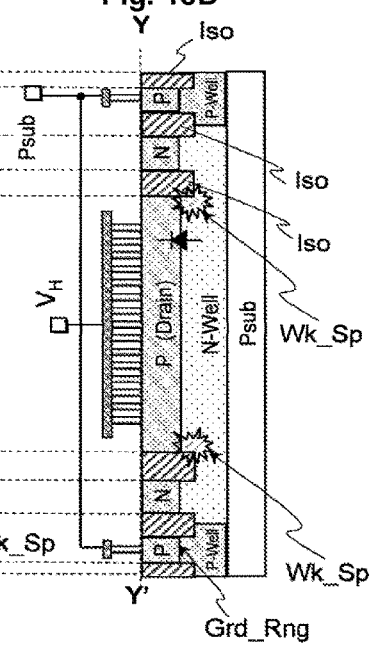

When comparing with the planar structure of FIG. 16B, as shown in a planar structure of FIG. 17B and a sectional structure of FIG. 17C, a hatched internal insulating isolation layer Iso is formed to have a ring-like planar shape in the periphery of the P-type impurity region of the internal guard ring Grd_Rng, and the N-type impurity region of the external guard ring Grd_Rng is formed to have a ring-like planar shape in the periphery of the internal insulating isolation layer Iso. As shown in the planar structure of FIG. 17B and the sectional structure of FIG. 17C, the N-type impurity region of the external guard ring Grd_Rng and the N-type well region N-Well are connected to a voltage supply electrode Nsub to which an appropriate high voltage can be supplied.

According to the semiconductor device of the N-channel MOS transistor Mn2 of the inter-power source clamp circuit 15 according to Embodiment 1 of the invention shown in FIGS. 17A to 17D, with the power feed of the low-voltage terminal $V_L$ of the ground terminal 12 to the P-type impurity region of the internal guard ring Grd_Rng and the internal P-type well region P-Well and the power feed of an appropriate high voltage to the N-type impurity region of the external guard ring Grd_Rng and the external N-type well region N-Well, it becomes possible to reduce the risk of latchup destruction of the N-channel MOS transistor Mn2 of the inter-power source clamp circuit 15 formed inside the ring due to noise from the outside of the ring. That is, in the planar structure shown in FIG. 16C and the planar structure shown in FIG. 17B, in the P-type impurity region of the upper-side guard ring Grd_Rng and the P-type impurity region of the lower-side guard ring Grd_Rng, since a plurality of contacts are completely omitted as indicated by a broken line Del, there is a risk of transmission of noise in the omitted portion. Meanwhile, with the dual guard ring structure according to Embodiment 1 of the invention shown in FIGS. 17A to 17D, this problem can be eliminated.

With the dual guard ring structure for improving latchup tolerance, noise tolerance, or the like in the P-channel MOS transistor Mp2, as shown in FIGS. 18A to 18D, a hatched internal insulating isolation layer Iso is formed to have a ring-like planar shape in the periphery of the N-type impurity region of an internal guard ring Grd_Rng, and the P-type impurity region of an external guard ring Grd_Rng is formed to have a ring-like planar shape in the periphery of the internal insulating isolation layer Iso. As shown in a planar structure of FIG. 18B and a sectional structure of FIG. 18C, the P-type impurity region of the external guard ring Grd_Rng and the P-type well region P-Well are connected to a voltage supply electrode Psub to which an appropriate high voltage can be supplied.

FIGS. 19A to 19D are diagrams illustrating a semiconductor device of an N-channel MOS transistor Mn2 constituting an inter-power source clamp circuit 15 which has been studied by the inventors prior to the invention as a comparative reference example of the invention.

Like the equivalent circuit of FIG. 11A, as shown in an equivalent circuit of FIG. 19A, the drain D and source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12, and the gate G of the N-channel MOS transistor Mn2 and P-type well region P-Well are connected to the low-voltage terminal $V_L$ of the ground terminal 12.

A difference between the N-channel MOS transistor Mn2 as a comparative reference example of the invention shown in FIGS. 19A to 19D and the N-channel MOS transistor Mn2 shown in FIGS. 11A to 11D which has been studied by the inventors prior to the invention is as described below.

That is, as shown in the planar structure of FIG. 19B, the sectional structure of FIG. 19C, and the sectional structure of FIG. 19D, cobalt silicide CoSi is formed on the surface of a plurality of drain N-type impurity regions D, the surface of a plurality of source N-type impurity regions S, and the surface of the P-type impurity region which functions as the guard ring Grd_Rng. With the miniaturization of the semiconductor manufacturing process of the semiconductor integrated circuit, in order to eliminate a problem in that the device size of the MOS transistor is reduced, the source region, the drain region, or parasitic resistance of the gate electrode increases, and the operating speed of the MOS transistor becomes slow, cobalt silicide CoSi which is a low-resistance alloy of cobalt Co which is high-melting-point metal and silicon Si is used.

As will be understood from the planar structure of FIG. 19B, the sectional structure of FIG. 19C, and the sectional structure of FIG. 19D, cobalt silicide CoSi is formed only on the surface of the central portion of the N-type impurity region S as the source S formed in the longitudinal rectangular shape and the surface of the central portion of the N-type impurity region D as the drain D formed in the longitudinal rectangular shape. Accordingly, cobalt silicide CoSi is not formed on the surface of a peripheral portion of the N-type impurity region S and the surface of a peripheral portion of the N-type impurity region D in contact with a peripheral insulating isolation layer Iso. A portion where cobalt silicide CoSi is not formed is the silicide block which has been described in U.S. Publication No. 2005/0045952A1. That is, silicide is not formed in the silicide block, such that parasitic resistance partially increases and ESD endurance increases.

Although the N-channel MOS transistor Mn2 of a comparative reference example of the invention shown in FIGS. 19A to 19D uses the silicide block, exactly like the planar structure of FIG. 11B and the sectional structure of FIG. 11D, it has been obvious that the current density of the initial surge discharge current in the PN junction of the portion of the weak spot Wk_Sp shown in the planar structure of FIG. 19B and the sectional structure of FIG. 19D becomes higher than the PN junctions of other portions, and there is a high risk of destruction of the portion of the weak spot Wk_Sp.

In the planar structure shown in FIG. 19B, the weak spot Wk_Sp is also present in a portion of the short side of the N-type impurity region D as the drain formed in the longitudinal rectangular shape.

FIGS. 20A to 20D are diagrams illustrating a semiconductor device of an N-channel MOS transistor Mn2 constituting an inter-power source clamp circuit 15 according to Embodiment 1 of the invention.

Like the equivalent circuit of FIG. 19A, as shown in an equivalent circuit of FIG. 20A, the drain D and source S of the N-channel MOS transistor Mn2 constituting the inter-power source clamp circuit 15 are respectively connected to the high-voltage terminal $V_H$ of the power supply terminal 11 and the low-voltage terminal $V_L$ of the ground terminal 12, and the gate G of the N-channel MOS transistor Mn2 and the P-type well region P-Well are connected to the low-voltage terminal $V_L$ of the ground terminal 12.

A difference between the N-channel MOS transistor Mn2 constituting the inter-power source clamp circuit 15 according to Embodiment 1 of the invention shown FIGS. 20A to 20D and the N-channel MOS transistor Mn2 shown in FIGS. 19A to 19D which has been studied by the inventors prior to the invention is as described below.

First, in a planar structure of FIG. 20B, the weak spot Wk_Sp is present in a portion of the short side of the N-type impurity region D as the drain formed in the longitudinal rectangular shape. In the portion of the short side, cobalt silicide CoSi is also formed on the surface of a peripheral portion of the N-type impurity region D as the drain in contact with the peripheral insulating isolation layer Iso. Accordingly, since no silicide block having high series resistance is formed in the portion of the short side, and ESD endurance in the portion of the short side is lowered. In the portion on the short side, even when the width of the silicide block is set to be very small, ESD endurance is significantly lowered.

As will be understood from the planar structure shown in FIG. 20B, in the P-type impurity region of the upper-side guard ring Grd_Rng and the P-type impurity region of the lower-side guard ring Grd_Rng, a plurality of contacts in a portion facing the weak spot Wk_Sp on the short side of the N-type impurity region D formed in the longitudinal rectangular shape are completely omitted as indicated by a broken line Del. Accordingly, with the complete omission of a plurality of contacts in the upper-side guard ring Grd_Rng and the lower-side guard ring Grd_Rng indicated by the broken line Del, series resistance in the portion of the weak spot Wk_Sp on the short side of the N-type impurity region D formed in the longitudinal rectangular shape increases, making it possible to reduce the risk of destruction of the weak spot Wk_Sp. Therefore, it becomes possible to reduce the width of the guard ring Grd_Rng on the side on which contacts are omitted, or the space between the guard ring Grd_Rng and the opposing N-type impurity region formed in the longitudinal rectangular shape taking into consideration the ESD withstand characteristic balance.

Embodiment 2

<<Semiconductor Device of Power Protection Circuit>>

FIGS. 21A to 21D are diagrams illustrating a semiconductor device of a third diode D3 constituting a power protection circuit 16 which has been studied by the inventors prior to the invention as a comparative reference example of the invention. With the studies of the inventors prior to the invention, it has been obvious that the current density of the surge discharge current of the PN junction in the portion of the weak spot Wk_Sp shown in the planar structure of FIG. 21B and the sectional structure of FIG. 21D becomes higher than the PN junctions of other portions, and there is a high risk of destruction of the portion of the weak spot Wk_Sp.

FIGS. 23A to 23C are diagrams illustrating a semiconductor device of a third diode D3 constituting a power protection circuit 16 according to Embodiment 2 of the invention.

Like the equivalent circuit of FIG. 21A, in an equivalent circuit of FIG. 23A, the cathode and anode of the third diode D3 constituting the power protection circuit 16 are respectively connected to the high-voltage terminal $V_H$ of the power supply terminal 11 and the low-voltage terminal $V_L$ of the ground terminal 12.

A difference between the third diode D3 constituting the power protection circuit 16 according to Embodiment 2 of the invention shown in FIGS. 23A to 23C and the third diode D3 constituting the power protection circuit 16 shown in FIGS. 21A to 21D which has been studied by the inventors prior to the invention is as described below.

That is, as will be understood from the planar structure of FIG. 23B, in the P-type impurity region of the upper-side guard ring Grd_Rng and the P-type impurity region of the lower-side guard ring Grd_Rng, a plurality of contacts in a portion facing the weak spot Wk_Sp on the short side of the N-type impurity region for forming the cathode K formed in the longitudinal rectangular shape are omitted as indicated by a broken line Del. Accordingly, with the omission of a plurality of contacts indicated by the broken line Del, since series resistance in the portion of the weak spot Wk_Sp on the short side of the N-type impurity region of the cathode K formed in the longitudinal rectangular shape increases, it becomes possible to reduce the risk of destruction of the weak spot Wk_Sp.

A planar structure of FIG. 23C illustrates the planar structure of a semiconductor device of the third diode D3 constituting the power protection circuit 16 according to Embodiment 2 of the invention as well.

The planar structure of FIG. 23C is different from the planar structure shown in FIG. 23B in that the distance b' between the N-type impurity region of the cathode K in the portion of the weak spot Wk_Sp on the short side of the N-type impurity region of the cathode K formed in the longitudinal rectangular shape and the P-type impurity region of the guard ring Grd_Rng is set to be smaller than the distance b in FIG. 23B.

As a result, according to the planar structure of FIG. 23C, it becomes possible to maintain the same ESD endurance as the planar structure of FIG. 21B, and to reduce the device area of the third diode D3 constituting the power protection circuit 16 compared to the planar structure of FIG. 21B.

FIGS. 25A to 25D are diagrams illustrating a semiconductor device of a third diode D3 constituting a power protection circuit 16 which has been studied by the inventors prior to the invention as a comparative reference example of the invention.

Figure 25A:
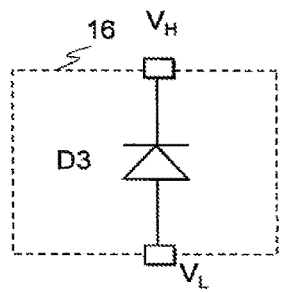
FIGS. 25A to 25D are diagrams illustrating a semiconductor device of a third diode D3 constituting a power protection circuit 16 which has been studied by the inventors prior to the invention as a comparative reference example of the invention.

Like the equivalent circuit of FIG. 23A, in an equivalent circuit of FIG. 25A, the cathode and anode of the third diode D3 constituting the power protection circuit 16 are respectively connected to the high-voltage terminal $V_H$ of the power supply terminal 11 and the low-voltage terminal $V_L$ of the ground terminal 12.

Figure 25B:
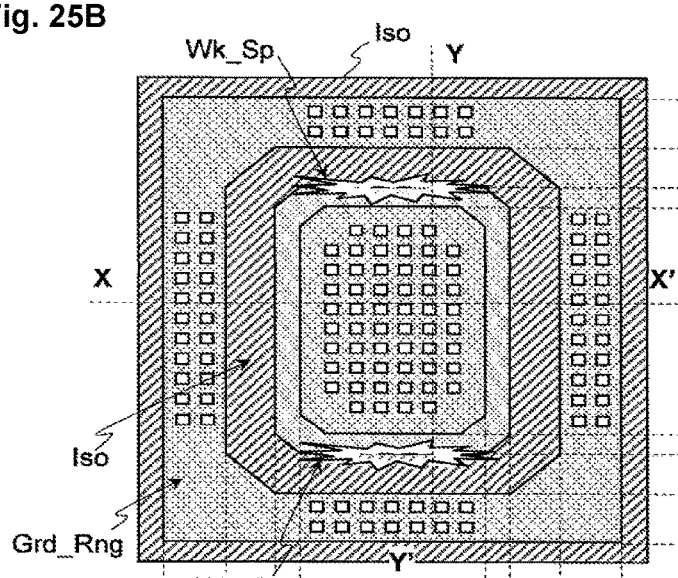
Figure 25D:
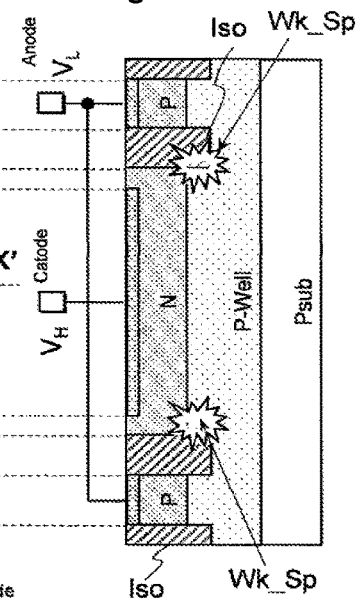
Figure 25C:
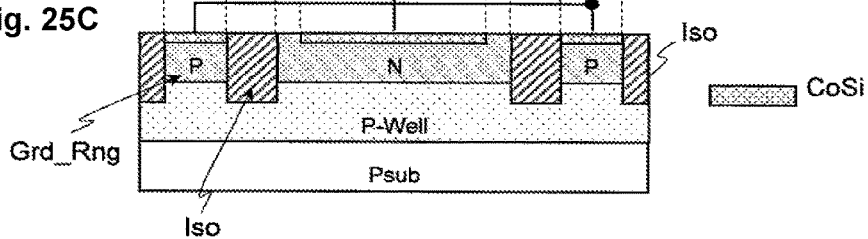

FIG. 25B shows the planar structure of third diode D3, FIG. 25C shows a sectional structure taken along the line X-X' of the planar structure of FIG. 25B, and FIG. 25D shows a sectional structure taken along the line Y-Y' of the planar structure of FIG. 25B. As shown in the sectional structures of FIGS. 25C and 25D, an N-type impurity region which becomes the cathode of the third diode D3 is formed in a P-type well region P-Well formed on a P-type substrate Psub. A hatched insulating isolation layer Iso is formed to have a ring-like planar shape in the periphery of the N-type impurity region which becomes the cathode of the third diode D3. A P-type impurity region which becomes the anode of the third diode D3 is formed to have a ring-like planar shape in the periphery of the ring-like planar shape. A hatched insulating isolation layer Iso is formed to have a ring-like planar shape in the periphery of the P-type impurity region which becomes the anode of the third diode D3 in the ring-like planar shape.

As shown in the planar structure of FIG. 25B, the sectional structure of FIG. 25C, and the sectional structure of FIG. 25D, cobalt silicide CoSi is formed on the surface of the N-type impurity region which becomes the cathode of the third diode D3 at the center of the ring, the guard ring Grd_Rng, and the surface of the P-type impurity region which functions as the anode of the third diode D3.

As will be understood from the planar structure of FIG. 25B, the sectional structure of FIG. 25C, and the sectional structure of FIG. 25D, cobalt silicide CoSi is formed only on the central portion of the N-type impurity region which becomes the cathode of the third diode D3 at the center of the ring. No cobalt silicide CoSi is formed on the surface of a peripheral portion of the N-type impurity region in contact with the peripheral insulating isolation layer Iso. That is, with the use of the silicide block, parasitic resistance partially increases and ESD endurance increases.

Although the third diode D3 of the power protection circuit 16 of a comparative reference example of the invention shown in FIG. 25 uses the silicide block, it has been obvious that the current density of the initial surge discharge current of the PN junction in the portion of the weak spot Wk_Sp shown in the planar structure of FIG. 25B and the sectional structure of FIG. 25D becomes higher than the PN junctions of other portions, and there is a high risk of destruction of the portion of the weak spot Wk_Sp. The weak spot Wk_Sp shown in the planar structure of FIG. 25B is present on the short side of the N-type impurity region which becomes the cathode of the third diode D3 formed in the longitudinal rectangular shape.

As shown in the planar structure of FIG. 25B, since a strong electric field is generated in the four corner portions of the N-type impurity region which becomes the cathode of the third diode D3 formed in the longitudinal rectangular shape, a backward current which is larger than the backward current of the parallel opposing portion flows in the four corner portions. When it is assumed that half of the large backward current flowing in the corner portions and the other half of the large backward current respectively flow in the short side portion and the long side portion, an increase in the current of the short side portion becomes larger than an increase in the current of the long side portion. As a result, the short side portion of the N-type impurity region which becomes the cathode of the third diode D3 formed in the longitudinal rectangular shape becomes the weak spot Wk_Sp, and the current density of the surge discharge current becomes higher, causing destruction.

FIGS. 27A to 27D are diagrams illustrating a semiconductor device of a third diode D3 constituting a power protection circuit 16 according to Embodiment 2 of the invention.

Like the equivalent circuit of FIG. 25A, in an equivalent circuit of FIG. 27A, the cathode and anode of the third diode D3 constituting the power protection circuit 16 are respectively connected to the high-voltage terminal $V_H$ of the power supply terminal 11 and the low-voltage terminal $V_L$ of the ground terminal 12.

A difference between the third diode D3 constituting the power protection circuit 16 according to Embodiment 2 of the invention shown in FIGS. 27A to 27D and the third diode D3 constituting the power protection circuit 16 shown in FIGS. 25A to 25D which has been studied by the inventors prior to the invention is as described below.

That is, as will be understood from the planar structure of FIG. 27B, while cobalt silicide CoSi is formed on the surface of the upper short side of the N-type impurity region which becomes the cathode of the third diode D3 near the P-type impurity region of the upper-side guard ring Grd_Rng, cobalt silicide CoSi is not formed on the surface of the lower short side of the N-type impurity region which becomes the cathode of the third diode D3 near the P-type impurity region of the lower-side guard ring Grd_Rng. As a result, the upper short side of the N-type impurity region which becomes the cathode of the third diode D3 near the P-type impurity region of the upper-side guard ring Grd_Rng becomes the weak spot Wk_Sp. Accordingly, in the P-type impurity region of the upper-side guard ring Grd_Rng, a plurality of contacts in a portion which faces the upper short side of the N-type impurity region as the cathode of the third diode D3 are completely omitted as indicated by a broken line Del. With the complete omission of a plurality of contacts in the upper-side guard ring Grd_Rng indicated by the broken line Del, series resistance in the portion of the weak spot Wk_Sp on the upper short side of the N-type impurity region formed in the longitudinal rectangular shape increases, making it possible to reduce the risk of destruction of the weak spot Wk_Sp.

In this case, with an increase in the size of the cobalt silicide region CoSi and the number of contacts, it is possible to improve current capability.

Instead of changing the size of the cobalt silicide region CoSi shown in FIGS. 25A to 25D, like FIGS. 27A to 27D, the cobalt silicide region CoSi approaches the upper short side of the N-type impurity region which becomes the cathode of the third diode D3 near the P-type impurity region of the upper-side guard ring Grd_Rng, and a plurality of contacts are completely omitted as indicated by the broken line Del, making it possible to reduce the device size without lowering destruction withstand of the weak spot Wk_Sp.

Note that it becomes possible to reduce the width of the guard ring Grd_Rng on the side on which contacts are omitted, or the space between the guard ring Grd_Rng and the opposing N-type impurity region on the cathode side taking into consideration the ESD withstand characteristic balance.

FIGS. 29A to 29D are diagrams illustrating a semiconductor device of a third diode D3 constituting a power protection circuit 16 according to Embodiment 2 of the invention.

Figure 29A:
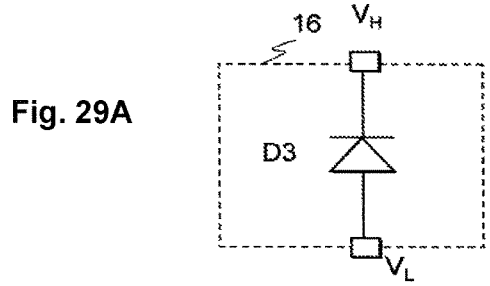
FIGS. 29A to 29D are diagrams illustrating a semiconductor device of a third diode D3 constituting a power protection circuit 16 according to Embodiment 2 of the invention.

Like the equivalent circuit of FIG. 27A, in an equivalent circuit of FIG. 29A, the cathode and anode of the third diode D3 constituting the power protection circuit 16 are respectively connected to the high-voltage terminal $V_H$ of the power supply terminal 11 and the low-voltage terminal $V_L$ of the ground terminal 12.

A difference between the third diode D3 constituting the power protection circuit 16 according to Embodiment 2 of the invention shown in FIGS. 29A to 29D and the third diode D3 constituting the power protection circuit 16 shown in FIGS. 25A to 25D which has been studied by the inventors prior to the invention is as described below.

Figure 29B:
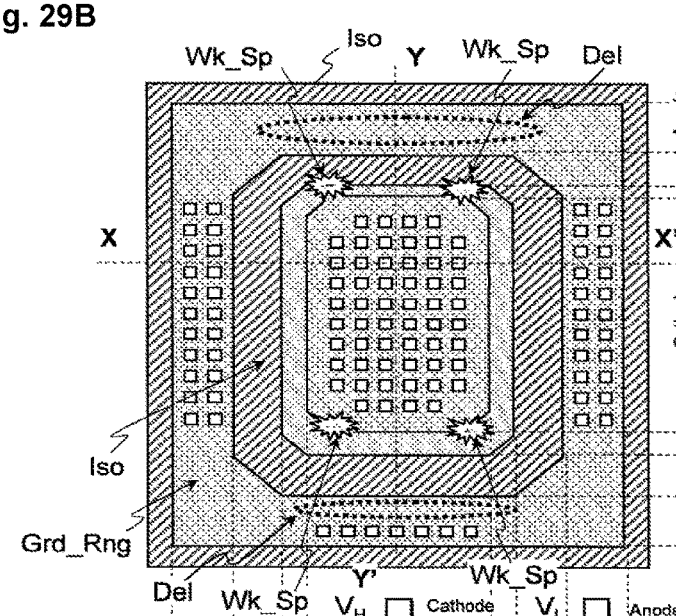
Figure 29D:
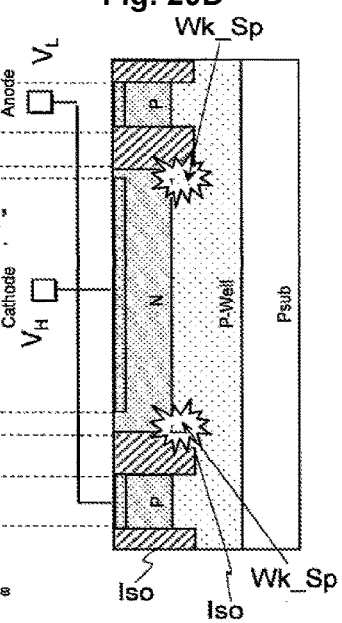
Figure 29C:
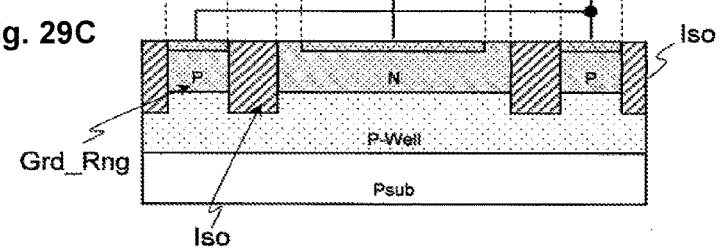

That is, as will be understood from a planar structure of FIG. 29B, a silicide block having the smallest width and minimum series resistance is used in the upper short side of the N-type impurity region which becomes the cathode of the third diode D3 near the P-type impurity region of the upper-side guard ring Grd_Rng. A silicide block having the second smallest width and the second lowest series resistance is used in the lower short side of the N-type impurity region which becomes the cathode of the third diode D3 near the P-type impurity region of the lower-side guard ring Grd_Rng. Accordingly, the upper short side of the N-type impurity region near the P-type impurity region of the upper-side guard ring Grd_Rng becomes the weakest weak spot Wk_Sp, and the lower short side of the N-type impurity region near the P-type impurity region of the lower-side guard ring Grd_Rng becomes the second weakest weak spot Wk_Sp. Therefore, a plurality of contacts in a portion facing the weakest weak spot Wk_Sp are completely omitted as indicated by a broken line Del in the P-type impurity region of the upper-side guard ring Grd_Rng, and a plurality of contacts in a portion facing the second weakest weak spot Wk_Sp are omitted by one row as indicated by a broken line Del in the P-type impurity region of the lower-side guard ring Grd_Rng. Since series resistance increases in proportion to the degree of omission, it becomes possible to reduce the risk of destruction of the weak spot Wk_Sp.

In this case, with an increase in the size of the cobalt silicide region CoSi and the number of contacts, it becomes possible to improve current capability.

Instead of changing the size of the cobalt silicide region CoSi in FIGS. 25A to 25D, the above-described shape shown in FIG. 29B is made, making it possible to reduce the device size without lowering destruction withstand of the weak spot Wk_Sp.

It becomes possible to reduce the width of the guard ring Grd_Rng on the side on which contacts are omitted, or the space between the guard ring Grd_Rng and the opposing N-type impurity region on the cathode side taking into consideration the ESD withstand characteristic balance.

FIGS. 31A to 31D are diagrams illustrating a semiconductor device of a third diode D3 constituting a power protection circuit 16 according to Embodiment 2 of the invention.

Figure 31A:
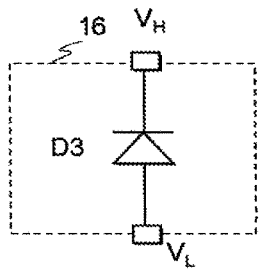
FIGS. 31A to 31D are diagrams illustrating a semiconductor device of a third diode D3 constituting a power protection circuit 16 according to Embodiment 2 of the invention.

Like the equivalent circuit of FIG. 29A, in the equivalent circuit of FIG. 31A, the cathode and anode of the third diode D3 constituting the power protection circuit 16 are respectively connected to the high-voltage terminal $V_H$ of the power supply terminal 11 and the low-voltage terminal $V_L$ of the ground terminal 12.

A difference between the third diode D3 constituting the power protection circuit 16 according to Embodiment 2 of the invention shown in FIGS. 31A to 31D and the third diode D3 constituting the power protection circuit 16 shown in FIGS. 25A to 25D which has been studied by the inventors prior to the invention is as described below.

Figure 31B:
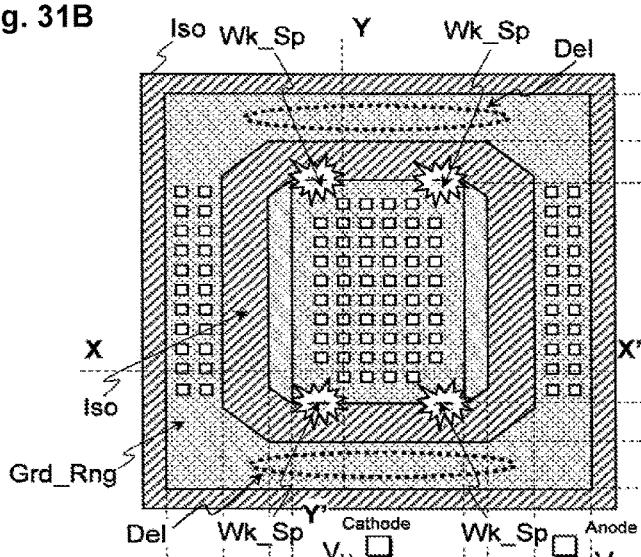
Figure 31D:
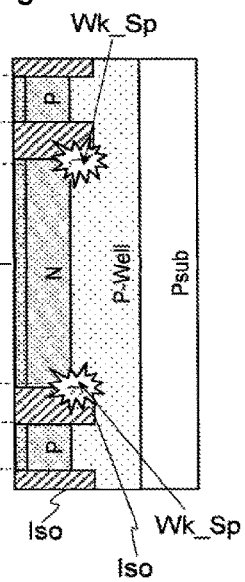
Figure 31C:
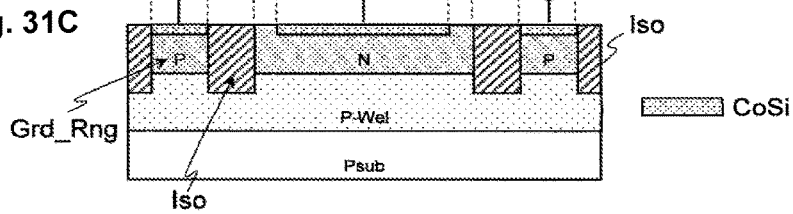
Figure 32A:
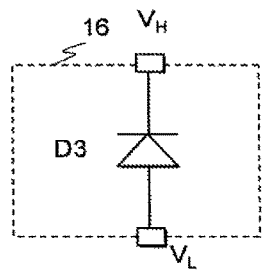
FIGS. 32A to 32D are diagrams illustrating a semiconductor device having a different structure of a third diode D3 constituting a power protection circuit 16 according to Embodiment 2 of the invention.
Figure 32B:
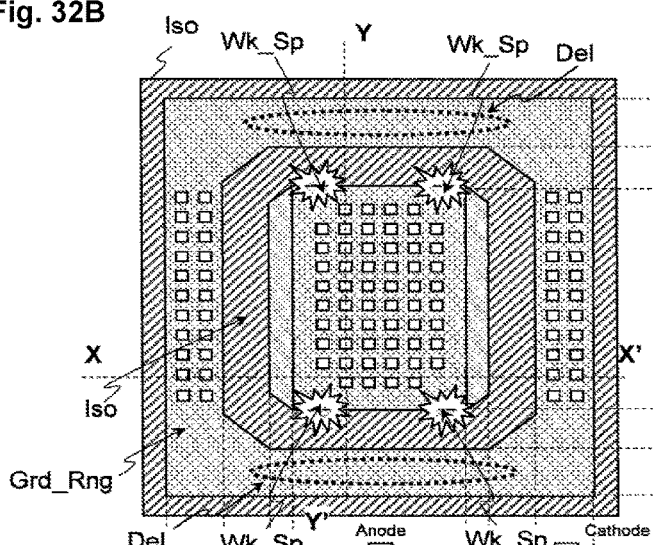
Figure 32D:
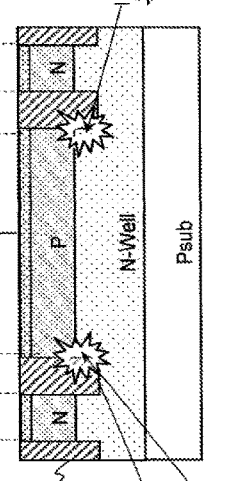
Figure 32C:
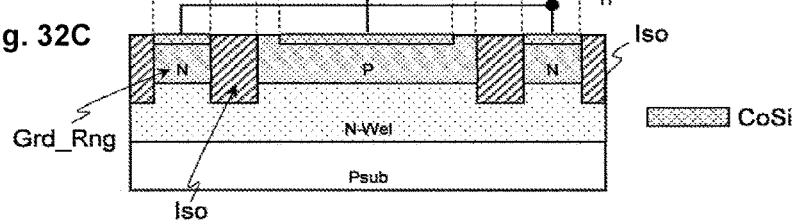

That is, as will be understood from the planar structure of FIG. 31B, a cobalt silicide CoSi is formed on the surface of the upper short side of the N-type impurity region which becomes the cathode of the third diode D3 near the P-type impurity region of the upper-side guard ring Grd_Rng, and a cobalt silicide CoSi is also formed on the surface of the lower short side of the N-type impurity region which becomes the cathode of the third diode D3 near the P-type impurity region of the lower-side guard ring Grd_Rng. As a result, two places of the upper short side of the N-type impurity region which becomes the cathode of the third diode D3 near the P-type impurity region of the upper-side guard ring Grd_Rng and the lower short side of the N-type impurity region which becomes the cathode of the third diode D3 near the P-type impurity region of the lower-side guard ring Grd_Rng become the weak spots Wk_Sp. Accordingly, in the P-type impurity region of the upper-side guard ring Grd_Rng, a plurality of contacts in a portion which faces the upper short side of the N-type impurity region as the cathode of the third diode D3 are completely omitted as indicated by a broken line Del. Similarly, in the P-type impurity region of the lower-side guard ring Grd_Rng, a plurality of contacts in a portion which faces the lower short side of the N-type impurity region as the cathode of the third diode D3 are completely omitted as indicated by a broken line Del. With the complete omission of a plurality of contacts in the upper-side and lower-side guard rings Grd_Rng indicated by the broken lines Del, series resistance in the portions of the weak spots Wk_Sp on the upper and lower short sides of the N-type impurity region formed in the longitudinal rectangular shape increases, making it possible to reduce the risk of destruction of the weak spots Wk_Sp on the upper and lower short sides.

In this case, with an increase in the size of the cobalt silicide region CoSi and the number of contacts, it is possible to improve current capability.

Instead of changing the size of the cobalt silicide region CoSi shown in FIGS. 25A to 25D, like FIGS. 31A to 31D, the cobalt silicide region CoSi approaches the upper short side of the N-type impurity region which becomes the cathode of the third diode D3 near the P-type impurity region of the upper-side guard ring Grd_Rng, the cobalt silicide region CoSi approaches the lower short side of the N-type impurity region which becomes the cathode of the third diode D3 near the P-type impurity region of the lower-side guard ring Grd_Rng, and a plurality of contacts are completely omitted as indicated by the broken line Del, making it possible to reduce the device size without lowering destruction withstand of the weak spot Wk_Sp.

Note that it becomes possible to reduce the width of the guard ring Grd_Rng on the side on which contacts are omitted, or the space between the guard ring Grd_Rng and the opposing N-type impurity region on the cathode side taking into consideration the ESD withstand characteristic balance.

Although FIGS. 21A to 21D, 23A to 23C, 25A to 25D, 27A to 27D, 29A to 29D, and 31A to 31D show a diode of a structure in which a P-type well region P-Well is used, like FIGS. 22A to 22D, 24A to 24C, 26A to 26D, 28A to 28D, 30A to 30D, and 32A to 32D, the same applies to a diode of a structure in which an N-type well region N-Well having an N-type impurity region and a P-type impurity region reversely arranged is used. In the layout of the chip, a diode may have a configuration in which a diode of a structure in which a P-type well region P-Well is used and a diode of a structure in which an N-type well region N-Well is used are arranged in parallel.

Embodiment 3

<<Semiconductor Device of Switch Circuit>>

FIGS. 33A to 33D are diagrams illustrating a semiconductor device of an N-channel MOS transistor Mn3 constituting a switch circuit 17 which has been studied by the inventors prior to the invention as a comparative reference example of the invention.

A switch circuit 17 shown in FIGS. 33A to 33D is a switch MOS transistor circuit which is used in, for example, a charge pump-type or a switched capacitor-type switch circuit for constituting a DC/DC converter. Accordingly, an N-channel MOS transistor Mn3 in the switch circuit 17 shown in FIGS. 33A to 33D repeats an operation to charge an external capacitor of the semiconductor integrated circuit with a precharge voltage and a boost operation to superimpose the precharge voltage on the power supply voltage to generate a stepped-up voltage, thereby performing a step-up operation. An actual DC/DC converter has a configuration in which a plurality of unit circuits are connected in series with series connection of the N-channel MOS transistor Mn3 of the switch circuit 17 shown in FIGS. 33A to 33D and a single external capacitor as a unit circuit. At this time, the drain D, gate G, and source S of the N-channel MOS transistor Mn3 of the switch circuit 17 shown in the equivalent circuit of FIG. 33A and the P-type well region P-Well are driven with different voltage levels $V_D$, $V_G$, $V_S$, and $V_{P\text{-}Well}$.

Figures 33A, 33B, 33C, 33D:
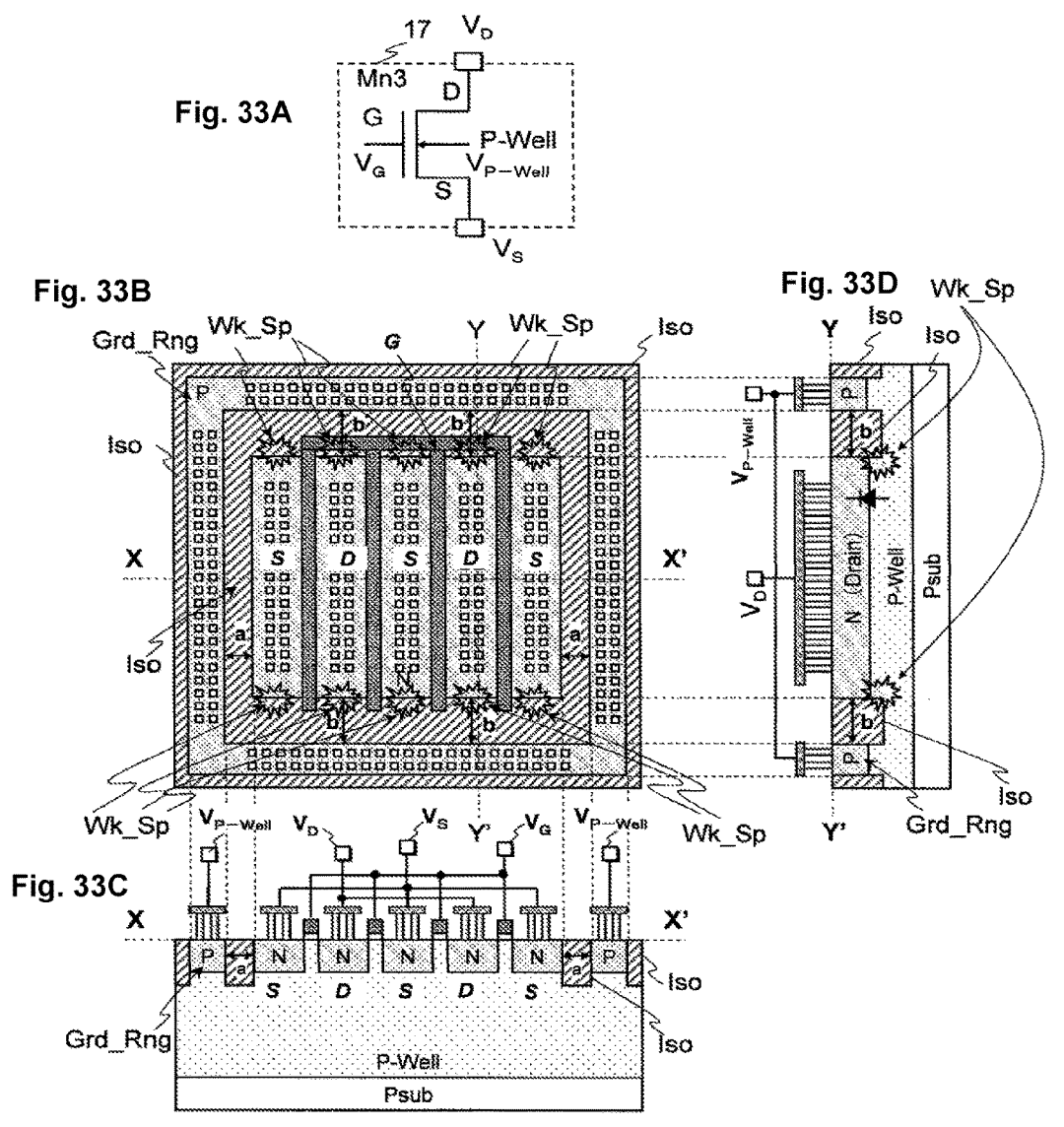

As shown in a planar structure of FIG. 33B, the gate G of the N-channel MOS transistor Mn3 constituting the switch circuit 17 is formed using a plurality of finger electrodes, and an N-type impurity region for forming the drain D and an N-type impurity region for forming the source S are formed on the left and right sides of each gate finger electrode. A hatched insulating isolation layer Iso is formed to have a ring-like planar shape in the periphery of a plurality of finger electrodes G, a plurality of drain N-type impurity regions D, and a plurality of source N-type impurity regions S. A P-type impurity region which functions as the guard ring Grd_Rng is formed to have a ring-like planar shape in the periphery of the ring-like planar shape of the insulating isolation layer Iso. An insulating isolation layer Iso is formed to have a ring-like planar shape in the periphery of the P-type impurity region which functions as the guard ring Grd_Rng. The P-type impurity region of the guard ring Grd_Rng is formed for the purposes of power feed to the P-type well region P-Well, reduction in the amount of transmission of noise from the N-channel MOS transistor Mn3 formed inside the guard ring Grd_Rng to the internal circuit of the semiconductor integrated circuit 1 shown in FIG. 1, and reduction in the risk of latchup destruction of the N-channel MOS transistor Mn3 formed inside the guard ring Grd_Rng due to noise from the internal circuit of the semiconductor integrated circuit 1 shown in FIG. 1.

As shown in FIG. 33C which shows a sectional structure taken along the line X-X' of the planar structure of FIG. 33B, a drain driving voltage $V_D$ is supplied to a plurality of drain N-type impurity regions, a well driving voltage $V_{P\text{-}Well}$ is supplied to the P-type impurity region of the guard ring Grd_Rng and the P-type well region P-Well, a source driving voltage $V_S$ is supplied to a plurality of source N-type impurity regions, and a gate driving voltage $V_G$ is supplied to a plurality of gate finger electrodes G.

As shown in FIG. 33D which shows a sectional structure taken along the line Y-Y' of the planar structure of FIG. 33B, the drain driving voltage $V_D$ is supplied to the drain N-type impurity regions through a plurality of contacts, and the well driving voltage $V_{P\text{-}Well}$ is supplied to the P-type impurity region of the guard ring Grd_Rng through a plurality of contacts.

As shown in the planar structure of FIG. 33B, a plurality of contacts arranged in the longitudinal direction are formed in the drain N-type impurity region D and the source N-type impurity region S formed in the longitudinal rectangular shape. A plurality of contacts arranged in the longitudinal direction are formed in the P-type impurity region of the right-side guard ring Grd_Rng and the P-type impurity region of the left-side guard ring Grd_Rng of the planar structure of FIG. 33B. A plurality of contacts arranged in the lateral direction are formed in the P-type impurity region of the upper-side guard ring Grd_Rng and the P-type impurity region of the lower-side guard ring Grd_Rng of the planar structure of FIG. 33B.

In the N-channel MOS transistor Mn3 of the switch circuit 17 shown in FIGS. 33A to 33D, it is assumed that a large backward surge voltage is applied to the PN junction between the P-type well region P-Well and the drain N-type impurity region D, and the PN junction between the P-type well region P-Well and the source N-type impurity region S. As will be understood from the sectional structure of FIG. 33D, the PN junction between the P-type well region P-Well and the drain N-type impurity region D and the PN junction between the P-type well region P-Well and the source N-type impurity region S break down, and a surge current flows in these PN junctions.

With the studies of the inventors prior to the invention, it has been obvious that, in case that the parasitic diode of the N-channel MOS transistor Mn3 of the switch circuit 17 shown in FIGS. 33A to 33D breaks down, the current density of the surge discharge current of the PN junction in the weak spot Wk_Sp shown in the planar structure of FIG. 33B and the sectional structure of FIG. 33D becomes higher than the PN junctions of other portions, and there is a high risk of destruction of the portion of the weak spot Wk_Sp. That is, ten weak spots Wk_Sp shown in the planar structure of FIG. 33B are in the short side portion of the source N-type impurity region S formed in the longitudinal rectangular shape and the short side portion of the drain N-type impurity region D formed in the longitudinal rectangular shape. This is because an increase in the current of the short side portion affected by a current in the four corner portions of the longitudinal rectangular shape becomes larger than an increase in the current of the long side portion.

FIGS. 34A to 34C are diagrams illustrating a semiconductor device of an N-channel MOS transistor Mn3 of a switch circuit 17 according to Embodiment 3 of the invention.

Like the equivalent circuit of FIG. 33A, as shown in an equivalent circuit of FIG. 34A, the drain D, gate G, and source S of the N-channel MOS transistor Mn3 of the switch circuit 17 and the P-type well region P-Well are driven by different voltage levels $V_D$, $V_G$, $V_S$, and $V_{P\text{-}Well}$.

Like the planar structure of FIG. 33B, as shown in a planar structure of FIG. 34B, the gate G of the N-channel MOS transistor Mn3 of the switch circuit 17 is formed using a plurality of finger electrodes, and an N-type impurity region for forming the drain D and an N-type impurity region for forming the source S are formed on the left and right sides of each finger electrode. A hatched insulating isolation layer Iso is formed to have a ring-like planar shape in the periphery of a plurality of finger electrodes G, a plurality of drain N-type impurity regions D, and a plurality of source N-type impurity regions S. A P-type impurity region which functions as the guard ring Grd_Rng is formed to have a ring-like planar shape in the periphery of the ring-like planar shape of the insulating isolation layer Iso. An insulating isolation layer Iso is formed to have a ring-like planar shape in the periphery of the P-type impurity region which functions as the guard ring Grd_Rng. The P-type impurity region of the guard ring Grd_Rng is formed for the purposes of power feed to the P-type well region P-Well, reduction in the amount of transmission of noise from the N-channel MOS transistor Mn3 formed inside the guard ring Grd_Rng to the internal circuit of the semiconductor integrated circuit 1 shown in FIG. 1, and reduction in the risk of latchup destruction of the N-channel MOS transistor Mn3 formed inside the guard ring Grd_Rng due to noise from the internal circuit of the semiconductor integrated circuit 1 shown in FIG. 1.

Like the planar structure of FIG. 33B, as shown in a planar structure of FIG. 34B, a plurality of contacts arranged in the longitudinal direction are formed in the drain N-type impurity region D and the source N-type impurity region S formed in the longitudinal rectangular shape. A plurality of contacts arranged in the longitudinal direction are formed in the P-type impurity region of the right-side guard ring Grd_Rng and the P-type impurity region of the left-side guard ring Grd_Rng of the planar structure of FIG. 34B. A plurality of contacts arranged in the lateral direction are formed in the P-type impurity region of the upper-side guard ring Grd_Rng and the P-type impurity region of the lower-side guard ring Grd_Rng of the planar structure of FIG. 34B.

Unlike the planar structure of FIG. 33B, in the P-type impurity region of the upper-side guard ring Grd_Rng and the P-type impurity region of the lower-side guard ring Grd_Rng of the planar structure of FIG. 34B, a plurality of contacts in portions facing the weak spots Wk_Sp on the short sides of the drain N-type impurity region D and the source N-type impurity region S formed in the longitudinal rectangular shape are omitted as indicated by broken lines Del. With the omission of a plurality of contacts indicated by the broken line Del, since series resistance in the portions of the weak spots Wk_Sp on the short sides of the drain N-type impurity region D and the source N-type impurity region S formed in the longitudinal rectangular shape increases, it becomes possible to reduce the risk of destruction of the ten weak spots Wk_Sp in total.

A planar structure of FIG. 34C illustrates the planar structure of a semiconductor device of the N-channel MOS transistor Mn3 of the switch circuit 17 according to Embodiment 3 of the invention as well.

The planar structure of FIG. 34C is different from the planar structure shown in FIG. 34B in that the distance b' between each of the drain N-type impurity region and the source N-type impurity region S in the portions of the weak spots Wk_Sp on the short sides of the drain N-type impurity region D and the source N-type impurity region S formed in the longitudinal rectangular shape and the P-type impurity region of the guard ring Grd_Rng is set to be smaller than the distance b in FIG. 34B.

As a result, according to the planar structure of FIG. 34C, it becomes possible to maintain the same ESD endurance as the planar structure of FIG. 33B, and to reduce the device area of the N-channel MOS transistor Mn3 of the switch circuit 17 compared to the planar structure of FIG. 33B.

Embodiment 4

<<Semiconductor Device of Electrostatic Protection Circuit>>

FIGS. 35A to 35G are diagrams illustrating semiconductor devices of a first diode D1 and a second diode D2 of an electrostatic protection circuit 13 according to Embodiment 4 of the invention.

Figure 3:
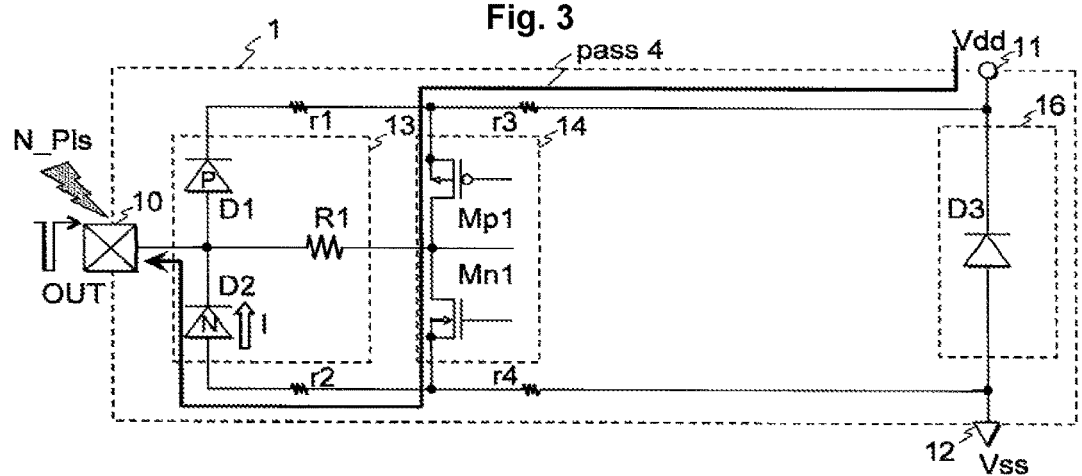
FIG. 3 is a diagram showing a case where an inter-power source clamp circuit 15 is not arranged in a semiconductor integrated circuit 1 shown in FIG. 1.
Figure 4:
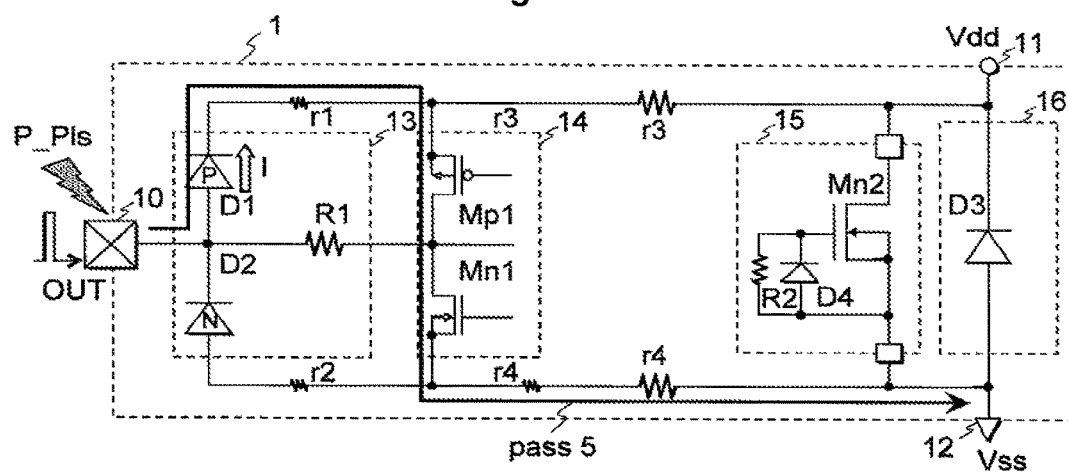
FIG. 4 is a diagram showing a situation (overall impedance of a circuit 15 when viewed from an external terminal is large) in which parasitic interconnect resistance r3 and r4 increase since the arrangement location of an inter-power source clamp circuit 15 is at a long distance from an output terminal 10 in a semiconductor integrated circuit 1 shown in FIG. 2.
Figure 7A:
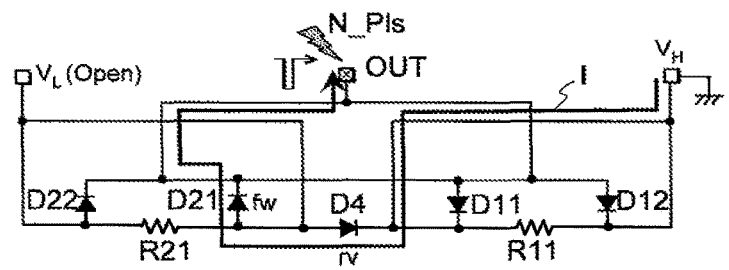
FIGS. 7A and 7B are diagrams illustrating the equivalent circuit of semiconductor devices of a first diode D1 and a second diode D2 in an electrostatic protection circuit 13 of a semiconductor integrated circuit 1 shown in FIGS. 5A to 5D.
Figure 7B:
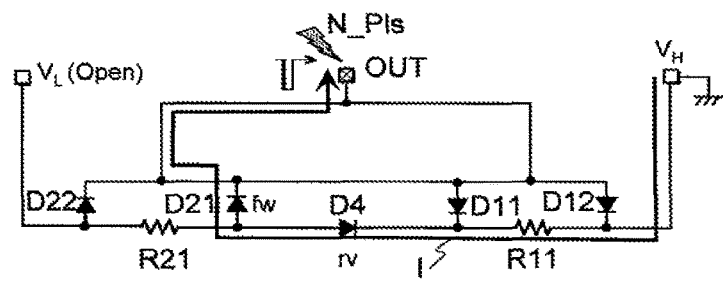
Figure 8A:
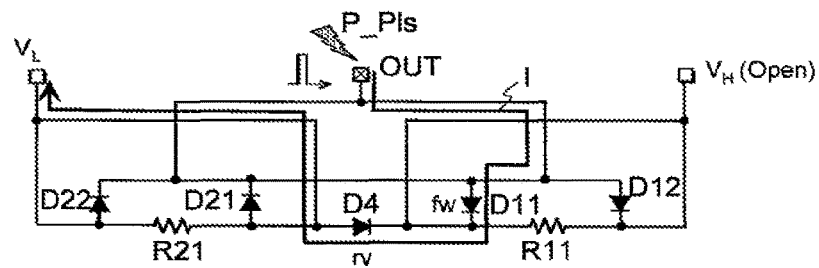
FIGS. 8A and 8B are diagrams illustrating the equivalent circuit of semiconductor devices of a first diode D1 and a second diode D2 in an electrostatic protection circuit 13 of a semiconductor integrated circuit 1 shown in FIGS. 6A to 6D.
Figure 8B:
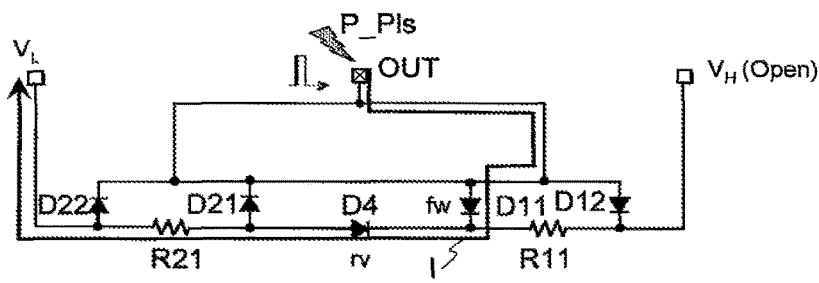

A first difference between the semiconductor devices of the first diode D1 and the second diode D2 of the electrostatic protection circuit 13 according to Embodiment 4 of the invention shown in FIGS. 35A to 35G and the semiconductor devices of the first diode D1 and the second diode D2 of the electrostatic protection circuit 13 shown in FIG. 3 which has been studied by the inventors prior to the invention is as described below.

That is, as will be understood from the planar structure of FIG. 35B, in the N-type impurity region of the upper-side guard ring Grd_Rng and the N-type impurity region of the lower-side guard ring Grd_Rng, a plurality of contacts in a portion which faces the weak spot Wk_Sp on the short side of the P-type impurity region forming the anode of the first diode D1 formed in the longitudinal rectangular shape are completely omitted as indicated by a broken line Del. As will be understood from a planar structure of FIG. 35C, in the P-type impurity region of the upper-side guard ring Grd_Rng and the P-type impurity region of the lower-side guard ring Grd_Rng, a plurality of contacts in a portion which faces the weak spot Wk_Sp on the short side of the N-type impurity region forming the cathode of the second diode D2 formed in the longitudinal rectangular shape are completely omitted as indicated by a broken line Del. As a result, with the omission of a plurality of contacts indicated by the broken lines Del, since series resistance in the weak spot Wk_Sp of the short side portion of the P-type impurity region forming the anode of the first diode D1 formed in the longitudinal direction and the weak spot Wk_Sp of the short side portion of the N-type impurity region forming the cathode of the second diode D2 formed in the longitudinal direction increases, it becomes possible to reduce the risk of destruction of the weak spot Wk_Sp.

A second difference between the semiconductor devices of the first diode D1 and the second diode D2 of the electrostatic protection circuit 13 according to Embodiment 4 of the invention shown in FIGS. 35A to 35G and the semiconductor devices of the first diode D1 and the second diode D2 of the electrostatic protection circuit 13 shown in FIGS. 5A to 5D which have been studied by the inventors prior to the invention is as described below.

That is, as will be understood from the planar structure of FIG. 35B, an insulating isolation layer Iso in a hatched middle portion is formed to have a ring-like planar shape in the periphery of an N-type impurity region of an internal guard ring Grd_Rng of the first diode D1. A P-type impurity region of an external guard ring Grd_Rng is formed to have a ring-like planar shape in the periphery of the insulating isolation layer Iso of the middle portion. A hatched external insulating isolation layer Iso is formed to have a ring-like planar shape in the periphery of the P-type impurity region of the external guard ring Grd_Rng. In the P-type impurity region of the external right guard ring Grd_Rng, a plurality of contacts in a portion facing the right long side of the N-type impurity region of the internal guard ring Grd_Rng formed in the longitudinal rectangular shape are completely omitted as indicated by a broken line Del. Similarly, in the P-type impurity region of the external left guard ring Grd_Rng, a plurality of contacts in a portion facing the left long side of the N-type impurity region of the internal guard ring Grd_Rng formed in the longitudinal rectangular shape are completely omitted as indicated by a broken line Del. In this way, even when a plurality of contacts in the portion facing the long side of the N-type impurity region of the internal guard ring Grd_Rng are completely omitted in the P-type impurity region of the external guard ring Grd_Rng, since the width in which the long side of the P-type impurity region of the external guard ring Grd_Rng and the long side of the N-type impurity region of the internal guard ring Grd_Rng face each other in parallel sufficiently has a large value, the risk of destruction of this portion is low.

As will be understood from the planar structure of FIG. 35C, an insulating isolation layer Iso in a hatched middle portion is formed to have a ring-like planar shape in the periphery of a P-type impurity region of an internal guard ring Grd_Rng of the second diode D2. An N-type impurity region of an external guard ring Grd_Rng is formed to have a ring-like planar shape in the periphery of the insulating isolation layer Iso of the middle portion. A hatched external insulating isolation layer Iso is formed to have a ring-like planar shape in the periphery of the N-type impurity region of the external guard ring Grd_Rng. In the N-type impurity region of the external right guard ring Grd_Rng, a plurality of contacts in a portion facing the right long side of the P-type impurity region of the internal guard ring Grd_Rng formed in the longitudinal rectangular shape are completely omitted as indicated by a broken line Del. Similarly, in the N-type impurity region of the external left guard ring Grd_Rng, a plurality of contacts in a portion facing the left long side of the P-type impurity region of the internal guard ring Grd_Rng formed in the longitudinal rectangular shape are completely omitted as indicated by a broken line Del. In this way, even when a plurality of contacts in the portions facing the long side of the P-type impurity region of the internal guard ring Grd_Rng are completely omitted in the N-type impurity region of the external guard ring Grd_Rng, since the width in which the long side of the N-type impurity region of the external guard ring Grd_Rng and the long side of the P-type impurity region of the internal guard ring Grd_Rng face each other in parallel sufficiently has a large value, the risk of destruction of this portion is low.

In this way, according to Embodiment 4 of the invention shown in FIGS. 35A to 35G, since a plurality of contacts are completely omitted as indicated by the broken lines Del in the long side portions of the P-type impurity region and the N-type impurity region of the external left and right guard rings Grd_Rng formed in the longitudinal rectangular shape, it becomes possible to significantly reduce the device area of the semiconductor devices of the first diode D1 and the second diode D2 of the electrostatic protection circuit 13.

Embodiment 5

<<Configuration of Semiconductor Integrated Circuit>>

FIG. 36 is a diagram showing the configuration of a semiconductor integrated circuit equipped with an electrostatic protection circuit (ESD protection circuit) according to Embodiment 5 of the invention.

The semiconductor integrated circuit 1 according to Embodiment 5 of the invention shown in FIG. 36 is different from the semiconductor integrated circuit 1 according to Embodiment 1 of the invention shown in FIG. 1 in that a terminal 10 is an input terminal, a circuit which includes a P-channel MOS transistor Mp1 and an N-channel MOS transistor Mn1 connected in series between the power supply terminal 11 and the ground terminal 12 is an input buffer 18, and a circuit which prevents the P-channel MOS transistor Mp1 and the N-channel MOS transistor Mn1 of the input buffer 18 from being destroyed in case that a surge voltage responsible for electrostatic destruction is applied to the input terminal 10 is an electrostatic protection circuit 19.

The electrostatic protection circuit 19 of the semiconductor integrated circuit 1 according to Embodiment 5 of the invention shown in FIG. 36 includes a resistor R1, a first diode D1, and a second diode D2. As the first diode D1 and the second diode D2 of the electrostatic protection circuit 19, the semiconductor devices according to Embodiment 4 of the invention shown in FIGS. 35A to 35G can be used.

As each diode of the first diode D1 and the second diode D2 of the electrostatic protection circuit 19 of the semiconductor integrated circuit 1 according to Embodiment 5 of the invention shown in FIG. 36, the semiconductor device according to Embodiment 2 of the invention shown in FIGS. 23A to 23C, 27A to 27D, 29A to 29D, or 31A to 31D can be used.

Embodiment 6

<<Another Configuration of Inter-Power Source Clamp Circuit>>

FIGS. 37A and 37B are diagrams showing another configuration of an inter-power source clamp circuit 15 in a semiconductor integrated circuit according to Embodiment 6 of the invention.

That is, the semiconductor integrated circuit according to Embodiment 6 of the invention relates to another configuration of the inter-power source clamp circuit 15 in the semiconductor integrated circuit 1 according to Embodiment 1 of the invention shown in FIG. 1 or Embodiment 5 of the invention shown in FIG. 36.

In Embodiment 1 of the invention or Embodiment 5 of the invention described above, as shown in FIGS. 1 and 36, the inter-power source clamp circuit 15 includes an N-channel MOS transistor Mn2, a resistor R2, and a diode D4. The drain and source of the N-channel MOS transistor Mn2 are respectively connected to the power supply terminal 11 and the ground terminal 12. The resistor R2 and the diode D4 are connected in parallel between the gate and source of the N-channel MOS transistor Mn2. In the N-channel MOS transistor Mn2 of the inter-power source clamp circuit 15, as shown in FIGS. 12A to 12C, a plurality of contacts in a portion facing the weak spot Wk_Sp on the short side of the N-type impurity region D formed in the longitudinal rectangular shape are omitted as indicated by a broken line Del.

In Embodiment 1 of the invention shown in FIGS. 14A to 14C and 18A to 18D, the inter-power source clamp circuit 15 has the P-channel MOS transistor Mp2 whose gate G and source S are short-circuited. As shown in FIGS. 14A to 14C and 18A to 18D, a plurality of contacts in the portion facing the weak spot Wk_Sp on the short side of the P-type impurity region D formed in the longitudinal rectangular shape are omitted as indicated by the broken line Del.

In Embodiment 1 of the invention shown in FIGS. 12A to 12C, 15A to 15C, 16A to 16C, and 17A to 17D, the inter-power source clamp circuit 15 has the N-channel MOS transistor Mn2 whose gate G and source S are short-circuited. As shown in FIGS. 15C, 16C, and 17A to 17D, a plurality of contacts in the portion facing the weak spot Wk_Sp on the short side of the N-type impurity region D formed in the longitudinal rectangular shape are omitted as indicated by the broken line Del.

In Embodiment 1 of the invention shown in FIGS. 20A to 20D, the inter-power source clamp circuit 15 has the N-channel MOS transistor Mn2 whose gate G and source S are short-circuited. As shown in FIGS. 20A to 20D, a plurality of contacts in the portion facing the weak spot Wk_Sp on the short side since cobalt silicide CoSi having high series resistance is not formed on the short side of the N-type impurity region D formed in the longitudinal rectangular shape are omitted as indicated by the broken line Del.

Meanwhile, the inter-power source clamp circuit 15 of the semiconductor integrated circuit according to Embodiment 6 of the invention shown in FIGS. 37A and 37B includes a time-constant circuit TCC and an N-channel MOS transistor Mn2. The drain D and source S of the N-channel MOS transistor Mn2 are respectively connected to the power supply terminal 11 and the ground terminal 12. An output signal of the time-constant circuit TCC is supplied between the gate G and source S of the N-channel MOS transistor Mn2 through a CMOS inverter Inv or directly.

In the inter-power source clamp circuit 15 according to Embodiment 6 of the invention shown in FIG. 37A, the time-constant circuit TCC has a resistor Rs and a capacitor Cs connected in series in order of the resistor Rs and the capacitor Cs so as to form an integration circuit. A connection node of the resistor Rs and the capacitor Cs is connected to the input terminal of the CMOS inverter Inv, and the output terminal of the CMOS inverter Inv is connected to the gate G of the N-channel MOS transistor Mn2.

In the inter-power source clamp circuit 15 according to Embodiment 6 of the invention shown in FIG. 37B, the time-constant circuit TCC has a capacitor Cs and a resistor Rs which are connected in series in order of the capacitor Cs and the resistor Rs so as to form a differential circuit. A connection node of the capacitor Cs and the resistor Rs is connected to the gate G of the N-channel MOS transistor Mn2.

The N-channel MOS transistor Mn2 of the inter-power source clamp circuit 15 according to Embodiment 6 of the invention shown in FIGS. 37A and 37B can have the structure of the semiconductor device according to Embodiment 1 of the invention shown in FIGS. 12A to 12C, 15A to 15C, 16A to 16C, 17A to 17D, or 20A to 20D. That is, a plurality of contacts in the portion facing the weak spot Wk_Sp on the short side of the N-type impurity region D formed in the longitudinal rectangular shape are omitted, making it possible to reduce the risk of destruction of the weak spot Wk_Sp.

Figure 2:
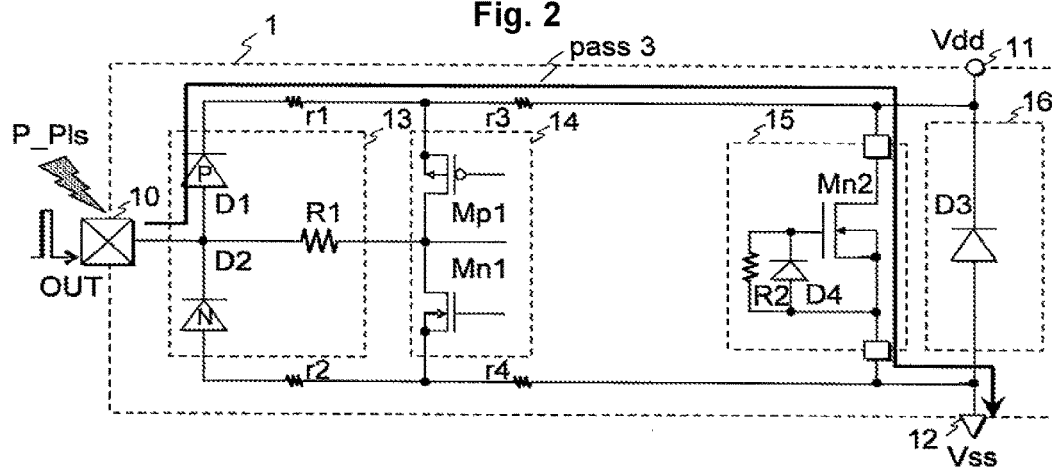
FIG. 2 is a diagram illustrating a discharge operation in an ESD test in which a positive surge pulse voltage P_Pls is applied to an output terminal 10 (a power supply terminal 11 is in an open state) with a ground terminal 12 of a semiconductor integrated circuit 1 as a reference terminal (a state where a ground voltage GND=0 V is supplied) as in FIG. 1.

The inter-power source clamp circuit 15 according to Embodiment 6 of the invention shown in FIGS. 37A and 37B very effectively prevents device destruction of the output buffer 14 or the input buffer 18 in a state where the positive surge pulse voltage P_pls is applied to the output terminal 10 as described with reference to FIG. 2 or in a state where the surge voltage is applied to the input terminal 10 as described with reference to FIG. 36. That is, in the state where the surge voltage is applied, the power supply voltage Vdd of the power supply terminal 11 transiently increases in response to the surge voltage with respect to the ground potential Vss of the ground terminal 12.

In the inter-power source clamp circuit 15 according to Embodiment 6 of the invention shown in FIG. 37A, a potential difference is generated between the connection node of the resistor Rs and the capacitor Cs of the time-constant circuit TCC forming an integration circuit and the power supply voltage Vdd during the transient period. When this happens, the output terminal of the CMOS inverter Inv is changed to high level, the N-channel MOS transistor Mn2 is controlled in the on state, and a channel current starts to flow from the drain D to the source S of the N-channel MOS transistor Mn2. If the voltage of the power supply voltage Vdd rises, the parasitic bipolar transistor of the N-channel MOS transistor Mn2 is put in the on state, such that energy of the surge pulse voltage is consumed, making it possible to prevent the output buffer 14 or the input buffer 18 from being destroyed.

In the inter-power source clamp circuit 15 according to Embodiment 6 of the invention shown in FIG. 37B, since the connection node of the capacitor Cs and the resistor Rs of the time-constant circuit TCC forming a differential circuit is changed to high level during the transient period, the N-channel MOS transistor Mn2 is controlled in the on state. Accordingly, a channel current flows from the drain D of the N-channel MOS transistor Mn2 in the on state to the source S, and the parasitic bipolar transistor of the N-channel MOS transistor Mn2 is put in the on state, such that energy of the surge pulse voltage is consumed, making it possible to prevent the output buffer 14 or the input buffer 18 from being destroyed.

Since the N-channel MOS transistor Mn2 of the inter-power source clamp circuit 15 according to Embodiment 1 of the invention shown in FIGS. 15A to 15C, 16A to 16C, and 17A to 17D consumes energy of the surge pulse voltage through the operation of the parasitic bipolar transistor, there is a possibility that a destruction prevention operation is uncertain. Meanwhile, in the inter-power source clamp circuit 15 according to Embodiment 6 of the invention shown in FIGS. 37A and 37B, since the N-channel MOS transistor Mn2 initially consumes energy of the surge pulse voltage through the channel current of a field effect transistor, it is possible to ascertain the destruction prevention operation.

The MOS transistor of the output unit of the inter-power source clamp circuit 15 in the semiconductor integrated circuit according to Embodiment 6 of the invention shown in FIGS. 37A and 37B is not limited to an N-channel MOS transistor, the P-channel MOS transistor Mp2 described in Embodiment 1 of the invention shown in FIGS. 14A to 14C and 18A to 18D may be used. In this case, the source and drain of the P-channel MOS transistor Mp2 are respectively connected to the power supply terminal 11 and the ground terminal 12, and the output signal of the time-constant circuit TCC is supplied between the gate and source of the P-channel MOS transistor Mp2 through the CMOS inverter Inv or directly.

In the inter-power source clamp circuit 15 according to Embodiment 6 of the invention shown in FIG. 37A, when the time-constant circuit TCC having an integration circuit and the P-channel MOS transistor Mp2 are used, the CMOS inverter Inv is omitted. Meanwhile, in the inter-power source clamp circuit 15 according to Embodiment 6 of the invention shown in FIG. 37B, when the time-constant circuit TCC having a differential circuit and the P-channel MOS transistor Mp2 are used, the CMOS inverter Inv is added.

Embodiment 7 (Seventh Embodiment)

<<Configuration of Decoupling Capacitor>>

FIGS. 38A to 38E are diagrams showing the configuration of a semiconductor device of a decoupling capacitor in a semiconductor integrated circuit according to Embodiment 7 of the invention.

The decoupling capacitor Cd according to Embodiment 7 of the invention shown in FIGS. 38A to 38E is connected between the power supply terminal 11 and the ground terminal 12 of the semiconductor integrated circuit 1 according to Embodiment 1 of the invention shown in FIG. 1 or Embodiment 5 of the invention shown in FIG. 36. That is, the decoupling capacitor Cd is connected between the power supply terminal 11 and the ground terminal 12 of the semiconductor integrated circuit 1, such that a ripple component of the power supply voltage Vdd of the power supply terminal 11 is reduced, making it possible to reduce the probability of an erroneous operation due to a ripple component of the output buffer 14, the input buffer 18, or a CMOS internal circuit (not shown). The decoupling capacitor Cd absorbs energy of the surge pulse voltage in a state where the surge voltage is applied to the output terminal 10 or in a state where the surge voltage is applied to the input terminal 10, making it possible to prevent the output buffer 14, the input buffer 18, the CMOS internal circuit (not shown) from being destroyed. In regard to a surge pulse voltage at high level, the inter-power source clamp circuit 15 consumes energy of the surge pulse voltage, making it possible to prevent the output buffer 14, the input buffer 18, the CMOS internal circuit (not shown) from being destroyed.

Figure 38A:
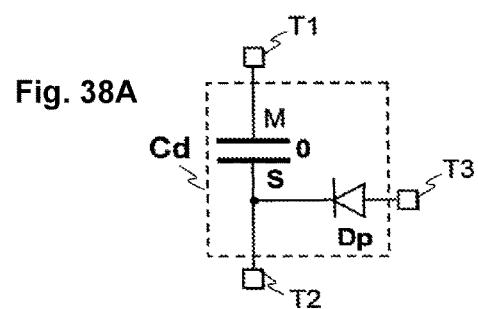
FIGS. 38A to 38E are diagrams showing the configuration of a semiconductor device of a decoupling capacitor in a semiconductor integrated circuit according to Embodiment 7 of the invention.

As shown in an equivalent circuit of FIG. 38A, a MOS capacitor forming the decoupling capacitor Cd includes a metal electrode M connected to the power supply terminal 11, a semiconductor S connected to the ground terminal 12, and an oxide film O connected between the metal electrode M and the semiconductor S. The metal electrode M is connected to a terminal T1, the semiconductor S is connected to a terminal T2, the semiconductor S is connected to the cathode of a parasitic diode Dp, and the anode of the parasitic diode Dp is connected to a terminal T3.

Figures 38B, 38D, 38E:
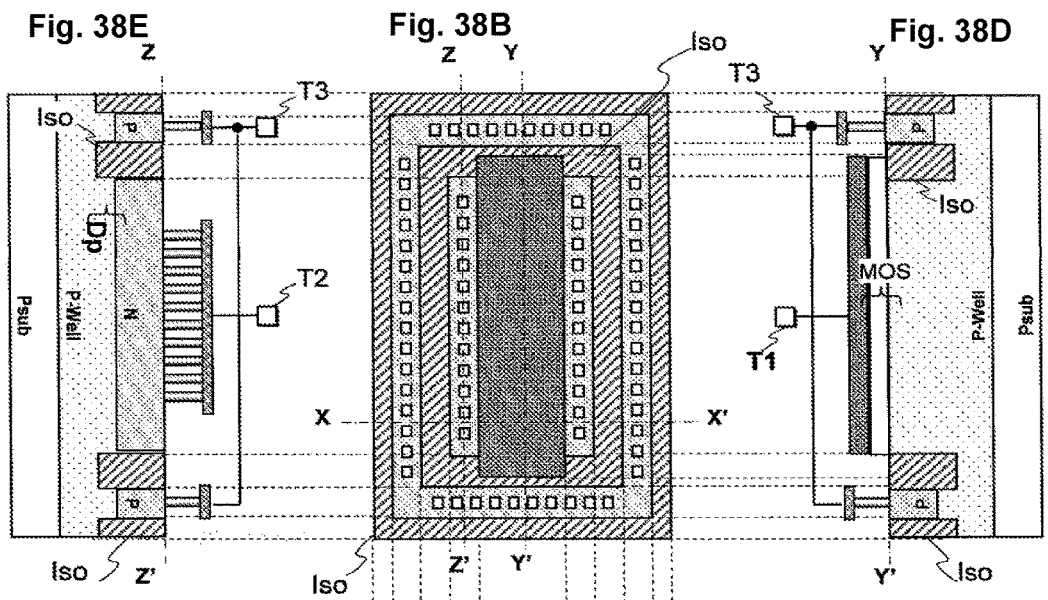

As shown in a planar structure of FIG. 38B, the metal electrode M of the MOS capacitor which is connected to the terminal T1 has a single electrode, and N-type impurity regions which are connected to the terminal T2 are formed on the left and right sides of the single electrode. A hatched insulating isolation layer Iso is formed to have a ring-like planar structure in the periphery of the left and right N-type impurity regions, and a P-type impurity region which functions as a guard ring Grd_Rng is formed to have a ring-like planar structure in the periphery of the insulating isolation layer Iso. A hatched insulating isolation layer Iso is formed to have a ring-like planar structure in the periphery of the P-type impurity region which functions as the guard ring Grd_Rng. The P-type impurity region of the guard ring Grd_Rng is formed for the purposes of power feed to the P-type well region P-Well and prevention of the transmission of noise from the internal circuit of the semiconductor integrated circuit 1 to the semiconductor S of the MOS capacitor formed inside the guard ring Grd_Rng.

Figure 38C:
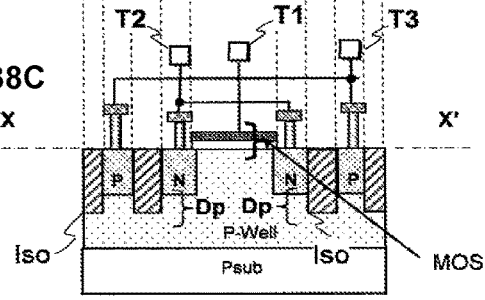

As shown in FIG. 38C which shows a sectional structure taken along the line X-X' of the planar structure of FIG. 38B, the single metal electrode M of the MOS capacitor is connected to the terminal T1, the left and right N-type impurity regions are connected to the terminal T2, and the P-type impurity region of the guard ring Grd_Rng is connected to the terminal T3.

As shown in FIG. 38D which shows a sectional structure taken along the line Y-Y' of the planar structure of FIG. 38B, a laminated structure of the oxide film O and the metal electrode m is formed above the P-type well region P-Well, the single metal electrode M of the MOS capacitor is connected to the terminal T1, and the P-type impurity region of the guard ring Grd_Rng is connected to the terminal T3. Accordingly, since the power supply voltage of the terminal T1 as the power supply terminal 11 is relatively positive with respect to the ground potential of the terminal T2 and the terminal T3 as the ground terminal 12, an N-type inversion channel which functions as the semiconductor S of the MOS capacitor is formed on the surface of the P-type well region P-Well directly below the laminated structure of the oxide film O and the metal electrode M.

As shown in FIG. 38E which shows a sectional structure taken along the line Z-Z' of the planar structure of FIG. 38B, the N-type impurity regions formed on the left and right sides of the metal electrode M of the MOS capacitor are connected to the terminal T2, the P-type impurity region of the guard ring Grd_Rng is connected to the terminal T3, and the N-type impurity region and the P-type well region P-Well form a parasitic diode Dp.

Since the decoupling capacitor Cd according to Embodiment 7 of the invention shown in FIGS. 38A to 38E is formed using a MOS capacitor, the decoupling capacitor Cd can be formed simultaneously with the N-channel MOS transistors Mn2 and Mn3 shown in FIGS. 12A to 12C, 15A to 15C, 16A to 16C, 17A to 17D, and 34A to 34C or the P-channel MOS transistor Mp2 shown in FIGS. 14A to 14C and 18A to 18D.

That is, the P-type well region P-Well of the MOS capacitor of the decoupling capacitor Cd shown in FIGS. 38A to 38E is formed simultaneously with the P-type well region P-Well of the N-channel MOS transistor Mn2 shown in FIGS. 12A to 12C, and the oxide film O of the MOS capacitor of the decoupling capacitor Cd shown in FIGS. 38A to 38E is simultaneously formed with the gate oxide film of the N-channel MOS transistor Mn2 shown in FIGS. 12A to 12C. The metal electrode M of the MOS capacitor of the decoupling capacitor Cd shown in FIGS. 38A to 38E is formed simultaneously with the gate electrode of the N-channel MOS transistor Mn2 shown in FIGS. 12A to 12C, and electrodes which are connected to the left and right N-type impurity regions of the metal electrode M of the MOS capacitor of the decoupling capacitor Cd shown in FIGS. 38A to 38E are formed simultaneously with electrodes which are connected to the drain and source of the N-channel MOS transistor Mn2 shown in FIGS. 12A to 12C.

As another example, the decoupling capacitor Cd according to Embodiment 7 of the invention shown in FIGS. 38A to 38E can be formed simultaneously with the N-channel MOS transistor Mn3 according to Embodiment 3 of the invention shown in FIGS. 34A to 34C. That is, the N-channel MOS transistor Mn3 according to Embodiment 3 of the invention shown in FIGS. 34A to 34C is manufactured through the same semiconductor manufacturing process as the N-channel MOS transistor Mn3 of the comparative reference example of the invention shown in FIGS. 33A to 33D.

As described above, since the MOS capacitor forming the decoupling capacitor Cd according to Embodiment 7 of the invention shown in FIGS. 38A to 38E is formed simultaneously with the N-channel MOS transistor or the P-channel MOS transistor inside the semiconductor integrated circuit 1 according to various embodiments of the invention, it becomes possible to reduce manufacturing costs for the MOS capacitor forming the decoupling capacitor Cd.

The turn-on voltage at which the MOS transistor forming the inter-power source clamp circuit 15 starts an inter-power source clamp operation or the turn-on voltage at which the PN junction of the third diode D3 forming the power protection circuit 16 starts a clamp operation is set to be lower than the destructive breakdown voltage of the MOS capacitor forming the decoupling capacitor Cd according to Embodiment 7 of the invention shown in FIGS. 38A to 38E.

<<Layout of Decoupling Capacitor>>

FIG. 39 is a diagram showing the layout configuration of decoupling capacitor Cd inside a semiconductor chip of semiconductor integrated circuit shown in FIGS. 38A to 38E according to Embodiment 7 of the invention.

As shown in FIG. 39, a plurality of input/output terminals 10 (IO1, IO2, . . . , and IOx) and the like are arranged on the lower long side of a rectangular semiconductor chip to perform data transmission/reception through flexible wirings with respect to a central processing unit (CPU) or an application processor which is formed using another semiconductor integrated circuit. As shown in FIG. 39, a power supply terminal 11 and a ground terminal 12 to which a power supply voltage Vdd and a ground potential Vss of the flexible wirings are respectively supplied are arranged on the lower long side of the rectangular semiconductor chip.

Next, a plurality of output terminals OUT1, OUT2, . . . , OUTx, OUTxx, . . . , OUTn-1, and OUTn are arranged on the upper long side of the rectangular semiconductor chip to generate a liquid crystal driving output voltage which drives a liquid crystal display (LCD) as a display device.

As shown in FIG. 39, amain power interconnect Main_Vdd and a main ground interconnect Main_Vss are respectively formed to have a surrounding interconnect shape along the lower long side, the right short side, the upper long side, and the left short side of the rectangular semiconductor chip. The main power interconnect Main_Vdd and the main ground interconnect Main_Vss may be formed not only to have a surrounding interconnect shape and but also to cross the inside of the chip in the vertical direction or the horizontal direction. A sub power interconnect Sub_Vdd and a sub ground interconnect Sub_Vss which are used to supply an operating voltage to a plurality of input buffers 18 and a plurality of output buffers 14 formed inside the semiconductor chip respectively branch off from the main power interconnect Main_Vdd and the main ground interconnect Main_Vss.

As shown in FIG. 39, the power supply voltage Vdd of the power supply terminal 11 arranged left on the lower long side of the rectangular semiconductor chip is supplied to the main power interconnect Main_Vdd, and the ground potential Vss of the ground terminal 12 arranged right on the lower long side of the rectangular semiconductor chip is supplied to the main ground interconnect Main_Vss. First diodes D1, second diodes D2, and resistors R1 of a plurality of output electrostatic protection circuits 13 are arranged between the main power interconnect Main_Vdd and the main ground interconnect Main_Vss arranged on the lower long side of the semiconductor chip shown in FIG. 39. The cathode of the first diode D1 is connected to the main power interconnect Main_Vdd arranged on the lower long side, and the anode of the second diode D2 is connected to the main ground interconnect Main_Vss arranged on the lower long side. The anode of the first diode D1 and the cathode of the second diode D2 are connected to the drain of the P-channel MOS transistor Mp1 and the drain of the N-channel MOS transistor Mn1 of the output buffer 14 formed inside the semiconductor chip through the resistor R1. Note that the connection of the resistor R1 and the junction of the output of the output buffer 14, the anode of the first diode D1, and the cathode of the second diode D2 may be omitted, or the resistor R1 may be connected between the gate of the input buffer 18 and the terminal IOx 10. The diodes D1 and D2 which are used in each block are not limited to diodes, and devices, such as clamp MOS diodes, having a clamp function may be used. The types of devices of a PN junction diode and a clamp MOS diode to be used may differ between the blocks.

The N-channel MOS transistor Mn2 of the inter-power source clamp circuit 15 and the third diode D3 of the power protection circuit 16 in the semiconductor integrated circuit 1 according to Embodiment 1 of the invention shown in FIG. 1 or Embodiment 5 of the invention shown in FIG. 36 are connected between the main power interconnect Main_Vdd and the main ground interconnect Main_Vss arranged on the lower long side of the semiconductor chip of FIG. 39.

The N-channel MOS transistor Mn2 of each of a plurality of inter-power source clamp circuits 15 connected between the main power interconnect Main_Vdd and the main ground interconnect Main_Vss arranged on the lower long side of the semiconductor integrated circuit according to Embodiment 7 of the invention shown in FIG. 39 is the N-channel MOS transistor Mn2 according to Embodiment 1 of the invention shown in FIGS. 12A to 12C, 15A to 15C, 16A to 16C, and 17A to 17D. That is, in the N-channel MOS transistor Mn2, a plurality of contacts in the portion facing the weak spot Wk_Sp on the short side of the N-type impurity region D formed in the longitudinal rectangular shape are omitted. As the N-channel MOS transistor Mn2, a transistor Mn2 in which a plurality of contacts in a portion facing the weak spot Wk_Sp on the short side since cobalt silicide CoSi having high series resistance is not formed on the short side of the N-type impurity region D formed in the longitudinal rectangular shape described with reference to FIGS. 20A to 20D are omitted may be used.

The third diode D3 of each of a plurality of power protection circuits 16 connected between the main power interconnect Main_Vdd and the main ground interconnect Main_Vss arranged on the lower long side of the semiconductor integrated circuit according to Embodiment 7 of the invention shown in FIG. 39 is the third diode D3 according to Embodiment 2 of the invention shown in FIGS. 23A to 23C, 24A to 24C, 27A to 27D, 28A to 28D, 29A to 29D, 30A to 30D, 31A to 31D, and 32A to 32D. That is, the third diode D3 has a configuration in which a plurality of contacts in a portion facing the weak spot Wk_Sp on the short side of the N-type or P-type impurity region forming the cathode K or the anode A formed in the longitudinal rectangular shape are omitted in the P-type or N-type impurity region of the guard ring Grd_Rng.

In particular, in the semiconductor integrated circuit according to Embodiment 7 of the invention shown in FIG. 39, the arrangement of the decoupling capacitor Cd according to Embodiment 7 of the invention shown in FIGS. 38A to 38E is prohibited inside an arrangement prohibition region Cd_Proh on the lower long side of the semiconductor chip on which the power supply terminal 11 and the ground terminal 12 are arranged. The reason is that the operating voltage between the main power interconnect Main_Vdd and the main ground interconnect Main_Vss inside the arrangement prohibition region Cd_Proh largely changes due to an external surge voltage of the semiconductor integrated circuit, such that the oxide film of the MOS capacitor forming the decoupling capacitor Cd shown in FIGS. 38A to 38E undergoes dielectric breakdown.

That is, if the external surge voltage of the semiconductor integrated circuit is applied to any terminal of the power supply terminal 11, the ground terminal 12, and a plurality of input/output terminals (IO1, IO2, . . . , and IOx) 10 arranged on the lower long side of the semiconductor chip, the operating voltage between the main power interconnect Main_Vdd and the main ground interconnect Main_Vss inside the arrangement prohibition region Cd_Proh largely changes. While the N-channel MOS transistors Mn2 of a plurality of inter-power source clamp circuits 15 and the third diodes D3 of a plurality of power protection circuits 16 are connected between the main power interconnect Main_Vdd and the main ground interconnect Main_Vss inside the arrangement prohibition region Cd_Proh, the effect of suppressing variation in the operation voltage resulting from these circuits is insufficient. For this reason, the oxide film O of the MOS capacitor forming the decoupling capacitor Cd shown in FIGS. 38A to 38E undergoes dielectric breakdown.

Detailed description will be provided as follows. As shown in FIG. 39, the main power interconnect Main_Vdd and the main ground interconnect Main_Vss are formed to have a surrounding interconnect shape along the lower long side, the right short side, the upper long side, and the left short side of the rectangular semiconductor chip of the semiconductor integrated circuit according to Embodiment 7 of the invention. The N-channel MOS transistors Mn2 of a plurality of inter-power source clamp circuits 15 are distributed in the main power interconnect Main_Vdd and the main ground interconnect Main_Vss having the surrounding interconnect shape. As described above, the turn-on voltage at which the MOS transistor forming the inter-power source clamp circuit 15 starts the inter-power source clamp operation is set to be lower than the destructive breakdown voltage of the MOS capacitor forming the decoupling capacitor Cd. Meanwhile, the power supply voltage Vdd, display information data, and a high external surge voltage included in the ground potential Vss which are supplied from a host apparatus, such as a central processing unit (CPU) or an application processor, are applied to the power supply terminal 11, the input/output terminals 10, and the ground terminal 12 arranged on the lower long side of the semiconductor chip near the arrangement prohibition region Cd_Proh. Since the liquid crystal display (LCD) which is a driving load apparatus is connected to a plurality of output terminals OUT1, OU12, . . . , and OUTn arranged on the upper long side of the semiconductor chip, there is little possibility that the high external surge voltage is applied to a plurality of output terminals OUT1, OU12, . . . , and OUTn arranged on the upper long side. Interconnect series resistance of the main power interconnect Main_Vdd and the main ground interconnect Main_Vss formed in the surrounding interconnect shape in the rectangular semiconductor chip of the semiconductor integrated circuit is not negligible, and a voltage drop between the drain and source of the MOS transistor because a surge current flows in the MOS transistor forming the inter-power source clamp circuit 15 is not negligible. For these reasons, the operating voltage between the main power interconnect Main_Vdd and the main ground interconnect Main_Vss inside the arrangement prohibition region Cd_Proh becomes higher than the destructive breakdown voltage of the MOS capacitor forming the decoupling capacitor Cd in response to the external surge voltage of the semiconductor integrated circuit, and the oxide film O of the MOS capacitor forming the decoupling capacitor Cd undergoes dielectric breakdown.

For the above-described reasons, as indicated by broken lines Cd_NG1 and Cd_NG2, the connection of the decoupling capacitor Cd having the MOS capacitor according to Embodiment 7 of the invention shown in FIGS. 38A to 38E between the main power interconnect Main_Vdd and the main ground interconnect Main_Vss is prohibited inside the arrangement prohibition region Cd_Proh.

According to a preferred embodiment of the invention, in order to increase capacitance of the arrangement prohibition portions indicated by the broken lines Cd_NG1 and Cd_NG2, the inter-power source clamp circuit 15 or the power protection circuit 16 is arranged in these arrangement prohibition portions as a substitute of the decoupling capacitor Cd having the MOS capacitor. As the inter-power source clamp circuit 15 or the power protection circuit 16 which is substitutively arranged, the inter-power source clamp circuit 15 according to Embodiment 1 of the invention shown in FIGS. 12A to 12C, 14A to 14C, 16A to 16C, 17A to 17D, 18A to 18D, and 20A to 20D, the power protection circuit 16 according to Embodiment 2 of the invention shown in FIGS. 23A to 23C, 24A to 24C, 27A to 27D, 28A to 28D, 29A to 29D, 30A to 30D, 31A to 31D, and 32A to 32D, or the inter-power source clamp circuit 15 according to Embodiment 7 of the invention shown in FIGS. 37A and 37B may be used. That is, drain parasitic capacitance of the N-channel MOS transistor Mn2 or the P-channel MOS transistor Mp2 forming the inter-power source clamp circuit 15 or PN junction parasitic capacitance of the third diode D3 forming the power protection circuit 16 functions as substitute capacitance of the decoupling capacitor Cd having the MOS capacitor. Since the device is designed such that ESD withstand of the MOS transistor Mn2 or Mp2 forming the inter-power source clamp circuit 15 becomes higher, there is a low risk that the substitute capacitance is destroyed and breaks down.

In the semiconductor integrated circuit according to Embodiment 7 of the invention shown in FIG. 39, as indicated by a broken line Cd_NG3, the connection of the decoupling capacitor Cd having the MOS capacitor according to Embodiment 7 of the invention shown in FIGS. 38A to 38E between the sub power interconnect Sub_Vdd and the sub ground interconnect Sub_Vss is prohibited on the left side of the sub power interconnect Sub_Vdd and the sub ground interconnect Sub_Vss connected to a plurality of input buffers (IN_CKT) 18 at the center of the rectangular semiconductor chip. The reason is that the N-channel MOS transistor Mn2 of the inter-power source clamp circuit 15 is not connected to the main power interconnect Main_Vdd or the sub power interconnect Sub_Vdd between the arrangement prohibition portion indicated by the broken line Cd_NG3 and the power supply terminal 11 to which the external surge voltage is supplied. Accordingly, since the effect of suppressing variation in the operating voltage in the arrangement prohibition portion indicated by the broken line Cd_NG3 is insufficient, if the decoupling capacitor Cd shown in FIGS. 38A to 38E is arranged in the arrangement prohibition portion, the oxide film O of the MOS capacitor undergoes dielectric breakdown. A plurality of input electrostatic protection circuits 19 are connected to a plurality of input buffers (IN_CKT) 18, and each input electrostatic protection circuit 19 includes a first diode D1 and a second diode D2. The cathode of the first diode D1 is connected to the sub power interconnect Sub_Vdd arranged on the lower long side, and the anode of the second diode D2 is connected to the sub ground interconnect Sub_Vss arranged on the lower long side. The anode of the first diode D1 and the cathode of the second diode D2 are connected to the gate of the P-channel MOS transistor Mp1 and the gate of the N-channel MOS transistor Mn1 of the input buffer 18 formed inside the semiconductor chip.

According to a preferred embodiment of the invention, in order to increase capacitance of the arrangement prohibition portion indicated by the broken line Cd_NG3, the same substitute capacitance as the substitute capacitance arranged in the arrangement prohibition portions indicated by the broken lines Cd_NG1 and Cd_NG2 is arranged in the arrangement prohibition portion.

In the semiconductor integrated circuit according to Embodiment 7 of the invention shown in FIG. 39, as indicated by a broken line Cd_NG4, the connection of the decoupling capacitor Cd having the MOS capacitor according to Embodiment 7 of the invention shown in FIGS. 38A to 38E is prohibited between the main power interconnect Main_Vdd and the main ground interconnect Main_Vss on the left short side of the rectangular semiconductor chip. The reason is that the N-channel MOS transistor Mn2 of the inter-power source clamp circuit 15 is not connected to the main power interconnect Main_Vdd or the main ground interconnect Main_Vss between the arrangement prohibition portion indicated by the broken line Cd_NG4 and the power supply terminal 11 or the ground terminal 12 to which the external surge voltage is supplied. Accordingly, since the effect of suppressing variation in the operating voltage in the arrangement prohibition portion indicated by the broken line Cd_NG4 is insufficient, if the decoupling capacitor Cd shown in FIGS. 38A to 38E is arranged in the arrangement prohibition portion, the oxide film O of the MOS capacitor undergoes dielectric breakdown.

According to a preferred embodiment of the invention, in order to increase capacitance of the arrangement prohibition portion indicated by the broken line Cd_NG4, the same substitute capacitance as the substitute capacitance arranged in the arrangement prohibition portions indicated by the broken lines Cd_NG1, Cd_NG2, and Cd_NG3 is arranged in the arrangement prohibition portion.

On the contrary, in the semiconductor integrated circuit according to Embodiment 7 of the invention shown in FIG. 39, as indicated by a broken line Cd_OK1, the connection of the decoupling capacitor Cd according to Embodiment 7 of the invention shown in FIGS. 38A to 38E is permitted between the main power interconnect Main_Vdd and the main ground interconnect Main_Vss on the right short side of the rectangular semiconductor chip. The reason is that the N-channel MOS transistor Mn2 of the inter-power source clamp circuit 15 is connected to the main power interconnect Main_Vdd and the main ground interconnect Main_Vss between an arrangement permission region indicated by the broken line Cd_OK1 and the power supply terminal 11 and the ground terminal 12 to which the external surge voltage is supplied. Accordingly, since the effect of suppressing variation in the operating voltage in the arrangement permission portion indicated by the broken line Cd_OK1 is sufficient, even when the decoupling capacitor Cd shown in FIGS. 38A to 38E is arranged in the arrangement permission portion, the risk of dielectric breakdown of the oxide film O of the MOS capacitor is reduced.

In the semiconductor integrated circuit according to Embodiment 7 of the invention shown in FIG. 39, as indicated by a broken line Cd_OK2, the connection of the decoupling capacitor Cd according to Embodiment 7 of the invention shown in FIGS. 38A to 38E between the sub interconnects Sub_Vdd and Sub_Vss is permitted on the right side of the sub power interconnect Sub_Vdd and the sub ground interconnect Sub_Vss connected to a plurality of output buffers (OUT_CKT) 14 at the center of the rectangular semiconductor chip. The reason is that the N-channel MOS transistor Mn2 of the inter-power source clamp circuit 15 is connected to the sub power interconnect Sub_Vdd and the sub ground interconnect Sub_Vss between an arrangement permission portion indicated by the broken line Cd_OK2 and the power supply terminal 11 and the ground terminal 12 to which the external surge voltage is supplied. Accordingly, since the effect of suppressing variation in the operating voltage in the arrangement permission portion indicated by the broken line Cd_OK2 is sufficient, even when the decoupling capacitor Cd shown in FIGS. 38A to 38E is arranged in the arrangement permission portion, the risk of dielectric breakdown of the oxide film O of the MOS capacitor is reduced.

On the contrary, in the semiconductor integrated circuit according to Embodiment 7 of the invention shown in FIG. 39, as indicated by a broken line Cd_NG5, the connection of the decoupling capacitor Cd having the MOS capacitor according to Embodiment 7 of the invention shown in FIGS. 38A to 38E between the sub interconnects Sub_Vdd and Sub_Vss is prohibited on the left side of the sub power interconnect Sub_Vdd and the sub ground interconnect Sub_Vss connected to a plurality of output buffers (OUT_CKT) 14 at the center of the rectangular semiconductor chip. The reason is that the left side of the sub power interconnect Sub_Vdd and the sub ground interconnect Sub_Vss as an arrangement prohibition portion indicated by the broken line Cd_NG5 is in an electrically open state. Accordingly, in the arrangement prohibition portion in the electrically open state indicated by the broken line Cd_NG5, since the external surge voltage transmitted through the sub power interconnect Sub_Vdd and the sub ground interconnect Sub_Vss is reflected to cause a large variation in the operating voltage, if the decoupling capacitor Cd shown in FIGS. 38A to 38E is arranged in the arrangement prohibition portion, the oxide film O of the MOS capacitor undergoes dielectric breakdown.

According to a preferred embodiment of the invention, in order to increase capacitance of the arrangement prohibition portion indicated by the broken line Cd_NG5, the same substitute capacitance as the substitute capacitance arranged in the arrangement prohibition portions indicated by the broken lines Cd_NG1, Cd_NG2, Cd_NG3, and Cd_NG4 is arranged in the arrangement prohibition portion. According to another preferred embodiment of the invention, in order to increase capacitance of the arrangement prohibition portion indicated by the broken line Cd_NG5, the inter-power source clamp circuit 15 is connected in parallel to the decoupling capacitor Cd having the MOS capacitor according to Embodiment 7 of the invention shown in FIGS. 38A to 38E. At this time, as the inter-power source clamp circuit 15 which is connected in parallel to the decoupling capacitor Cd having the MOS capacitor, the inter-power source clamp circuit 15 according to Embodiment 1 of the invention shown in FIGS. 12A to 12C, 14A to 14C, 16A to 16C, 17A to 17D, 18A to 18D, and 20A to 20D, or the inter-power source clamp circuit 15 according to Embodiment 7 of the invention shown in FIGS. 37A and 37B may be used.

In the semiconductor integrated circuit according to Embodiment 7 of the invention shown in FIG. 39, as indicated by a broken line Cd_OK3, the connection of the decoupling capacitor Cd according to Embodiment 7 of the invention shown in FIGS. 38A to 38E is permitted between the main power interconnect Main_Vdd and the main ground interconnect Main_Vss which are provided to supply an operating voltage to a plurality of output electrostatic protection circuits 13 for protecting a plurality of output buffers 14 on the upper long side of the rectangular semiconductor chip. The reason is that the N-channel MOS transistor Mn2 of the inter-power source clamp circuit 15 is connected to the main power interconnect Main_Vdd and the main ground interconnect Main_Vss between an arrangement permission portion indicated by the broken line Cd_OK3 and the power supply terminal 11 and the ground terminal to which the external surge voltage is supplied. Accordingly, since the effect of suppressing variation in the operating voltage in the arrangement permission portion indicated by the broken line Cd_OK3 is sufficient, even when the decoupling capacitor Cd shown in FIGS. 38A to 38E is arranged in the arrangement permission portion, the risk of dielectric breakdown of the oxide film O of the MOS capacitor is reduced.

That is, the decoupling capacitor Cd which is arranged on the power interconnect as the ESD surge discharge route is limited to the arrangement within the range in which the MOS transistors Mn2 and Mp2 of the inter-power source clamp circuit 15 can exhibit a sufficient clamp function, thereby avoiding the risk of dielectric breakdown of the oxide film O of the MOS capacitor. In other words, at a place where the inter-power source clamp circuit 15 is out of the range in which the clamp function can be exhibited, the decoupling capacitor Cd of the MOS structure is not arranged. In this prohibition region, any inter-power source clamp circuit 15 according to Embodiment 7 of the invention is arranged instead of the decoupling capacitor Cd, and may be used as a substitute of the decoupling capacitor Cd of the MOS structure of the MOS transistors Mn2 and Mp2.

<<Semiconductor Device of Electrostatic Protection Circuit>>

Figure 40A:
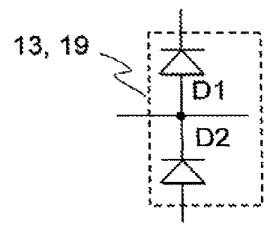
FIGS. 40A and 40B are diagrams illustrating semiconductor devices of a first diode D1 and a second diode D2 constituting an output electrostatic protection circuit 13 or an input electrostatic protection circuit 19 in a semiconductor integrated circuit according to Embodiment 7 of the invention shown in FIG. 39.
Figure 40B:
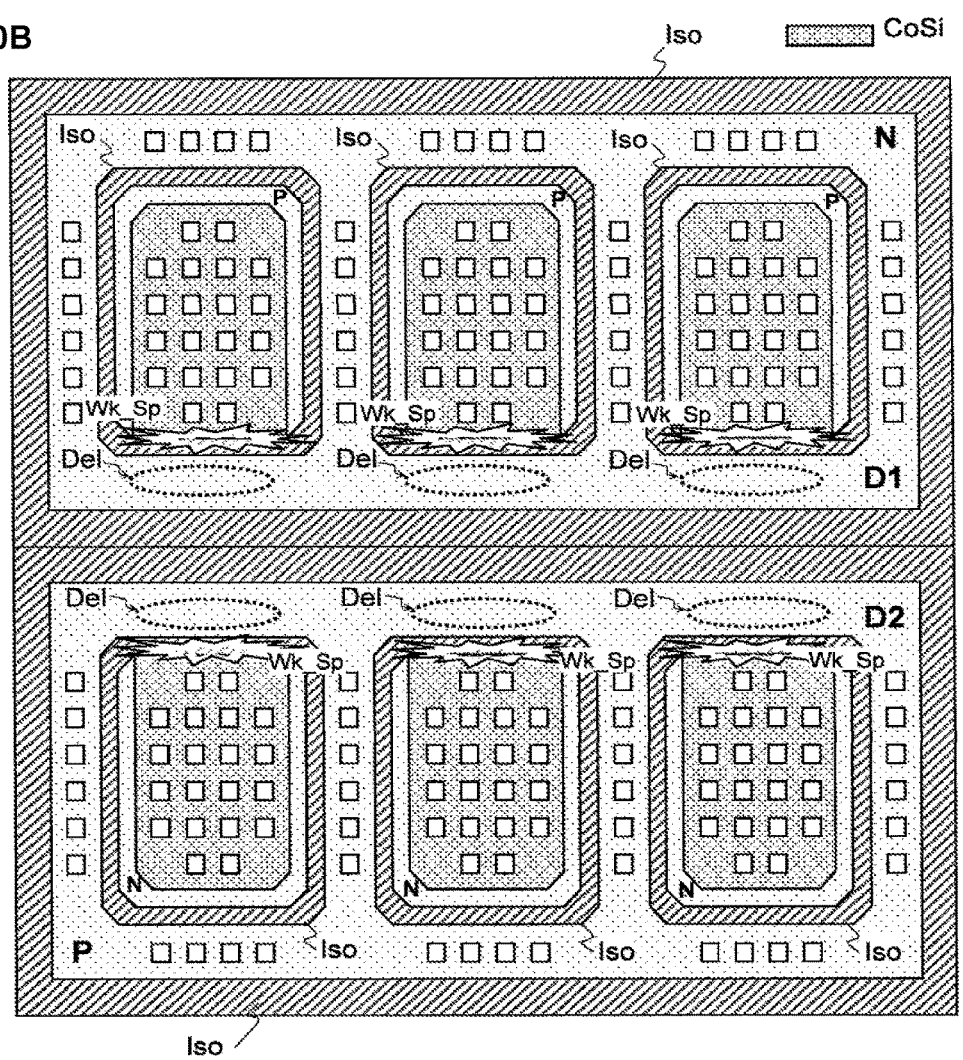

FIGS. 40A and 40B are diagrams illustrating semiconductor devices of a first diode D1 and a second diode D2 constituting an output electrostatic protection circuit 13 or an input electrostatic protection circuit 19 in a semiconductor integrated circuit according to Embodiment 7 of the invention shown in FIG. 39.

As shown in an equivalent circuit of FIG. 40A, the output electrostatic protection circuit 13 or input electrostatic protection circuit 19 according to Embodiment 7 of the invention shown in FIG. 39 includes a first diode D1 and a second diode D2 connected in series between the power supply voltage Vdd and the ground potential Vss.

As shown in a planar structure of FIG. 40B, the first diode D1 of the output electrostatic protection circuit 13 or the input electrostatic protection circuit 19 is formed using three P-type impurity regions of a rectangular planar structure having long and short sides which are respectively formed inside three hatched inner insulating isolation layers Iso formed inside an N-type impurity region formed inside a hatched outermost insulating isolation layer Iso. Though not shown in the planar structure of FIG. 40B, an N-type well region N-Well is formed directly below the N-type impurity region formed inside the outermost insulating isolation layer Iso.

Cobalt silicide CoSi is formed on the surfaces of the three P-type impurity regions respectively formed inside the three inner insulating isolation layer Iso of the first diode D1 shown in the planar structure of FIG. 40B. Of the three P-type impurity regions of the first diode D1, a silicide block having the smallest width and minimum series resistance is used, or no silicide block is substantially formed in a portion on the short side of the rectangular planar structure facing the second diode D2. For this reason, opposing portions become weak spots Wk_Sp. Accordingly, in the N-type impurity region formed inside the hatched outermost insulating isolation layer Iso, a plurality of contacts in the portions facing the weak spots Wk_Sp of the short side portions of the three P-type impurity regions of the first diode D1 are completely omitted as indicated by broken lines Del. With the omission of a plurality of contacts, since series resistance of the weak spots Wk_Sp increases, it becomes possible to reduce the risk of destruction of the weak spots Wk_Sp.

As shown in the planar structure of FIG. 40B, the second diode D2 of the output electrostatic protection circuit 13 or the input electrostatic protection circuit 19 is formed using three N-type impurity regions of a rectangular planar structure having long and short sides which are respectively formed inside three hatched inner insulating isolation layers Iso formed inside a P-type impurity region formed inside a hatched outermost insulating isolation layer Iso. Though not shown in the planar structure of FIG. 40B, a P-type well region P-Well is formed directly below the P-type impurity region formed inside the outermost insulating isolation layer Iso.

Cobalt silicide CoSi is formed on the surfaces of the three N-type impurity regions respectively formed inside the three inner insulating isolation layers Iso of the second diode D2 shown in the planar structure of FIG. 40B. Of the three N-type impurity regions of the second diode D2, a silicide block having the smallest width and minimum series resistance is used, or no silicide block is substantially formed in a portion on the short side of the rectangular planar structure facing the first diode D1. For this reason, opposing portions become weak spots Wk_Sp. Accordingly, in the P-type impurity region formed inside the hatched outermost insulating isolation layer Iso, a plurality of contacts in the portions facing the weak spots Wk_Sp of the short side portions of the three N-type impurity regions of the second diode D2 are completely omitted as indicated by broken lines Del. With the omission of a plurality of contacts, since series resistance of the weak spots Wk_Sp increases, it becomes possible to reduce the risk of destruction of the weak spot Wk_Sp.

As a diode which is used in a gate protection circuit of an input unit, a normal diode may be used for gate protection instead of the input electrostatic protection circuit 19 using an ESD protection diode made of silicide shown in FIGS. 40A and 40B.

<<Bird's Eye View of Semiconductor Integrated Circuit>>

Figure 41:
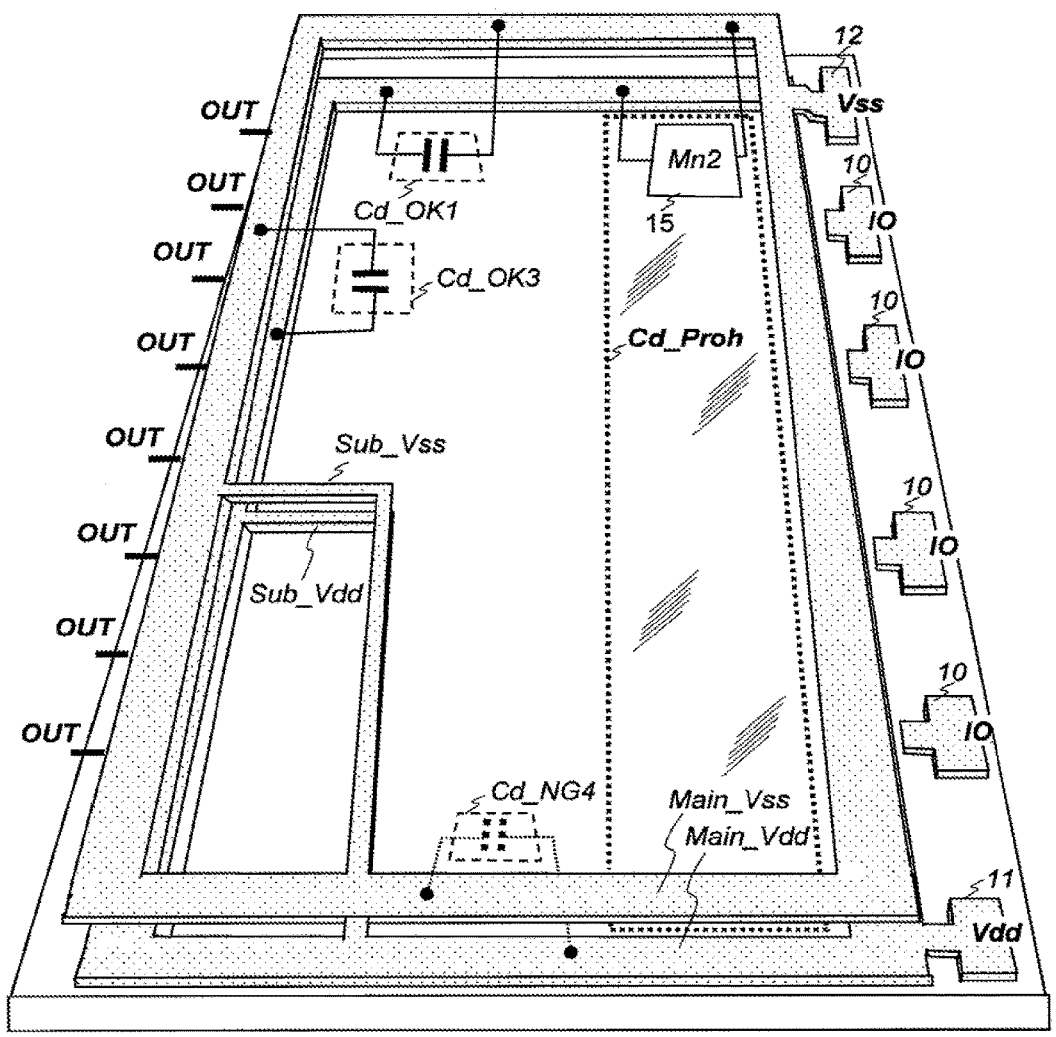
FIG. 41 is a bird's eye view showing the configuration of a semiconductor integrated circuit having a decoupling capacitor embedded therein according to Embodiment 7 of the invention shown in FIG. 39.

FIG. 41 is a bird's eye view showing the configuration of a semiconductor integrated circuit having decoupling capacitor embedded therein according to Embodiment 7 of the invention shown in FIG. 39.

As shown in FIG. 41, the main power interconnect Main_Vdd and the main ground interconnect Main_Vss are formed to have a surrounding interconnect shape, or are formed not only to have a surrounding interconnect shape but also to cross the inside of the chip in the vertical direction or the horizontal direction along the lower long side, the right short side, the upper long side, and the left short side of the rectangular semiconductor chip shown in FIG. 39. Specifically, as shown in FIG. 41, the main power interconnect Main_Vdd and the main ground interconnect Main_Vss are arranged in parallel, such that parasitic capacitance between the two interconnects is used as apart of the decoupling capacitor. More specifically, as shown in FIG. 41, the main power interconnect Main_Vdd and the main ground interconnect Main_Vss are arranged in parallel through a multi-layered interconnect using the semiconductor manufacturing process of the semiconductor integrated circuit, such that the capacitance value of parasitic capacitance between the two interconnects further increases. The main power interconnect Main_Vdd and the main ground interconnect Main_Vss may contiguously run in parallel using the same-layer interconnect of the multi-layered interconnect, thereby increasing the capacitance value.

As shown in FIG. 41, the arrangement prohibition region Cd_Proh is formed along the lower long side of the rectangular semiconductor chip shown in FIG. 39, and the arrangement of the decoupling capacitor Cd according to Embodiment 7 of the invention shown in FIGS. 38A to 38E inside the arrangement prohibition region Cd_Proh is prohibited.

As shown in FIG. 41, the sub power interconnect Sub_Vdd and the sub ground interconnect Sub_Vss which are provided to supply the operating voltage to the internal circuit of the semiconductor integrated circuit are formed to respectively branch off from the main power interconnect Main_Vdd and the main ground interconnect Main_Vss. As shown in FIG. 41, the sub power interconnect Sub_Vdd and the sub ground interconnect Sub_Vss are arranged in parallel, such that parasitic capacitance between the two sub interconnects is used as a part of the decoupling capacitor. More specifically, as shown in FIG. 41, the sub power interconnect Sub_Vdd and the sub ground interconnect Sub_Vss are arranged in parallel through a multi-layered interconnect using the semiconductor manufacturing process of the semiconductor integrated circuit, such that the capacitance value of parasitic capacitance between the two sub interconnects further increases.

FIG. 41 also shows an arrangement prohibition portion Cd_NG4 where the connection of the decoupling capacitor Cd between the main power interconnect Main_Vdd and the main ground interconnect Main_Vss shown in FIG. 39 is prohibited, and arrangement permission portions Cd_OK1 and Cd_OK3 where the connection of the decoupling capacitor Cd between the main power interconnect Main_Vdd and the main ground interconnect Main_Vss shown in FIG. 39 is permitted.

FIG. 41 also shows a plurality of input/output terminals (IO1, IO2, . . . , and IOx) 10, a power supply terminal 11, and a ground terminal 12 which are formed along the lower long side of the rectangular semiconductor chip shown in FIG. 39 and perform data transmission/reception with respect to a central processing unit (CPU) or an application processor.

FIG. 41 also shows a plurality of output terminals OUT, . . . , and OUT which are formed along the upper long side of the rectangular semiconductor chip shown in FIG. 39 and generate a liquid crystal driving output voltage for driving a liquid crystal display (LCD) as a display device.

<<Connection of Semiconductor Integrated Circuit and Liquid Crystal Display>>

Figure 42:
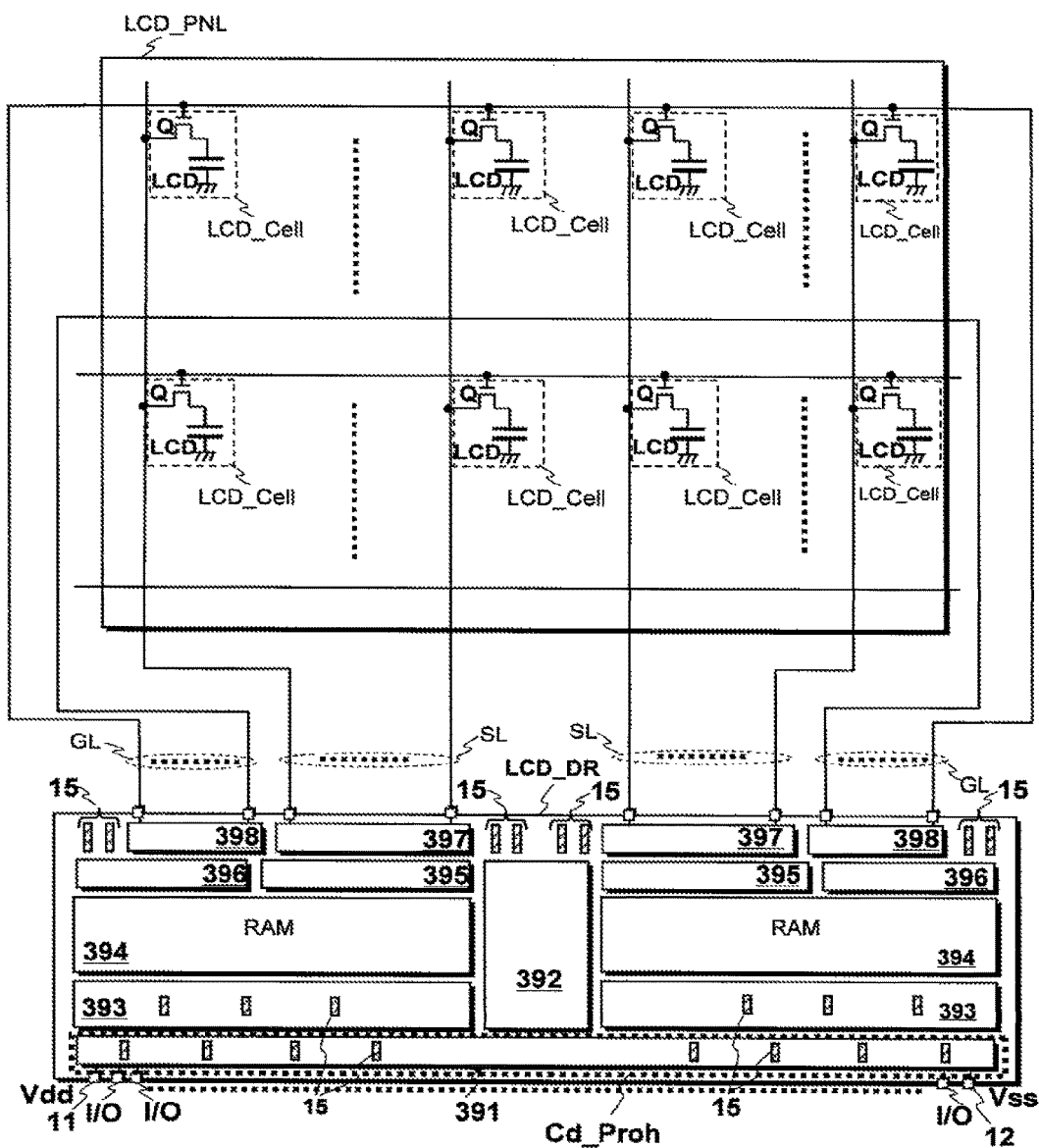
FIG. 42 is a diagram showing a situation in which a semiconductor integrated circuit according to Embodiment 7 of the invention shown in FIGS. 39 and 41 is connected to a liquid crystal display (LCD).

FIG. 42 is a diagram showing a situation in which a semiconductor integrated circuit according to Embodiment 7 of the invention shown in FIGS. 39 and 41 is connected to a liquid crystal display (LCD).

The semiconductor integrated circuit according to Embodiment 7 of the invention shown in FIGS. 39 and 41 is shown as an LCD driver LCD_DR on the lower side of FIG. 42.

Like FIGS. 39 and 41, a plurality of input/output terminals (IO1, IO2, . . . , and IOx) 10, a power supply terminal 11, and a ground terminal 12 which are provided to perform data transmission/reception with respect to a central processing unit (CPU) or an application processor are formed along the lower long side of the rectangular semiconductor chip of the LCD driver LCD_DR on the lower side of FIG. 42. An input/output circuit and input/output electrostatic protection circuit 391 corresponding to the input buffer 18, the output buffer 18, the output electrostatic protection circuit 13, and the input electrostatic protection circuit 19 described with reference to FIG. 39 is formed on the lower long side of the rectangular semiconductor chip of the LCD driver LCD_DR. A plurality of inter-power source clamp circuits 15 according to any of various embodiments of the invention described above are distributed inside the input/output circuit and input/output electrostatic protection circuit 391.

A logic circuit 392, an analog circuit 393, and an internal memory 394 are substantially formed in the central portion of the rectangular semiconductor chip of the LCD driver LCD_DR on the lower side of FIG. 42.

The logic circuit 392 generates internal control signals for controlling the internal operation of the LCD driver LCD_DR in response to control signals which are supplied to a plurality of input/output terminals 10 on the lower long side of the rectangular semiconductor chip of the LCD driver LCD_DR.

The internal memory 394 having a static random access memory (SRAM) stores display information which is supplied from a plurality of input/output terminals 10 on the lower long side of the rectangular semiconductor chip of the LCD driver LCD_DR.

The analog circuit 393 includes a gradation voltage generation circuit which generates a gradation voltage in a source driving output signal to be supplied to source lines SL of the LCD driver LCD_DR in response to the display information stored in the internal memory 394, or the like.

Like FIGS. 39 and 41, a source line driving output circuit 395, a gate line driving output circuit 396, a source line output electrostatic protection circuit 397, and a gate line output electrostatic protection circuit 398 are formed along the upper long side of the rectangular semiconductor chip of the LCD driver LCD_DR on the lower side of FIG. 42. The source line driving output circuit 395 generates source line driving output signals to be supplied to the source lines SL of the LCD driver LCD_DR in response to the gradation voltage generated from a gradation voltage generation circuit in the analog circuit 393. The gate line driving output circuit 396 generates gate line driving output signals to be supplied to the gate lines GL of the LCD driver LCD_DR in response to the internal control signals generated from the logic circuit 392. The source line output electrostatic protection circuit 397 protects the MOS transistor of the source line driving output circuit 395 from being destroyed due to an external surge voltage which is applied to source line output terminals. The gate line output electrostatic protection circuit 398 protects the MOS transistor of the gate line driving output circuit 396 from being destroyed due to an external surge voltage which is applied to gate line output terminals.

Like FIGS. 39 and 41, a plurality of output terminals OUT, . . . , and OUT which are provided to drive a liquid crystal display (LCD) as a display device are formed along the upper long side of the rectangular semiconductor chip of the LCD driver LCD_DR on the lower side of FIG. 42. A plurality of output terminals OUT, . . . , and OUT include the source line output terminals of the source line output electrostatic protection circuit 397 and the gate line output terminals of the gate line output electrostatic protection circuit 398. A plurality of inter-power source clamp circuits 15 according to any of various embodiments of the invention described above are distributed along the upper long side of the rectangular semiconductor chip of the LCD driver LCD_DR on the lower side of FIG. 42.

The upper side of the FIG. 42 shows a liquid crystal panel LCD_PNL of a liquid crystal display (LCD) which is driven by the LCD driver LCD_DR having the semiconductor integrated circuit according to Embodiment 7 of the invention shown in FIGS. 39 and 41. In the liquid crystal panel LCD_PNL, a plurality of liquid crystal cells LCD_Cell are arranged in a matrix in the horizontal direction and the vertical direction. A plurality of gate lines GL arranged in the horizontal direction of the liquid crystal panel LCD_PNL are driven by the gate line driving output signals of the gate line driving output circuit 396 of the LCD driver LCD_DR, and a plurality of source lines SL arranged in the vertical direction of the liquid crystal panel LCD_PNL are driven by the source line driving output signals of the source line driving output circuit 395 of the LCD driver LCD_DR.

The liquid crystal cell LCD_Cell includes a thin film transistor (TFT) Q and a liquid crystal capacitor LCD, and the source electrode, the gate electrode, and the drain electrode of the thin film transistor Q are respectively connected to the source line SL, the gate line GL, and the liquid capacitor LCD.

Although the invention made by the inventors has been described specifically on the basis of various embodiments, the invention is not limited thereto, and various modifications may be of course made without departing from the subject matter of the invention.

For example, as high-melting-point metal which forms silicide on the surface of the drain impurity region, the surface of the source impurity region, and the surface of the P-type impurity region functioning as a guard ring, tungsten W other than cobalt Co may be used to form tungsten silicide WSi.

The substrate of the semiconductor integrated circuit 1 is not limited to only the P-type substrate Psub, a silicon-on-insulator (SOI) substrate or a sapphire substrate may be used.

In the above description, an arbitrary voltage which is lower than the voltage supplied to the corresponding power supply terminal may be of course supplied to the ground terminal.

In the semiconductor integrated circuit 1 according to any embodiment of the invention, the decoupling capacitor Cd which is connected between the power supply terminal 11 and the ground terminal 12 is not limited to only the MOS capacitor according to Embodiment 7 of the invention shown in FIGS. 38A to 38E. As another configuration of the decoupling capacitor Cd, a MIM capacitor using a laminated structure of metal (M), an insulating film (I), and metal (M), parasitic capacitance of a PN junction between a P-type impurity region and a N-type impurity region, or the like may be used. In the structure of the MOS capacitor according to Embodiment 7 of the invention, if the MOS capacitor functions as a capacitance between the gate and the well, the structure is not limited to FIGS. 38A to 38E. Note that a clamp breakdown start voltage in the drain of the MOS transistor forming the inter-power source clamp circuit 15 as the substitute capacitance or a clamp breakdown start voltage in the PN junction of the third diode D3 forming the power protection circuit 16 is set to be lower than the destructive breakdown voltage of the MIM capacitor or parasitic capacitance of the PN junction.

The display device which is driven by the semiconductor integrated circuit according to Embodiment 7 of the invention shown in FIGS. 39, 41, and 42 is not limited to only a liquid crystal display (LCD). As other display devices, an organic electro luminescence display, a plasma display, or the like may be used.

What is claimed is:

1. A semiconductor integrated circuit having an electrostatic protection circuit, comprising:
    a first semiconductor region of a first conductivity type;
    a first impurity region of a second conductivity type inside the first semiconductor region in plan view, the second conductivity type being opposite to the first conductivity type; and
    a guard ring formed by a second impurity region of the first conductivity type and formed inside the first semiconductor region in plan view to surround the periphery of the first impurity region,
    wherein the first impurity region is formed as a rectangular plan structure having a pair of long sides and a pair of short sides,
    first electrical contacts are formed in first portions of the guard ring which face the long sides of the rectangular plan structure,
    second portions of the guard ring having no electrical contacts, and which are portions of the second impurity region, respectively face the two short sides of the rectangular plan structure, each second portion having a same length as the corresponding short side of the rectangular plan structure and a same width as the guard ring,
    the guard ring has third portions, which are portions of the second impurity region adjacent to one of the second portions and extending in a direction of a corresponding short side of the rectangular plan structure,
    a second electrical contact is formed in one of the third portions,
    a third electrical contact and a fourth electrical contact adjacent to the third electrical contact are formed in the other of the third portions,
    the second electrical contact and the third electrical contact are adjacent to each other across the one second portion, and
    a distance between the second electrical contact and the third electrical contact is larger than a distance between the third electrical contact and the fourth electrical contact.

2. The semiconductor integrated circuit according to claim 1,
    wherein the first impurity region is one of a plurality of first impurity regions spaced along the short side direction in a plan view,
    a gate electrode of a MOS transistor is formed between adjacent regions of the plurality of first impurity regions along the long sides of the adjacent regions,
    the adjacent regions of the plurality of first impurity regions respectively function as a source and a drain of the MOS transistor,
    the first semiconductor region functions as a substrate of the MOS transistor and is electrically connected to one of the adjacent first impurity regions, which functions as the source of the MOS transistor, through the guard ring, and
    the adjacent first impurity regions and the gate electrode of the MOS transistor are formed inside the guard ring.

3. The semiconductor integrated circuit according to claim 2,
    wherein the one of the plurality of first impurity regions which functions as the source of the MOS transistor is one of a plurality of source impurity regions, the other of the plurality of first impurity regions which functions as the drain of the MOS transistor is one of a plurality of drain impurity regions, and the gate electrode of the MOS transistor is one of a plurality of gate electrodes, and
    the plurality of source impurity regions, the plurality of gate electrodes, and the plurality of drain impurity regions are formed inside the guard ring.

4. The semiconductor integrated circuit according to claim 3,
    wherein a plurality of second portions of the guard ring each have no electrical contacts, each of the second portions facing one of a plurality of short sides of a plurality of rectangular plan structures of the plurality of drain impurity regions.

5. The semiconductor integrated circuit according to claim 2, further comprising:
    an external power supply terminal and an external ground terminal to which a power supply voltage and a ground potential are respectively supplied from outside of the semiconductor integrated circuit,
    wherein the electrostatic protection circuit includes an inter-power source clamp circuit having the MOS transistor, the inter-power source clamp circuit being connected between the external power supply terminal and the external ground terminal, and
    a current path between the drain and source of the MOS transistor is connected between the external power supply terminal and the external ground terminal.

6. The semiconductor integrated circuit according to claim 5, further comprising:
    a decoupling capacitor which has a breakdown destruction voltage higher than a turn-on voltage at which the MOS transistor of the inter-power source clamp circuit starts an inter-power source clamp operation,
wherein the decoupling capacitor is connected between the external power supply terminal and the external ground terminal.

7. The semiconductor integrated circuit according to claim 6,
wherein the decoupling capacitor is a MOS capacitor, the MOS capacitor and the MOS transistor both being formed through a same semiconductor manufacturing process of the semiconductor integrated circuit.

8. The semiconductor integrated circuit according to claim 7,
wherein the semiconductor integrated circuit is formed using a rectangular semiconductor chip having first and second opposing long sides and first and second opposing short sides,
a main power interconnect and a main ground interconnect are respectively formed to have a surrounding interconnect shape along the first and second long sides and the first and second short sides of the rectangular semiconductor chip,
a plurality of signal terminals to which display information data is supplied from outside of the semiconductor integrated circuit, the external power supply terminal to which the power supply voltage is supplied, and the external ground terminal to which the ground potential is supplied are formed on the first long side of the semiconductor chip,
a plurality of output terminals which generate a plurality of output signals for driving a display device outside the semiconductor integrated circuit are formed on the second long side of the semiconductor chip,
an arrangement prohibition region which is spaced from the second long side and near the first long side to be substantially parallel to the first long side is set inside the rectangular semiconductor chip,
inside or near the arrangement prohibition region, the main power interconnect and the external power supply terminal are connected together, and the main ground interconnect and the external ground terminal are connected together, and
the arrangement of the decoupling capacitor is prohibited inside the arrangement prohibition region.

9. The semiconductor integrated circuit according to claim 8,
wherein a region other than the arrangement prohibition region is set as an arrangement permission region inside the rectangular semiconductor chip,
the decoupling capacitor is arranged inside the arrangement permission region, and
the decoupling capacitor arranged inside the arrangement permission region is connected to the external power supply terminal and the external ground terminal through the inter-power source clamp circuit.

10. The semiconductor integrated circuit according to claim 9, further comprising:
a sub power interconnect and a sub ground interconnect,
wherein the sub power interconnect and the sub ground interconnect supply an operating voltage to an internal circuit arranged inside the arrangement permission region,
one end of the sub power interconnect and one end of the sub ground interconnect are respectively connected to the main power interconnect and the main ground interconnect, and another end of the sub power interconnect and another end of the sub ground interconnect are respectively not connected to the main power interconnect and the main ground interconnect, and
at least the inter-power source clamp circuit is connected between the another end of the sub power interconnect and the another end of the sub ground interconnect.

11. The semiconductor integrated circuit according to claim 10,
wherein the decoupling capacitor is connected between the another end of the sub power interconnect and the another end of the sub ground interconnect to be in parallel with the inter-power source clamp circuit.

12. The semiconductor integrated circuit according to claim 5,
wherein the inter-power source clamp circuit includes a time-constant circuit which has a time constant forming resistor and a time constant forming capacitor connected in series between the external power supply terminal and the external ground terminal, and
an output signal of the time-constant circuit drives the gate electrode of the MOS transistor.

13. The semiconductor integrated circuit according to claim 12,
wherein the inter-power source clamp circuit further includes a CMOS inverter whose input terminal and output terminal are respectively connected to the output terminal of the time-constant circuit and the gate electrode of the MOS transistor.

14. A semiconductor integrated circuit having an electrostatic protection circuit, comprising:
a first semiconductor region of a first conductivity type;
a first impurity region of a second conductivity type inside the first semiconductor region in plan view, the second conductivity type being opposite to the first conductivity type; and
a guard ring formed by a second impurity region of the first conductivity type and formed inside the first semiconductor region in plan view to surround the periphery of the first impurity region,
wherein the first impurity region is formed as a rectangular plan structure having a pair of long sides and a pair of short sides,
first electrical contacts are formed in first portions of the guard ring which face the long sides of the rectangular plan structure,
second portions of the guard ring having no electrical contacts, and which are portions of the second impurity region, respectively face the two short sides of the rectangular plan structure, each second portion having a same length as the corresponding short side of the rectangular plan structure and a same width as the guard ring,
the guard ring has third portions, which are portions of the second impurity region adjacent to one of the second portions and extending in a direction of a corresponding short side of the plan rectangular structure,
a second electrical contact is formed in one of the third portions,
a third electrical contact, a fourth electrical contact adjacent to the third electrical contact, and a fifth electrical contact adjacent to the fourth electrical contact are formed in the other of the third portions,
the second electrical contact and the third electrical contact are adjacent to each other across the one second portion, and
a distance between the second and third electrical contacts is larger than a distance between the third and fourth electrical contacts.

15. The semiconductor integrated circuit according to claim 14,
- wherein the first impurity region is one of a plurality of first impurity regions spaced along the short side direction in a plan view,
- a gate electrode of a MOS transistor is formed between adjacent regions of the plurality of first impurity regions along the long sides of the adjacent regions,
- the adjacent regions of the plurality of first impurity regions respectively function as a source and a drain of the MOS transistor,
- the first semiconductor region functions as a substrate of the MOS transistor and is electrically connected to one of the adjacent first impurity regions, which functions as the source of the MOS transistor, through the guard ring, and
- the adjacent first impurity regions and the gate electrode of the MOS transistor are formed inside the guard ring.

16. The semiconductor integrated circuit according to claim 15,
- wherein the one of the plurality of first impurity regions which functions as the source of the MOS transistor is one of a plurality of source impurity regions, the other of the plurality of first impurity regions which functions as the drain of the MOS transistor is one of a plurality of drain impurity regions, and the gate electrode of the MOS transistor is one of a plurality of gate electrodes, and
- the plurality of source impurity regions, the plurality of gate electrodes, and the plurality of drain impurity regions are formed inside the guard ring.

17. The semiconductor integrated circuit according to claim 16,
- wherein a plurality of second portions of the guard ring each have no electrical contacts, each of the second portions facing one of a plurality of short sides of a plurality of rectangular plan structures of the plurality of drain impurity regions.

18. The semiconductor integrated circuit according to claim 15, further comprising:
- an external power supply terminal and an external ground terminal to which a power supply voltage and a ground potential are respectively supplied from outside of the semiconductor integrated circuit,
- wherein the electrostatic protection circuit includes an inter-power source clamp circuit having the MOS transistor, the inter-power source clamp circuit being connected between the external power supply terminal and the external ground terminal, and
- a current path between the drain and source of the MOS transistor is connected between the external power supply terminal and the external ground terminal.

19. The semiconductor integrated circuit according to claim 18, further comprising:
- a decoupling capacitor which has a breakdown destruction voltage higher than a turn-on voltage at which the MOS transistor of the inter-power source clamp circuit starts an inter-power source clamp operation,
- wherein the decoupling capacitor is connected between the external power supply terminal and the external ground terminal.

20. The semiconductor integrated circuit according to claim 19,
- wherein the decoupling capacitor is a MOS capacitor, the MOS capacitor and the MOS transistor both being formed through a same semiconductor manufacturing process of the semiconductor integrated circuit.

21. The semiconductor integrated circuit according to claim 20,
- wherein the semiconductor integrated circuit is formed using a rectangular semiconductor chip having first and second opposing long sides and first and second opposing short sides,
- a main power interconnect and a main ground interconnect are respectively formed to have a surrounding interconnect shape along the first and second long sides and the first and second short sides of the rectangular semiconductor chip,
- a plurality of signal terminals to which display information data is supplied from outside of the semiconductor integrated circuit, the external power supply terminal to which the power supply voltage is supplied, and the external ground terminal to which the ground potential is supplied are formed on the first long side of the semiconductor chip,
- a plurality of output terminals which generate a plurality of output signals for driving a display device outside the semiconductor integrated circuit are formed on the second long side of the semiconductor chip,
- an arrangement prohibition region which is spaced from the second long side and near the first long side to be substantially parallel to the first long side is set inside the rectangular semiconductor chip,
- inside or near the arrangement prohibition region, the main power interconnect and the external power supply terminal are connected together, and the main ground interconnect and the external ground terminal are connected together, and
- the arrangement of the decoupling capacitor is prohibited inside the arrangement prohibition region.

22. The semiconductor integrated circuit according to claim 21,
- wherein a region other than the arrangement prohibition region is set as an arrangement permission region inside the rectangular semiconductor chip,
- the decoupling capacitor is arranged inside the arrangement permission region, and
- the decoupling capacitor arranged inside the arrangement permission region is connected to the external power supply terminal and the external ground terminal through the inter-power source clamp circuit.

23. The semiconductor integrated circuit according to claim 22, further comprising:
- a sub power interconnect and a sub ground interconnect,
- wherein the sub power interconnect and the sub ground interconnect supply an operating voltage to an internal circuit arranged inside the arrangement permission region,
- one end of the sub power interconnect and one end of the sub ground interconnect are respectively connected to the main power interconnect and the main ground interconnect, and another end of the sub power interconnect and another end of the sub ground interconnect are respectively not connected to the main power interconnect and the main ground interconnect, and
- at least the inter-power source clamp circuit is connected between the another end of the sub power interconnect and the another end of the sub ground interconnect.

24. The semiconductor integrated circuit according to claim 23,
- wherein the decoupling capacitor is connected between the another end of the sub power interconnect and the another end of the sub ground interconnect to be in parallel with the inter-power source clamp circuit.

25. The semiconductor integrated circuit according to claim 18,
- wherein the inter-power source clamp circuit includes a time-constant circuit which has a time constant forming resistor and a time constant forming capacitor connected in series between the external power supply terminal and the external ground terminal, and
- an output signal of the time-constant circuit drives the gate electrode of the MOS transistor.

26. The semiconductor integrated circuit according to claim 25,
- wherein the inter-power source clamp circuit further includes a CMOS inverter whose input terminal and output terminal are respectively connected to the output terminal of the time-constant circuit and the gate electrode of the MOS transistor.

\* \* \* \* \*